United States Patent [19]
Tomishima et al.

[11] Patent Number: 5,617,369
[45] Date of Patent: Apr. 1, 1997

[54] DYNAMIC SEMICONDUCTOR MEMORY DEVICE HAVING EXCELLENT CHARGE RETENTION CHARACTERISTICS

[75] Inventors: Shigeki Tomishima; Kazutami Arimoto, both of Hyogo, Japan

[73] Assignee: Mitsubishi Denki Kabushiki Kaisha, Tokyo, Japan

[21] Appl. No.: 438,730

[22] Filed: May 10, 1995

[30] Foreign Application Priority Data

May 11, 1994 [JP] Japan .................................. 6-097511

[51] Int. Cl.⁶ ........................................................ G11C 8/00
[52] U.S. Cl. ................................. 365/230.06; 365/189.11
[58] Field of Search ......................... 365/230.06, 189.11, 365/185.23

[56] References Cited

U.S. PATENT DOCUMENTS

| | | | |
|---|---|---|---|
| 3,824,564 | 7/1974 | Wegener | 365/189.09 |
| 4,513,399 | 4/1985 | Tobita | 365/182 |
| 4,628,486 | 12/1986 | Sakui | 369/189.11 |

FOREIGN PATENT DOCUMENTS 60-209996  10/1985  Japan .
4-278285   10/1992  Japan .
4-302896   10/1992  Japan .

OTHER PUBLICATIONS

"SUB–1–V Swing Bus Architecture For Future Low–Power Ulsis", Nakagome et al., 1992 Symposium on VLSI Circuits Digest of Technical Papers, pp. 82–83.

*Primary Examiner*—A. Zarabian
*Attorney, Agent, or Firm*—Lowe, Price, LeBlanc & Becker

[57] ABSTRACT

Level converter converts a word line group specifying signal, which is sent from a row decoder and has amplitude of a power supply potential Vcc and a ground potential GND, into mutually complementary logic signals WD and ZWD of a high voltage Vpp and a negative potential Vbb. An RX decoder decodes an address signal to output a signal of an amplitude of (Vpp–Vbb) specifying a word line in a word line group. A word driver provided corresponding to each word line transmits a word line specifying signal or a negative potential to the corresponding word line in accordance with signals WD and ZWD sent from a level converting circuit. The nonselected word line receives negative potential Vbb from a word driver. The selected word line receives high voltage Vpp from the word driver. It is possible to suppress a channel leak current at a memory transistor in the nonselected memory cell, which may be caused by the potential change of the word line and/or bit line, and a charge holding characteristic of the memory cell can be improved.

23 Claims, 43 Drawing Sheets

DYNAMIC SEMICONDUCTOR MEMORY DEVICE HAVING EXCELLENT CHARGE RETENTION CHARACTERISTICS

BACKGROUND OF THE INVENTION

1. Field of the Invention

The present invention relates to a semiconductor memory device, and in particular to a dynamic semiconductor memory device storing information in the form of electric charges. More particularly, the invention relates to a structure in a dynamic semiconductor memory device for improving charge retention characteristics of memory cells. More specifically, the invention relates to a structure of circuitry for selecting word lines.

2. Description of the Background Art

FIG. 63 schematically shows a whole structure of a dynamic semiconductor memory device (will be referred to as "DRAM") in the prior art. In FIG. 63, the DRAM includes a memory cell array 900 having memory cells MC arranged in a matrix of rows and columns. In memory cell array 900, a word line WL is provided corresponding to each row of memory cells MC, and a column line (bit line pair BL and /BL) is provided corresponding to each column of memory cells MC. FIG. 63 representatively shows one word line WL and one bit line pair BL and /BL. Memory cell MC is provided corresponding to a crossing of bit line pair BL and/BL and word line WL. In FIG. 63, memory cell MC is provided corresponding to the crossing of bit line BL and word line WL, as an example. Memory cell MC includes a capacitor MQ storing information in the form of electric charges, and a memory transistor MT which is responsive to a signal potential on word line WL to be turned on to connect memory capacitor MQ to bit line BL (or /BL).

The DRAM further includes an address buffer 902 which produces an internal address signal from an externally applied address signal, a row decode circuit 904 which decodes the internal row address signal sent from address buffer 902 to produce a decode signal specifying a corresponding word line in memory cell array 900, and a word line drive circuit 906 which transmits a signal voltage indicative of the selected state onto the corresponding word line in accordance with the row decode signal from row decode circuit 904. Word line drive circuit 906, of which specific structure will be described later, transmits a high voltage Vpp higher than an operation power supply potential Vcc onto the selected word line (i.e., word line corresponding to the row specified by the address signal).

The DRAM further includes a sense amplifier group or band 908 including a plurality of sense amplifiers which are provided corresponding to respective bit line pairs BL and /BL, and differentially amplify signal potentials on the corresponding bit line pairs, a column decoder 910 which decodes the internal column address signal from address buffer 902 to produce a column select signal specifying a corresponding column (bit line pair) in memory cell array 900, an I/O gate circuit 912 which operates in accordance with the column select signal from column decoder 910 to connect the corresponding column (bit line pair) in the memory cell array to an internal data line (internal I/O line) 913, and an I/O circuit 914 for inputting and outputting external data DQ.

I/O gate circuit 912 includes column select gates provided corresponding to the respective bit line pairs. Upon writing of data, I/O circuit 914 produces internal write data from externally applied data DQ, and transmits the same to internal data line 913. Upon reading of data, I/O circuit 914 produces external read data DQ from internal read data on internal data line 913. In FIG. 63, I/O circuit 914 is shown to perform input and output of data through the same pin terminal. However, I/O circuit 914 may be adapted to perform input and output of data through different pin terminals.

For determining a timing of internal operation of the DRAM, there is provided a control signal generating circuit 916. Control signal generating circuit 916 receives a row address strobe signal /RAS, a column address strobe signal /CAS, a write enable signal /WE and an output enable signal /OE, and generates various internal control signals. In FIG. 63, control signal generating circuit 916 is shown to apply internal control signals to address buffer 902 and row decoder 904.

When the row address strobe signal /RAS is activated, it attains the L-level and designates start of the memory cycle (start of access to the DRAM), and enables latching and decoding of the address signal, respectively, by address buffer 902 and row decode circuit 904. Address buffer 902 latches the address signal and produces the internal row address signal to apply the same to row decode circuit 904 when row address strobe signal /RAS attains the L-level. Row address strobe signal /RAS controls the operation of circuitry related to selection of a row in memory cell array 900.

Column address strobe signal /CAS determines the timing of operations related to column selection. When signal /CAS attains the L-level, address buffer 902 latches the externally applied address signal and produces the internal column address signal to apply the same to column decoder 910. Column decoder 910 decodes the applied address signal in accordance with the L-level of signal /CAS.

When activated, write enable signal /WE attains the L-level and indicates that the data write operation is designated. When activated, output enable signal /OE attains the L-level and designates that data of a selected memory cell is to be read out. Now, selecting operation of a memory cell of one bit will be briefly described below.

In response to the fall of signal /RAS, address buffer 902 takes in the externally applied address signal to produce the internal row address signal under the control by control signal generating circuit 916. Row decoder 904 decodes the internal row address signal thus produced under the control by control signal generating circuit 916, and produces a word line designating signal designating a word line WL. Word line drive circuit 906 raises the potential of the addressed word line WL in accordance with the word line designating signal from row decode circuit 904. As will be detailed later, word line drive circuit 906 raises the potential of the selected word line to high voltage Vpp higher than operation power supply voltage Vcc. The reason of boosting the potential of a selected word line will also be detailed later.

Memory transistor MT contained in memory cell MC connected to the selected word line is turned on to connect memory cell capacitor MQ to bit line BL (or /BL). The potential of bit line BL (/BL), which is kept in an electrically floating state at the intermediate potential Vcc/2 changes in accordance with information (accumulated electric charges) stored in memory capacitor MQ.

The sense amplifier contained in sense amplifier band 908 is activated under the control by control signal generating circuit 916, to amplify and latch the potential difference of each bit line pair BL and /BL.

When signal /CAS attains the L-level, address buffer 902 latches the externally applied address signal and produces the internal column address signal to apply the same to column decoder 910. Column decoder 910 is activated under the control by control signal generating circuit 916 to decode the internal column address signal from address buffer 902 and generate the column select signal specifying a corresponding column (bit line pair) in memory cell array 900.

I/O gate circuit 912 selects the corresponding column (bit line pair) in accordance with the column select signal from column decoder 910, and connects the selected column (bit line pair) to internal data line 913.

Writing and reading of data are performed depending on signals /WE and /OE. In the data writing operation, signal /WE attains the L-level, and I/O circuit 914 produces internal write data from externally applied write data D and transmits the internal write data onto the selected column via internal data line 913 and I/O gate circuit 912. In the data reading operation, signal /OE attains the L-level, and I/O circuit 914 produces and outputs external read data Q from the internal read data on internal data line 913.

FIG. 64 shows an example of the structures of row decode circuit and word line drive circuit. In FIG. 64, there is shown the structures of portions related only to one word line WL.

In FIG. 64, row decode circuit 904 includes a row decoder 924 provided corresponding to the word line WL. Row decoder 924 includes an AND decoder 924a receiving a predetermined combination of internal row address signals from the address buffer, and an inverter 924b inverting an output WD of AND decoder 924a. Both outputs of AND decoder 924a and inverter 924b have a swing of Vcc (i.e., its H-level is equal to power supply voltage Vcc, and its L-level is equal to the ground potential level). AND decoder 924a is set to the selected state and outputs the signal at H-level, when all the applied address signals are at the H-level.

Word line drive circuit 906 includes a word line driver 926 provided corresponding to each word line WL. Word line driver 926 includes an n-channel MOS transistor N1 transmitting a decoded signal WD sent from a corresponding row decoder 924, an n-channel MOS N2 which is turned on to transmit a boosted word line drive signal RX onto word line WL in response to the signal potential on node A, and an n-channel MOS transistor N3 which is turned on to discharge word line WL to the ground potential level in response to an inverted decoded signal ZWD sent from the corresponding row decoder 924.

An RX generating circuit 930 is activated in response to the fall of signal /RAS, and outputs the high voltage Vpp generated by a high voltage generating circuit 932 as word line drive signal RX at a predetermined timing. Operation will now be described below.

During standby state, row decoder 924 is kept at the precharged state under the control by control signal generating circuit 916 shown in FIG. 63, output WD of AND decoder 924a is at the L-level, and signal ZWD supplied from inverter 924b is at the H-level. In this state, MOS transistor N2 is off, and MOS transistor N3 is on. Word line WL has been discharged to the ground potential level via MOS transistor N3.

When signal /RAS attains the L-level, the memory cycle starts. Row decoder 924 is activated in accordance with the external control signal sent from control signal generating circuit 916 shown in FIG. 63, and decodes the address signal applied from the address buffer 902. When signal WD sent from row decoder 924 is at the H-level, node A is charged to the potential level of (Vcc−Vth) which is lower than power supply potential Vcc by the threshold voltage Vth of MOS transistor N1. Signal ZWD is at the L-level, and MOS transistor N3 is off.

After node A is charged, the potential of the boosted signal RX generated by RX generating circuit 930 rises and is applied to one conduction terminal (drain) of MOS transistor N2. In MOS transistor N2, owing to the capacitive coupling between the gate and the drain, the potential of node A rises (self-boosting operation), and the gate potential of MOS transistor N2 rises. Thereby, word line WL receives the boosted signal RX via the MOS transistor, and the potential of word line WL is raised to high voltage Vpp level higher than power supply potential Vcc. When the signal WD sent from row decoder 924 is at the L-level, the potential of node A does not rise and MOS transistor N2 maintains the off state, even if word line drive signal RX sent from RX generating circuit 930 rises. At this time, signal ZWD is at the H-level, MOS transistor N3 is on, and the potential of word line WL is at the ground potential level.

By the following reason, the potential of node A maintains the L-level when the signal of node A is at the L-level, even if the signal RX rises. When node A is charged to the potential level of (Vcc−Vth) (i.e., when signal WD is at the H-level of Vcc level), MOS transistor N1 is substantially off (i.e., has a potential difference of threshold voltage Vth between gate and source). When the signal RX rises, MOS transistor N1 becomes completely turned off when the potential of node A rises owing to the capacitive coupling, and the charges in node A are confined. Thus, node A is set to the electrically floating state, so that the potential thereof is raised to a value not lower than (Vcc+Vth). Meanwhile, when signal WD is at the L-level, node A is also at the L-level, and MOS transistor N1 is on. Therefore, node A does not attain the floating state even when signal RX rises, and thus the potential of node A does not rise but maintains the L-level. Thus, MOS transistor N1 has a function as a decoupling transistor decoupling the node A from the output of row decoder 924 (output of AND decoder 924a) in response to the rise of the potential of node A.

The reason for raising word line drive signal RX to a level not lower than the operation power supply potential Vcc level is as follows. The potential of the selected word line can be raised to high voltage Vpp at a speed higher than that at which it is raised up to power supply potential Vcc. Therefore, stored information of the memory cell (accumulated charges of the memory capacitor) can be read onto the bit line (BL or /BL) at an earlier timing. A quantity Q of accumulated charges of the memory capacitor can be represented as Q=C·(V−Vcp), where V represents a potential of one electrode of the memory capacitor (i.e., storage node connected to the memory transistor), Vcp represents a potential of the other electrode (cell plate) of the memory capacitor, and C represents a capacitance of the memory capacitor. Therefore, in order to increase the quantity Q of accumulated charges of the memory capacitor, it is preferable to increase the potential V of the one electrode of memory capacitor as high as possible. One electrode of memory capacitor is connected to bit line (BL or /BL) via memory transistor MT as shown in FIG. 63. By setting the potential of word line WL to high voltage Vpp, the voltage at power supply potential Vcc level of bit line (BL or /BL) can be transmitted to the one electrode of memory capacitor MQ without loss of the threshold voltage of memory transistor MT. Thereby, an intended quantity of the accumulated charges is ensuredly accumulated in memory capacitor MQ.

In general, potential Vcp of the cell plate is set to an intermediate potential of Vcc/2. The potential transmitted to the one electrode of the memory capacitor is equal to power supply potential Vcc level when it is at the H-level, and is equal to the ground potential level when it is at the L-level. The reference potential (precharge potential) of bit lines BL and /BL is the intermediate potential Vcc/2. By transmitting the potential at power supply potential Vcc level as the high level of memory capacitor, the quantity of variation of the potential of bit line (BL or /BL) can be constant when reading data at the H-level and at the L-level from the memory capacitor, and thus the stable sense operation (i.e., increase of the sense margin and others) can be achieved.

FIG. 65 shows another structure of the word line select circuit in the prior art. In the structure shown in FIG. 65, the word driver itself has a decoding function.

In FIG. 65, row decoder 904 includes a row predecoder 940 which predecodes the internal address signal sent from the address buffer to generate a row predecode signal AX, an RX decoder 946 which predecodes a particular internal address signal sent from the address buffer to generate word line drive signals RXa (RX0–RX3 in FIG. 65), and a row decoder 942 which decodes the predecode signal sent from row predecoder 940 to generate signals WD and ZWD specifying the word line group including a plurality of word lines.

Row predecoder 940 generates the predecode signals (which are representatively indicated by AX0, AX1 and AX2 in FIG. 65) for specifying the word line group including a predetermined number of (four in FIG. 65) word lines. Row decoder 942 is provided corresponding to the word line group, and generates the decode signal for simultaneously designating the word lines included in the corresponding word line group. Row decoder 942 includes an AND decoder 943 receiving the predecode signal supplied from row predecoder 940, and an inverter 945 inverting the output of AND decoder 943. AND decoder 943 and inverter 945 use high voltage Vpp as the operation power supply potential, and operate to decode the predecode signal applied from row predecoder 940 and having a swing of power supply potential Vcc level and convert the potential of the decoded signal at the high level into high voltage Vpp level. The signal at the ground potential level is not converted, and is output as the signal at the ground potential level.

RX decoder 946 includes an X-predecoder 947 which predecodes the internal address signal sent from the address buffer, and a level converter circuit 949 which converts the H-level of the output of X-predecoder 947 into high voltage Vpp level for generating word line drive signals RX0–RX3. One of word line drive signals RX0–RX3 sent from the level converter circuit 949 is set to the H-level, and the remaining three word line drive signals are set to the L-level (ground potential level).

In word line drive circuit 906, a plurality of (four in FIG. 65) word drivers 950a–950d are provided for one row decoder 942. Word drivers 950a–950d receive word line drive signals RX0–RX3 from RX decoder 946, respectively. Word drivers 950a–950d have the same structure and, more specifically, each includes an n-channel MOS transistor N4 which transmits decode signal WD sent from row decoder 942 to an internal node B, an n-channel MOS transistor N5 which transmits word line drive signal RXi (i=0–3) to corresponding word line WLi in response to the signal potential on node B, and an n-channel MOS transistor N6 which discharges word line WLi to the ground potential in response to decode signal ZWD sent from row decoder 942. MOS transistor N4 is supplied at its gate with high voltage Vpp. Operation will now be described below.

Signals WD and ZWD output from row decoder 942 are at the L- and H-levels, respectively, when the decoder 942 is in the standby state or nonselected state (i.e., when at least one of outputs AX0, AX1 and AX2 of row predecoder 940 is at the L-level). In this state, the potential of node B is at the L-level, MOS transistor N5 is off, and MOS transistor N6 is on, so that all word lines WL0–WL3 are held at the ground potential level.

In the operation, when all outputs AX0, AX1 and AX2 of row predecoder 940 are at the H-level, outputs WD and ZWD of row decoder 942 are at the H- and L-levels, respectively. MOS transistor N6 is off, and MOS transistor N5 is on. The potential of node B is at the level of (Vpp–Vth), where Vth is the threshold voltage of MOS transistor N4. Signal WD is at the high voltage Vpp level. MOS transistor N4 is substantially off. In this state, one of word line drive signals RX0–RX3 supplied from RX decoder 946 rises to the H-level of high voltage Vpp level.

It is now assumed that word line drive signal RX0 is at the high voltage Vpp level, and other word line drive signals RX1–RX3 are at the L-level of the ground potential level. In the word driver 950a, the potential of node B rises to the potential level not lower than (Vpp+Vth) owing to the self-boost effect of MOS transistor N5, where Vth is the threshold voltage of MOS transistor N5. Thereby, MOS transistor N5 transmits word line drive signal RX0 at high voltage Vpp level onto word line WL0 without the loss of the threshold voltage. In word drivers 950b–950d, word line drive signals RX1–RX3 are at the L-level of the ground potential level, and the signals at the L-level of the ground potential level are transmitted onto word lines WL1–WL3 via MOS transistors N5, respectively.

FIG. 66 shows still another structure of the conventional word line driver circuit. FIG. 66 shows a structure of the word driver provided for one word line. In FIG. 66, the word driver includes a p-channel MOS transistor P1 which raises word line WL to high voltage Vpp level in response to decode signal ZWD, and n-channel MOS transistor N1 which discharges word line WL to the ground potential level in response to decode signal ZWD. The H-level of decode signal ZWD which is supplied from a decode stage (not shown) is equal to high voltage Vpp level, and the L-level thereof is equal to the ground potential level. Decode signal ZWD designates only one word line. p-channel MOS transistor P1 receives high voltage Vpp at one conduction terminal (source), and is connected at the other conduction terminal (drain) to word line WL. The n-channel MOS transistor N1 has one conduction terminal (source) connected to receive the ground potential, connected to a gate receive decode signal ZWD, and the other conduction terminal (drain) connected to word line WL. The word driver shown in FIG. 66 has a structure of a CMOS inverter circuit which operates with high voltage Vpp and ground potential. Operation will now be described below. In the standby state or nonselected state, signal ZWD is at high voltage Vpp level. MOS transistor P1 is off, and MOS transistor N1 is on, so that word line WL is discharged to the ground potential level. When signal ZWD attains the L-level of the ground potential level, MOS transistor N1 is turned off, and MOS transistor P1 is turned on, so that high voltage Vpp is transmitted to word line WL.

FIG. 67 shows a specific structure of the memory cell array. In FIG. 67, there are shown memory cells MC00, MC01, MC10 and MC11 arranged in two rows and two columns. Memory cells MC00 and MC10 are connected to word line WL0, and memory cells MC01 and MC11 are connected to word line WL1. Memory cells MC00 and MC01 are connected to bit line pair BL and /BL, and memory cells MC10 and MC11 are connected to bit line pair BL1 and /BL1.

A precharge/equalize circuit PE0 and a sense amplifier SA0 are provided for bit line pair BL0 and /BL0, and precharge/equalize circuit PE1 and sense amplifier SA1 are provided for bit line pair BL1 and /BL1.

Each of precharge/equalize circuits PE0 and PE1 includes n-channel MOS transistors T2 and T3, which are turned on in response to a bit line equalize signal BEQ to transmit a predetermined intermediate potential VBL to corresponding bit lines /BL and BL, and an n-channel MOS transistor T1, which is turned on in response to equalize signal BEQ to electrically short-circuit the bit lines BL0 (BL1) and /BL0 (/BL1). Generally, there is a relationship of VBL=Vcp=Vcc/2.

Bit line equalize signal BEQ is activated to precharge and equalize the bit lines BL0 (BL1) and /BL0 (/BL1) to intermediate potential VBL (=Vcc/2) when the signal /RAS is "H" of inactive state. When the signal /RAS attains the active state of the L-level, the bit line equalize signal BEQ attains the inactive state of the L-level, so that transistors T1, T2 and T3 are turned off, and bit lines BL0 (BL1) and /BL0 (/BL1) are set to the electrically floating state at the intermediate potential. When word line (e.g., WL0) is selected and its potential rises, memory transistors MT in memory cells MC00 and MC10 are turned on, and potentials of bit lines BL0 and BL1 change from precharge potential VBL in accordance with information stored in memory cells MC00 and MC10. Bit lines /BL0 and /BL1 hold the precharge potential. Thereafter, sense amplifiers SA0 and SA1 are activated to amplify potential differences of bit lines BL0 and /BL0, and bit lines BL1 and /BL1, respectively.

In the DRAM, memory capacitor MQ stores information in the form of electric charges. Leak of charges from the capacitor reduces the amount of accumulated charges. The leak of accumulated charges from the memory capacitor will be discussed below.

As shown in FIG. 68, it is assumed that data at the H-level (i.e., signal at power supply potential Vcc level) is written into memory cell MC. Upon completion of data writing, word line WL attains the nonselected state of the ground potential level (0 V). During the standby state, bit line BL is kept at the potential of Vcc/2 set by the precharge/equalize circuit shown in FIG. 67. In memory capacitor MQ, the potential of a storage node SN is Vcc, and the potential of cell plate SP is Vcp. In this state, the potential of gate of memory transistor MT is sufficiently lower than the potential of its source (i.e., conduction terminal connected to bit line BL). Therefore, even if the potential of word line WL varies to some extent, e.g., due to the influence by noises, memory transistor MT surely maintains the off state, and hence the electric charges neither flow from memory capacitor MQ into bit line BL nor flow from bit line BL into memory capacitor MQ.

As shown in FIG. 69, it is now assumed that memory cell MC1 has stored data at the H-level, and memory transistor MT1 is connected to word line WL0. Memory cell MC2 is connected to word line WL1, and has stored data at the L-level. Memory transistors MT1 and MT2 are connected to bit line BL. When word line WL1 is selected to raise its potential, data held at memory cell MC2 is transmitted onto bit line BL. Thereafter, the sense amplifier operates and the potential of bit BL is discharged down to the ground potential (0 V). In this state, the gate and source of transistor MT1 in the memory cell MC1 are set to the same potential.

In this state, therefore, memory cell MC1 has the electric charges held at memory capacitor MQ1 flown to bit line BL when the potential of word line WL0 rises due to the capacitive coupling with word line WL1, or when the potential of bit line BL slightly decreases in the negative direction due to the capacitive coupling between word line WL1 and bit line BL at the time of fall of the potential of word line WL1. In this manner, the potential change of the word line or bit line causes leak of charges accumulated in the memory capacitor via the channel of the memory transistor, and this leak causes change of the charge retention characteristics, which is referred to as "disturb refresh".

As shown in FIG. 70, it is assumed that memory capacitor MQ has stored data at the L-level during the standby state. The source of MOS transistor is one of the two conduction terminals held at the potential lower than that of the other. In the case shown in FIG. 70, therefore, the source is the conduction terminal connected to storage node SN. Even in this case, when the potential of word line WL rises due to the influence by noises, charges flow into memory capacitor MQ. This results in destruction of the stored information due to leak of electrons in the memory capacitor. Therefore, even the case shown in FIG. 70 presents a problem that sufficient immunity against "disturb refresh" cannot be achieved.

FIG. 71 shows an example of a subthreshold current characteristics of the MOS transistor. FIG. 71 shows a relationship between a gate/source voltage $V_{GS}$ and a drain current $I_D$ with a drain/source voltage $V_{DS}$ of 0.1 V. When gate voltage $V_{GS}$ is lower than the threshold voltage, drain current $I_D$ decreases exponentially. However, a small current flows even when the potentials of the gate and the source are equal to each other. If the electrostatic capacitance of memory cell capacitor MQ is relatively large, the leak does not significantly affect the refresh cycle. However, if the capacitance of memory capacitor is greatly reduced so as to comply with high integration of DRAM in recent years, the amount of accumulated charges decreases, so that the leak current significantly affects the refresh cycle.

In order to prevent the flow of charges which may be caused by the channel leak, the impurity concentration at the channel region may be increased sufficiently for increasing the threshold voltage Vth of memory transistor MT. The subthreshold current which may cause the channel leak is the drain current through a weakly inverted region in the channel region, and formation of this weakly inverted region is suppressed by increasing the threshold voltage.

However, if the threshold voltage Vth of memory transistor MT is raised as described above, it is necessary to further increase the voltage of high voltage Vpp applied to word line WL in order to write the signal potential at power supply potential Vcc level (i.e., H-level data) into memory capacitor MQ. If the high voltage Vpp is increased, a load of the circuit generating the high voltage Vpp increases, so that stable supply of high voltage Vpp is impossible, or the circuit scale or size must be increased. Also, current consumption increases by the following reason. In general, a high voltage generating circuit produces the high voltage Vpp from power supply potential Vcc by utilizing a charge pump operation of a capacitor. An efficiency of conversion from power supply potential Vcc to high voltage Vpp is not higher than 50%. For example, if the current consumption of the circuit utilizing the high voltage Vpp increases by 1 mW and the conversion efficiency is 50%, the current consumption of power supply potential Vcc increases by 2 mW. Further, if high voltage Vpp is increased, a high voltage is applied to the word line, which results in a problem related to the reliability of breakdown voltage characteristics of the word line as well as a problem related to the reliability of the transistors supplied with high voltage Vpp (MOS transistor and memory transistor in the word driver). In particular, a problem related to reliability of components arises in the word driver portion, because high voltage Vpp is applied across the drain and source of the MOS transistor therein.

If the refresh cycle is shortened in order to compensate for deterioration of the refresh characteristics (charge retention characteristics of memory cell), only reading and rewriting (restoring) of data of memory cell are merely performed in the refresh operation, and external access is inhibited, so that an external device cannot access the DRAM during the refresh period, resulting in reduction of a utilization efficiency of the DRAM and in performance deterioration of a processing system using the DRAM.

SUMMARY OF THE INVENTION

An object of the invention is to provide a semiconductor memory device having an improved refresh characteristics without impairing reliability of components.

Another object of the invention is to provide a semiconductor memory device having a reduced current consumption and an improved refresh characteristics.

Still another object of the invention is to provide a semiconductor memory device having a word line selecting and driving circuitry which can improve refresh characteristics.

Briefly stating, the memory device of the present invention is adapted to hold a nonselected word line at a voltage of the same polarity as that of a bias voltage applied to a substrate region of a memory cell. The nonselected word line means a word line which is set to the nonselected state in both a standby cycle and an active cycle. If a memory transistor includes an n-channel MOS transistor, a negative potential lower than the ground potential is applied to the nonselected word line.

The memory transistor connected to the nonselected word line has a gate potential and a source potential which are surely different from each other, and attains a stronger off state, so that a subthreshold current is significantly reduced. In the operation, even if capacitive coupling noises change the potential of the nonselected word line, an apparent amount of potential change is smaller than that in the prior art, so that the nonselected memory cell transistor can be surely maintained at the off state, and increase of the leak current of the nonselected memory cell transistor is suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
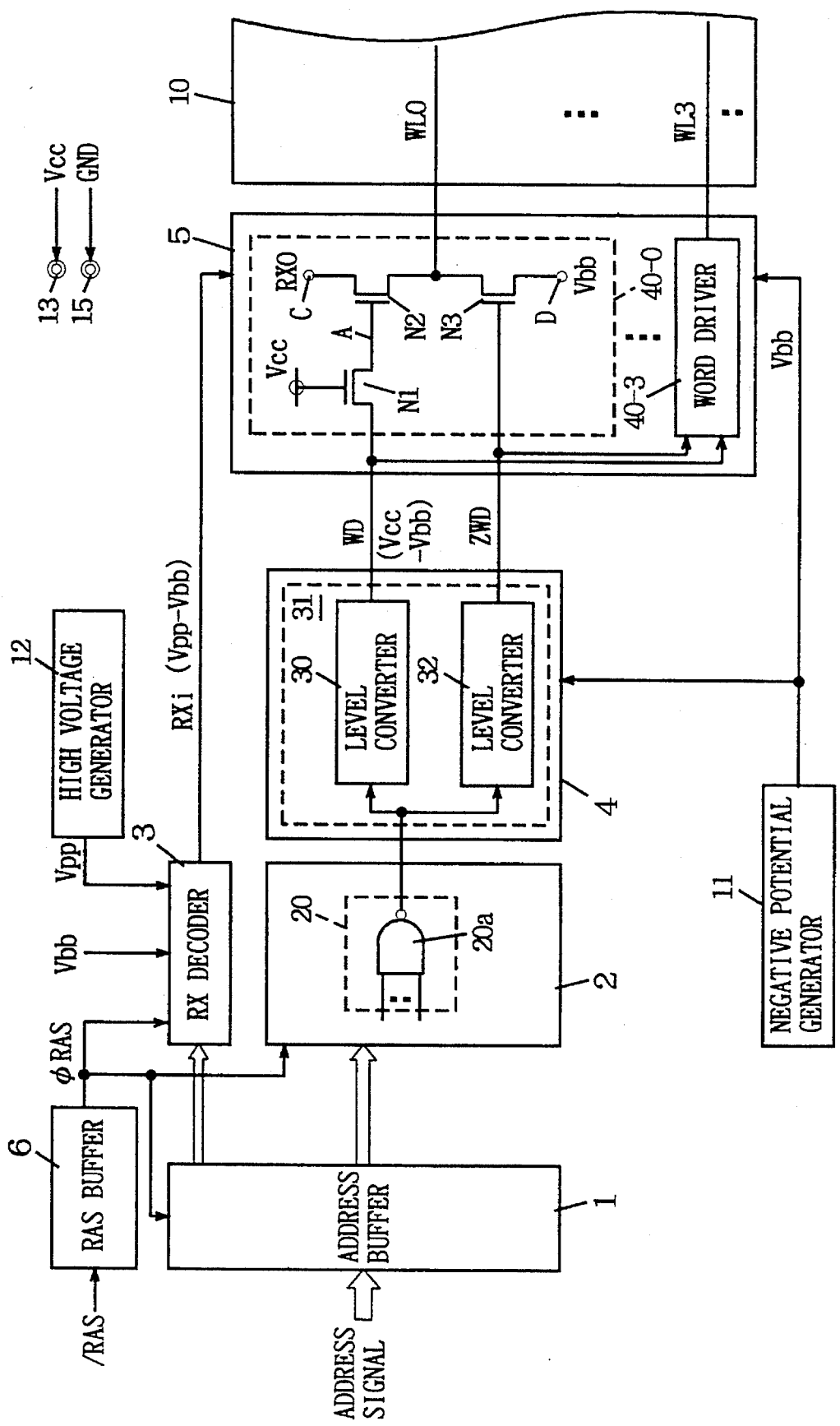
FIG. 1 schematically shows a structure of a main portion of a semiconductor memory device according to a first embodiment of the invention.

FIG. 1 shows a structure of a main portion of a semiconductor memory device which is a first embodiment of the invention. In FIG. 1, a semiconductor memory device includes an address buffer 1 which receives an externally applied address signal and produces an internal address signal, a row decode circuit 2 which decodes, for example, an upper internal address signal received from address buffer 1 and generates a decode signal (word line group specifying signal) for specifying a predetermined number of (four in FIG. 1) word lines in memory cell array 10, a negative potential generating circuit 11 which generates a voltage of a first polarity, i.e., negative potential Vbb, and a high voltage generating circuit 12 which generates a voltage of a second polarity, i.e., a high voltage Vpp. Row decode circuit 2 includes row decoders 20, each of which is provided corresponding to a group of a predetermined number of word lines. Row decoder 20 is formed of an NAND type row decoder, and attains the selected state to output a signal at the L-level when all the applied internal address signals are at the H-level.

Although not shown, memory cell array 10 includes memory cells arranged in a matrix rows and columns. A word line is arranged corresponding to each row of the memory cells, and a bit line pair (column line) is arranged corresponding to each memory cell column. In FIG. 1, two word lines WL0 and WL3 are representatively shown for showing one word line group WL0–WL3. The memory cell has a structure of a dynamic memory cell storing data by storing electric charges in a capacitor. The semiconductor memory device of the present invention is required only to include dynamic memory cells, and may be a pseudo-SRAM and a virtual SRAM. In the following description, a dynamic random access memory will be discussed as an example, and the semiconductor memory device will be referred to as a DRAM.

The DRAM further includes an RX decoder 3 which decodes, for example, a lower internal address signal sent from address buffer 1 and generates a signal RXi (i=0–3) specifying one of the word lines, a level converter circuit 4 which converts the level of output signal of row decode circuit 2, and a word line drive circuit 5 which drives the addressed word line in memory cell array 10 to the selected state in accordance with the outputs of level converter circuit 4 and RX decoder 3.

RX decoder 3 receives negative potential Vbb from negative potential generating circuit 11 and high voltage Vpp from high voltage generating circuit 12, and generates signal RXi of high voltage Vpp or negative potential Vbb. RX decoder 3 decodes the internal address signal sent from address buffer 1, and in accordance with the result of this decoding, set a selected signal RXi to high voltage Vpp level for outputting the same at a predetermined timing and output nonselected signal RXi at negative potential Vbb level. The signal supplied from row decoder 2 has an amplitude of power supply potential Vcc level.

In the level converter circuit 4, two level converters 30 and 32 are provided for one row decoder 20. Level converters 30 and 32 output signals WD and ZWD of mutually complementary logic. The L-level of signals WD and ZWD supplied from level converters 30 and 32 is negative potential Vbb level. The H-level of signals WD and ZWD is power supply potential Vcc level.

In word line drive circuit 5, four word driver 40-0 to 40-3 are provided for two level converters 30 and 32. FIG. 1 shows only a specific structure of word driver 40-0. Word driver 40-0 includes an n-channel MOS transistor N1 transmitting signal WD sent from level converter 30 to node A, n-channel MOS transistor N2 which is responsive to the signal potential of node A to transmit signal RX0 applied to a node C (first node) to corresponding word line WL0, and n-channel MOS transistor N3 which is turned on in response to output signal ZWD sent from level converter 32 to transmit negative potential Vbb applied to a node D (second node) to word line WL0.

RAS buffer 6 produces an internal RAS signal φRAS in accordance with externally applied row address strobe signal (memory cycle start instructing signal). In accordance with internal RAS signal φRAS, operation timings of address buffer 1, row decode circuit 2 and RX decoder 3 are determined. In FIG. 1, operation power supply potential Vcc and ground potential GND are shown being applied via pin terminals 13 and 15, respectively. Operation power supply potential Vcc may be generated internally via a voltage down converter. In general, if operation power supply potential Vcc is 2.5 V, high voltage Vpp is in a range from 4 to 4.5 V, and negative potential Vbb is in a range from −1.5 to −2 V. This negative potential is equal to or smaller in absolute value than a bias voltage Vsub applied to a substrate region of a memory cell forming region in memory cell array 10, which will be described later. Then, operation will be now described below.

During standby, signal /RAS is at the inactive state of H-level, and internal RAS signal φRAS is at the L-level. In this state, the output of row decoder 20 included in row decode circuit 2 is at the H-level, and signal WD sent from level converter 30 included in level converter 4 is at negative potential Vbb level. Output ZWD of level converter 32 is at the power supply potential Vcc level. Thus, level converter 30 has a function of inverting the logic of output of row decoder 20. Level converter 32 has only a function of performing level conversion of the L-level of output of row decoder 20.

In word line drive circuit 5, output WD of level converter 30 is at negative potential Vbb level, output ZWD of level converter 32 is at power supply potential Vcc level, and output RXi of RX decoder 3 is at negative potential Vbb level, so that word drivers 40 (40-0 to 40-3) are set to such a state that n-channel MOS transistors N2 are off, n-channel MOS transistors N3 are on, and word lines WL0–WL3 are maintained at negative potential Vbb level.

When signal /RAS attains the active state of L-level, the memory cycle (active cycle) starts, and the device is externally accessed. In the active cycle in which signal /RAS is active, address buffer 1 takes in the external address signal and produces the internal address signal in response to internal RAS signal φRAS sent from RAS buffer 6. Row decode circuit 2 and RX decoder 3 are activated in response to internal RAS signal φRAS to decode the internal address sent from address buffer 1.

When the output of row decoder 20 is at the H-level of power supply potential Vcc level (i.e., in the nonselected state), output WD of level converter 30 attains the L-level of negative potential Vbb level, and output ZWD of level converter 32 attains the H-level of power supply potential Vcc level. This state is the same as that during standby, and word drivers 40-0 to 40-3 provided corresponding to this row decoder 20 hold word lines WL0–WL3 at negative potential Vbb level, respectively.

When the output of row decoder 20 is at the L-level of ground potential GND level (i.e., in the selected state), output WD of level converter 30 attains the H-level of power supply potential Vcc level, and output ZWD of level converter 32 attains the L-level of negative potential Vbb level. In each of word drivers 40 (generically indicating word drivers 40-0 to 40-3) in word line drive circuit 5, MOS transistor N1 receiving power supply potential Vcc at its gate sets the potential of node A to (Vcc−Vth) level, and MOS transistor N2 is turned on. MOS transistor N1 has a potential difference equal to threshold voltage Vth between its gate and source (node A), and hence is substantially off. Meanwhile, MOS transistor N3 is turned off by signal ZWD at negative potential Vbb level (MOS transistor N3 has the same potential at the gate and source (node D)).

Any one of signals RXi (i=0–3) sent from RX decoder 3 is raised to high voltage Vpp level at a predetermined timing. When signal RX0 is at high voltage Vpp level, in word driver 40-0, the potential of node A rises owing to the self-boost effect of MOS transistor N2, and MOS transistor N2 attains the strong on state. When the potential of node A increases to or above (Vpp+Vth) (where Vth is the threshold voltage of MOS transistor N2), the potential of word line WL0 attains high voltage Vpp level.

When signal RX0 is at the negative potential Vbb level, MOS transistor N2 holds word line WL0 at negative potential Vbb level applied to node C.

Figure 2:
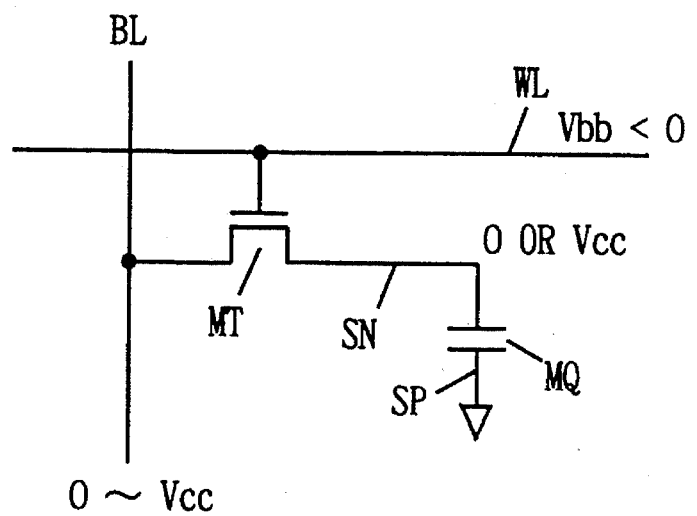
FIG. 2 shows voltage application conditions of a memory transistor in the embodiment of the invention, FIG. 3 schematically shows a distribution of a depletion layer in a transistor supplied with a high voltage in the embodiment of the invention.
Figure 67:
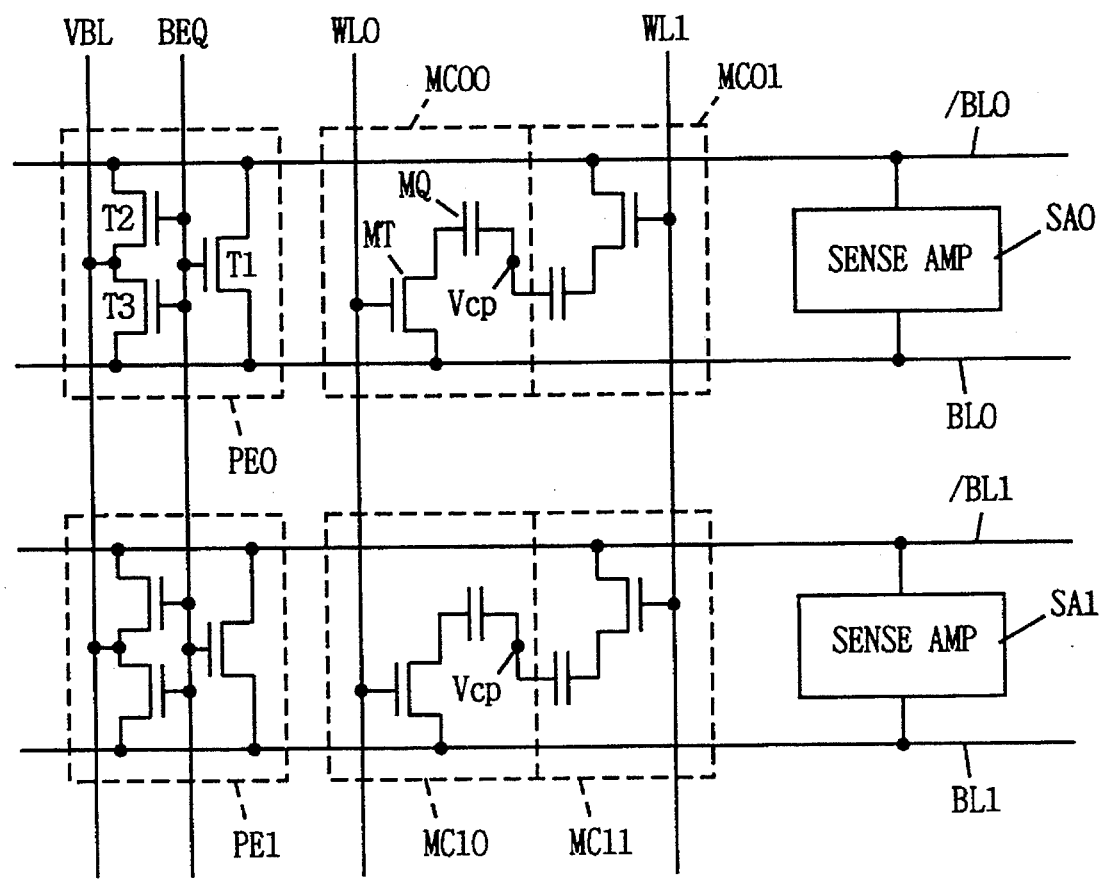
FIG. 67 schematically shows a structure of a memory cell array in the conventional DRAM.
Figure 68:
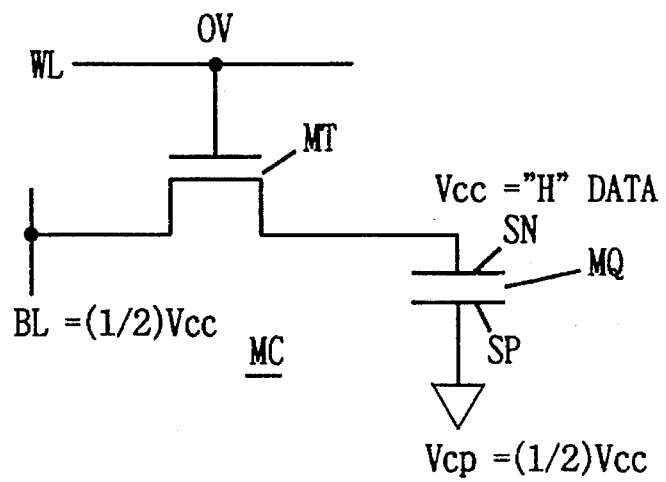
FIGS. 68 to 70 illustrate problems in the conventional DRAMs.
Figure 69:
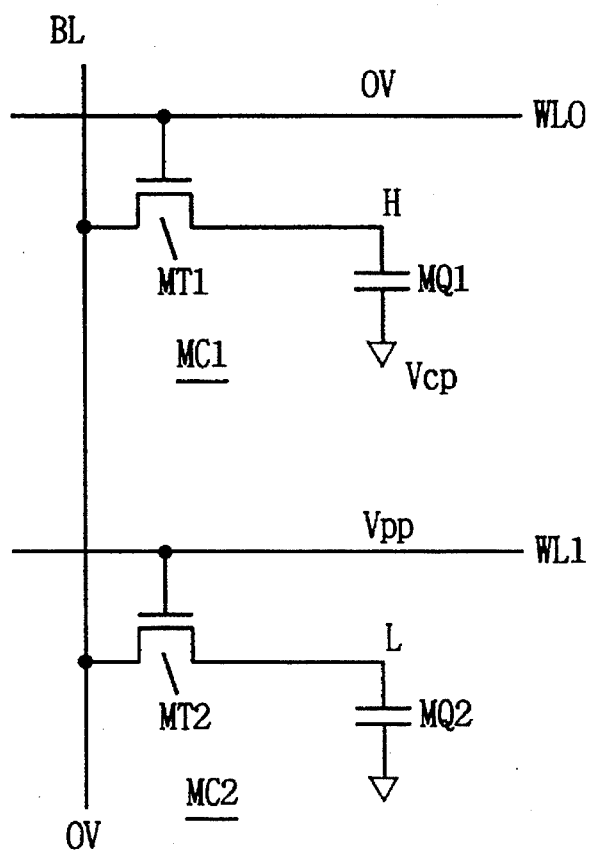
Figure 70:
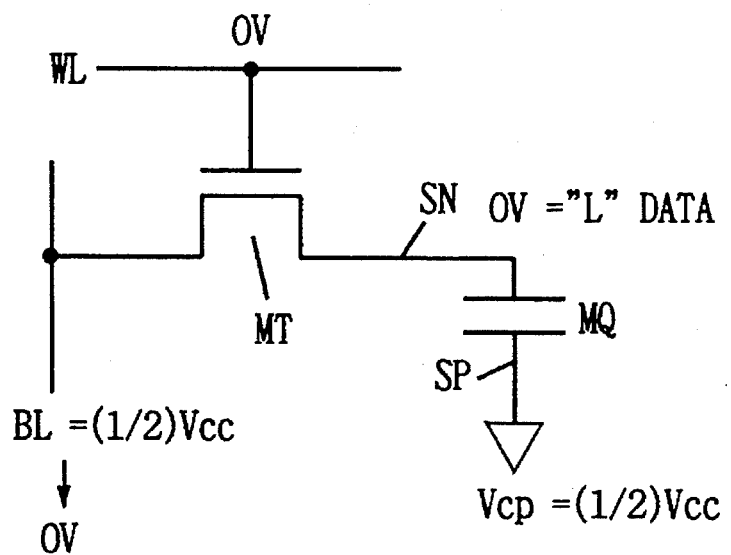
Figure 71:
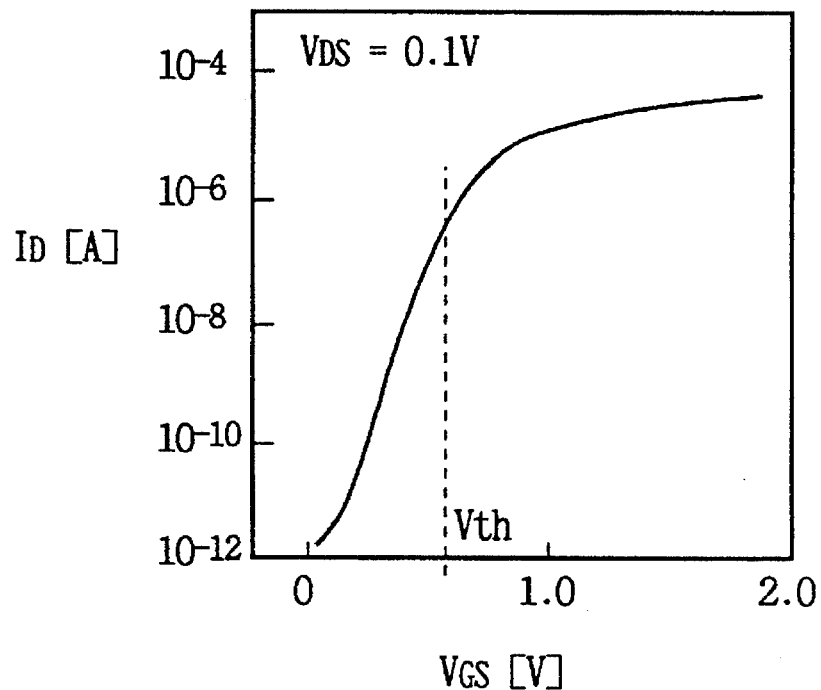
FIG. 71 represents subthreshold characteristics of an MOS transistor.

The structure relating to the bit lines is the same as that shown in FIG. 67, and the potential amplitude of the bit line is equal to power supply potential Vcc–ground potential GND (0 V). Therefore, as shown in FIG. 2, when negative potential Vbb is applied to word line WL, the potential of source of memory transistor MT is always lower than that of its gate, so that channel leak can be surely suppressed in MOS transistor MT. Thus, as can be seen also from subthreshold characteristic curve shown in FIG. 71, by setting the potential of word line WL to the negative potential, gate-source voltage Vgs of memory transistor MT can be set to a negative value, and the subthreshold current thereof can be significantly reduced. Further, during operation, even if the potential of nonselected word line WL supplied with negative potential Vbb is raised by the capacitive coupling with the selected word line, the rise of potential of the nonselected word line is smaller by |Vbb| than that in the prior art, and thus the subthreshold current of memory transistor MT can be reduced significantly, so that movement of accumulated charges in memory capacitor MQ, which may be caused by the channel leak, can be significantly suppressed, and thus the "disturb refresh" characteristics can be significantly improved.

Even when the capacitive coupling or noises changes the potential of bit line BL in a negative direction, gate/source voltage Vgs of memory transistor MT is lower by |Vbb| than that in the prior art because negative potential Vbb is applied to word line WL, so that memory transistor MT can similarly and significantly suppress movement of the charges which may be caused by the channel leak.

The threshold voltage of memory transistor MT is not made high. The voltage level of high voltage Vpp is equal to that in the prior art, and thus reliability relating to the breakdown voltage of the MOS transistor is ensured. Application of the negative potential to the word line can also provide the following advantage.

Figure 3:
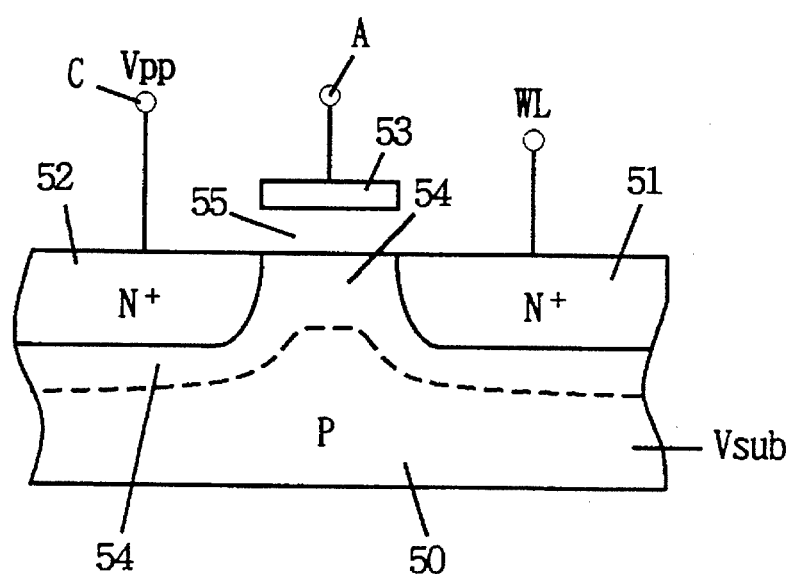

FIG. 3 shows a sectional structure of the MOS transistor for transmitting the word line drive signal included in the word driver. In FIG. 3, MOS transistor N2 includes high concentration impurity regions 51 and 52 formed at a surface of a substrate region 50, and a gate electrode 53 formed on a channel region 54 between impurity regions 51 and 52 with a gate insulating film 55 therebetween. Impurity region 51 is coupled to word line WL, and impurity region 52 is connected to node C. Gate electrode 53 is connected to node A.

Substrate region 50 is of a P-type, and is supplied with substrate bias voltage Vsub. It is assumed that the substrate bias voltage Vsub is equal to substrate bias voltage Vsub applied to the memory cell formation region. The surface impurity concentration at P-type substrate region 50 is set low. When high voltage Vpp is applied to node C, a depletion layer 54 is formed at the surface of substrate region 50. If the impurity concentration at P-type substrate region 50 is low, the depletion layer formed thereat has a large width by the following reason. In the MOS transistor, the width of depletion layer 54 formed at the surface of substrate region is represented as a function of an impurity concentration Na at the surface of P-type substrate region 50. Generally, width W of the depletion layer is represented as a function of the (−½)th power of impurity concentration Na. Therefore, if impurity concentration Na is small, depletion layer 54 formed at the surface of substrate region 50 has a large width. Accordingly, even if high voltage Vpp is applied to N-type impurity region 52, the electric field between P-type substrate region 50 and N-type impurity region 52 can be relaxed because the electric field between P-type substrate region 50 and N-type impurity region 52 is applied across depletion layer 54. Therefore, the junction breakdown voltage characteristics of MOS transistor can be improved.

By applying. negative potential Vbb to word line WL, the threshold voltage of memory transistor MT can be somewhat reduced, and it is also possible to reduce somewhat the absolute value of substrate bias voltage Vsub applied for preventing flow of electric charges from storage node SN of memory cell to the substrate. Thereby, the electric field between N-type impurity region 52 and P-type substrate region 50 can be relaxed further, and thus intended breakdown voltage characteristics of memory transistor are ensured.

The bias voltage of the negative potential equal to or similar than substrate bias voltage Vsub applied to substrate region 50 of the MOS transistor shown in FIG. 3 is applied to the substrate region of the memory cell formation region. The purposes of the substrate bias voltage applied to the memory cell formation region are (a) to suppress variation of the threshold voltage of the memory transistor, (b) to suppress formation of parasitic MOS transistor between a signal line and the substrate, and (c) to suppress flow of electrons (accumulated charges at the memory capacitor) from the storage node to the substrate. If the negative potential is applied to the word line, channel leak of electric charges of the memory transistor is suppressed, so that it is possible to reduce the absolute value of the substrate bias voltage applied to the memory cell formation region. By reducing the absolute value of the substrate bias voltage applied to the memory cell formation region, it is possible to reduce the threshold voltage of memory transistor, so that it is possible to advance a timing at which the memory transistor is turned on upon selection, and signal charges can be transmitted faster onto the bit line.

If the absolute value of the substrate bias voltage applied to the memory cell formation region is reduced, the depletion layer at the memory cell formation region increases, and hence the electric field formed between the storage node and the substrate is relaxed, so that flow of electrons from the storage node into the substrate can be suppressed, and charge holding characteristics ("pause refresh" characteristics) of the memory cell is also improved. Specific structures of respective portions will be described below.

[Level Converter]

Figure 4:
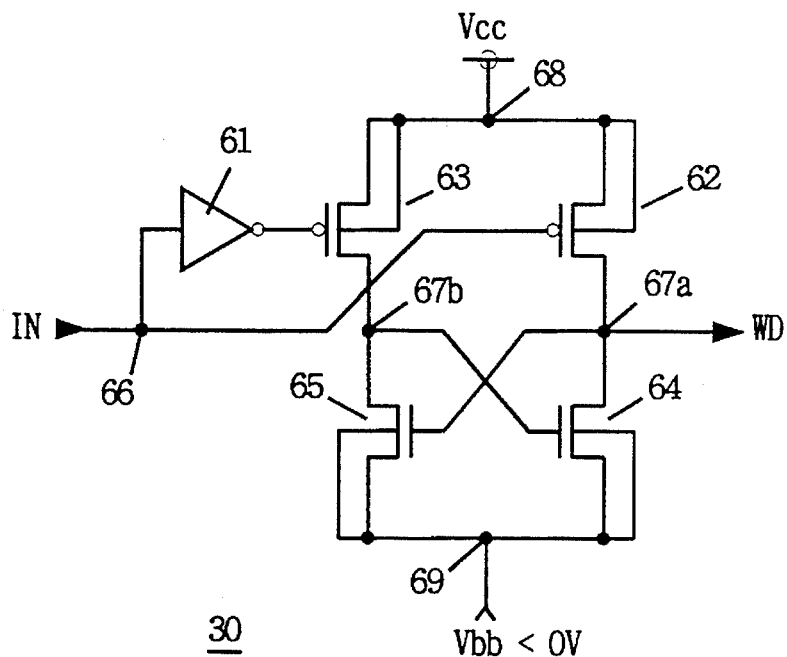
FIG. 4 shows an example of a structure of one of level converters shown in FIG. 1.

FIG. 4 shows a structure of the level converter producing signal WD shown in FIG. 1. In FIG. 4, level converter 30 includes an inverter 61 which inverts a signal IN (output of row decoder 20) applied to an input node 66, a p-channel MOS transistor 62 which is turned on in response to the signal potential on internal node 66 to transmit power supply potential Vcc applied to a power supply node 68 to an output node 67a, a p-channel MOS transistor 63 which is turned on in response to the output of inverter 61 to transmit power supply potential Vcc applied to power supply node 68 to an internal node 67b, an n-channel MOS transistor 65 which is turned on in response to the signal potential on output node 67a to transmit negative potential Vbb received on another power supply node 69 to internal node 67b, and an n-channel MOS transistor 64 which is responsive to the signal potential on internal node 67b to transmit negative potential Vbb received on another power supply node 69 to output node 67a. Substrate regions of p-channel MOS transistors 62 and 63 are connected to power supply node 68, and substrate regions of n-channel MOS transistors 64 and 65 are connected to another power supply node 69. Inverter 61 operates with power supply potential Vcc and the ground potential as both operation power supply potentials, and outputs a signal at power supply potential Vcc level or a signal at ground potential GND level in accordance with input signal IN. Operation will now be described below.

When input signal IN (output of row decoder 20 shown in FIG. 1) is at the H-level of power supply potential Vcc level (during nonselected and standby states), the output of inverter 61 is at the L-level, MOS transistor 62 is off, and MOS transistor 63 is on. Internal node 67b is charged up to power supply potential Vcc applied to power supply node 68 by MOS transistor 63. When the potential of internal node 67b rises, MOS transistor 64 is turned on, and output node 67a is discharged down to negative potential Vbb level applied to another power supply node 69 via MOS transistor 64. When the potential of output node 67a attains the negative potential Vbb level, MOS transistor 65 has the same potential at its gate and source, and is turned off. Thereby, output node 67a is held at negative potential Vbb level, and internal node 67b is held at power supply potential Vcc level.

When input IN is at the L-level (ground potential level) (i.e., in the selected state), the output of inverter 61 is at the H-level of Vcc level, MOS transistor 62 is on, and MOS transistor 63 is off. Output node 67a is charged up to power supply potential Vcc level by MOS transistor 62. Since the potential of output node 67a rises, MOS transistor 65 is turned on, and internal node 67b is discharged down to negative potential Vbb level. In accordance with the lowering of potential at internal node 67b, MOS transistor 64 turns to the off state. Finally, when internal node 67b reaches negative potential Vbb, MOS transistor 64 has the same potential at its gate and source, and thus is turned off. Thereby, output node 67a is held at the H-level of power supply potential Vcc level, and internal node 67b is held at negative potential Vbb level.

Figure 5:
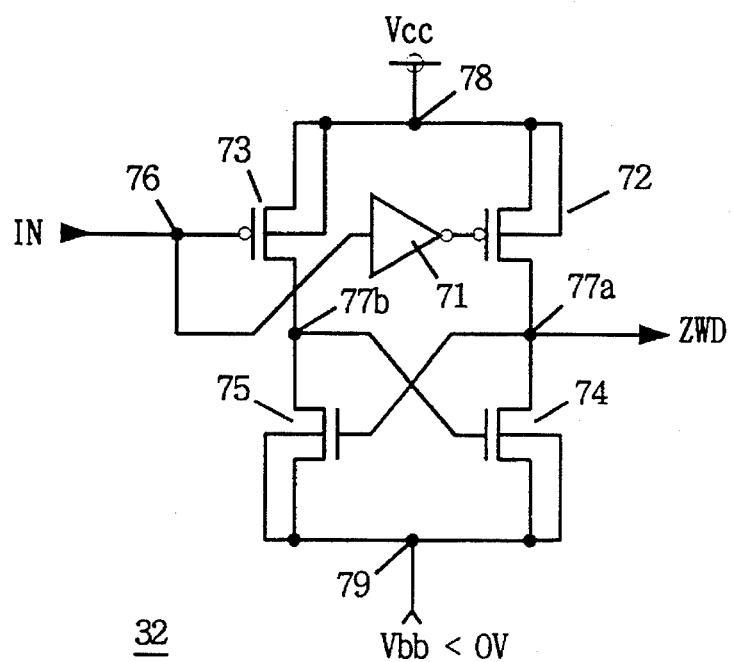
FIG. 5 shows a structure of the other level converter shown in FIG. 1.

FIG. 5 shows a structure of the level converter producing signal ZWD shown in FIG. 1. In FIG. 5, level converter 32 includes an inverter 71 which inverts signal IN applied to input node 76, a p-channel MOS transistor 72 which is turned on in response to the output of inverter 71 to transmit power supply potential Vcc received on a power supply node 78 to an output node 77a, a p-channel MOS transistor 73 which is turned on in response to the signal potential of input node 67 to transmit power supply potential Vcc received on power supply node 78 to an internal node 77b, an n-channel MOS transistor 74 which is turned on in response to the potential of internal node 77b to discharge output node 77a to negative potential Vbb level applied to another power supply node 79, and an n-channel MOS transistor 75 which is turned on in response to the signal potential on output node 77a to discharge internal node 77b to negative potential Vbb level. The substrate regions of p-channel MOS transistors 72 and 73 are connected to power supply node 78, and the substrate regions of n-channel MOS transistors 74 and 75 are connected to another power supply node 79. Operation will now be described below.

When input IN applied to input node 76 is at power supply potential Vcc level, the output of inverter 71 is at the L-level of ground potential level, MOS transistor 72 is on, and MOS transistor 73 is off. Output node 77a is charged to power supply potential Vcc level via MOS transistor 72. In accordance with potential rise of output node 77a, MOS transistor 75 is turned on, and internal node 77b is discharged to negative potential Vbb level. When the potential of internal node 77b attains negative potential Vbb, MOS transistor 74 is turned off, the potential of output node 77a is held at power supply potential Vcc level, and the potential of internal node 77b is held at negative potential Vbb level.

When input IN is at the L-level of ground potential level, the output of inverter 71 is at the H-level of power supply potential Vcc level, MOS transistor 72 is off, and MOS transistor 73 is on. Internal node 77b is charged up to power supply potential Vcc level via MOS transistor 73. Output node 77a is discharged to negative potential Vbb level via MOS transistor 74.

The structure of level converter 32 shown in FIG. 5 is equivalent to a structure in which an inverter is additionally provided at a node 66 preceding input inverter in the structure of the level converter 30 shown in FIG. 4. Therefore, level converters 30 and 32 shown in FIGS. 4 and 5 produce mutually complementary outputs WD and ZWD, respectively. Thus, when output WD is at the H-level of power supply potential Vcc level, signal ZWD is at the L-level of negative potential Vbb level.

Figure 6:
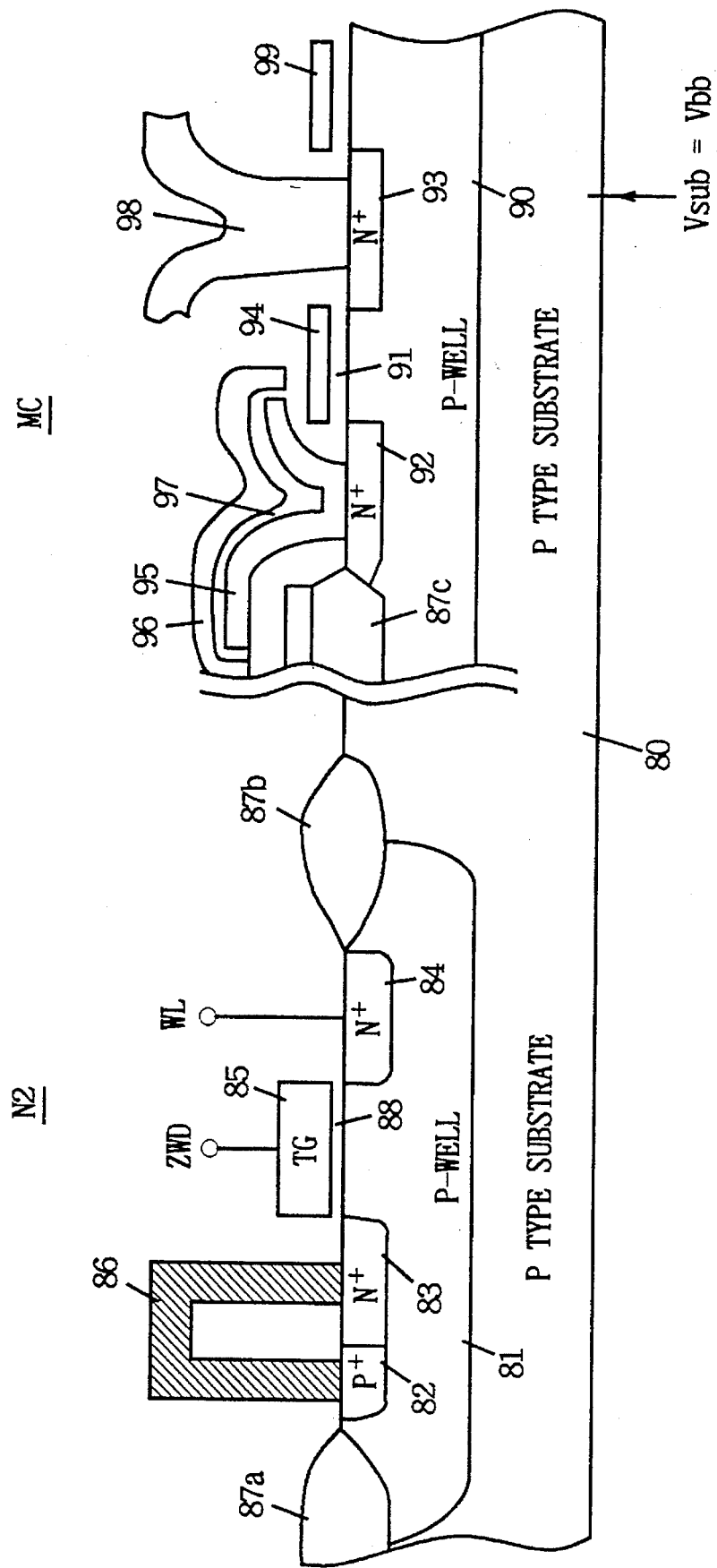
FIG. 6 schematically shows sectional structures of a memory cell and a negative potential transmitting transistor included in a word driver shown in FIG. 1.

FIG. 6 shows a sectional structure of the MOS transistor transmitting a negative potential. In FIG. 6, MOS transistor N2 included in the word driver is representatively shown.

The n-channel MOS transistors included in the level converters shown in FIGS. 4 and 5 have the substantially same sectional structure as that in FIG. 6. FIG. 6 also shows a sectional structure of the memory cell.

In FIG. 6, MOS transistor N2 is formed in a P-well 81 formed at a surface of a P-type substrate 80. MOS transistor N2 includes high concentration N-type impurity regions 83 and 84 formed at the surface of P-well 81, and a gate electrode (TG) 85 formed on a channel region between impurity regions 83 and 84 with a gate insulating film 88 therebetween. Gate electrode (TG) 85 receives output ZWD from the level converter shown in FIG. 5. Impurity region 84 is connected to word line WL. Substrate bias voltage Vsub is applied to P-type substrate 80. Both P-type substrate 80 and P-well 81 are of P-type, and substrate bias voltage Vsub is also applied to P-well 81. A P-type high concentration impurity region 82 is formed at the surface of P-well 81. High concentration impurity region 82 is connected to an N-type impurity region 83 via a low resistance conductive line 86 made of, e.g., an aluminum interconnection. Negative potential Vbb is applied to impurity region 83 from P-type substrate 80 via P-type impurity region 82 and P-well 81. Negative potential Vbb can be generated easily without increasing an area occupied by interconnections for transmitting negative potential Vbb.

Memory cell MC is formed in a P-well 90 formed at a region different from P-well 81 on P-type substrate 80. A region or area of P-well 81 in which the MOS transistor is formed for transmitting the negative potential is delineated by a field oxide film (LOCOS film: local oxide film).

Memory cell MC includes N-type high concentration impurity regions 92 and 93 formed at the surface of P-well 90, a gate electrode 94 formed on a channel region between impurity regions 92 and 93 with a gate insulating film 91 therebetween, a conductive layer 95 forming a storage node connected to impurity region 92, and a conductive layer 96 forming a cell plate which is formed on conductive layer 95 with a capacitor insulating film 97 therebetween. Impurity region 93 is connected to a conductive layer 98 forming a bit line. Gate electrode 94 forms the word line. In FIG. 6, there is also shown a gate electrode 99 of an adjacent memory cell. The aforementioned memory cell is isolated from an adjacent memory cell at the other side by a thermal oxide film 87c. Substrate bias voltage Vsub is applied to substrate region 80, and is also applied to P-well 90.

According to the structure shown in FIG. 6, a circuit for generating substrate bias voltage Vsub can be used to generate negative potential Vbb to be transmitted to the nonselected word lines. It is not necessary to provide a negative potential generating circuit independently from the substrate bias generating circuit, and thus the device scale can be reduced.

[Modification of Negative Potential Supply]

Figure 7:
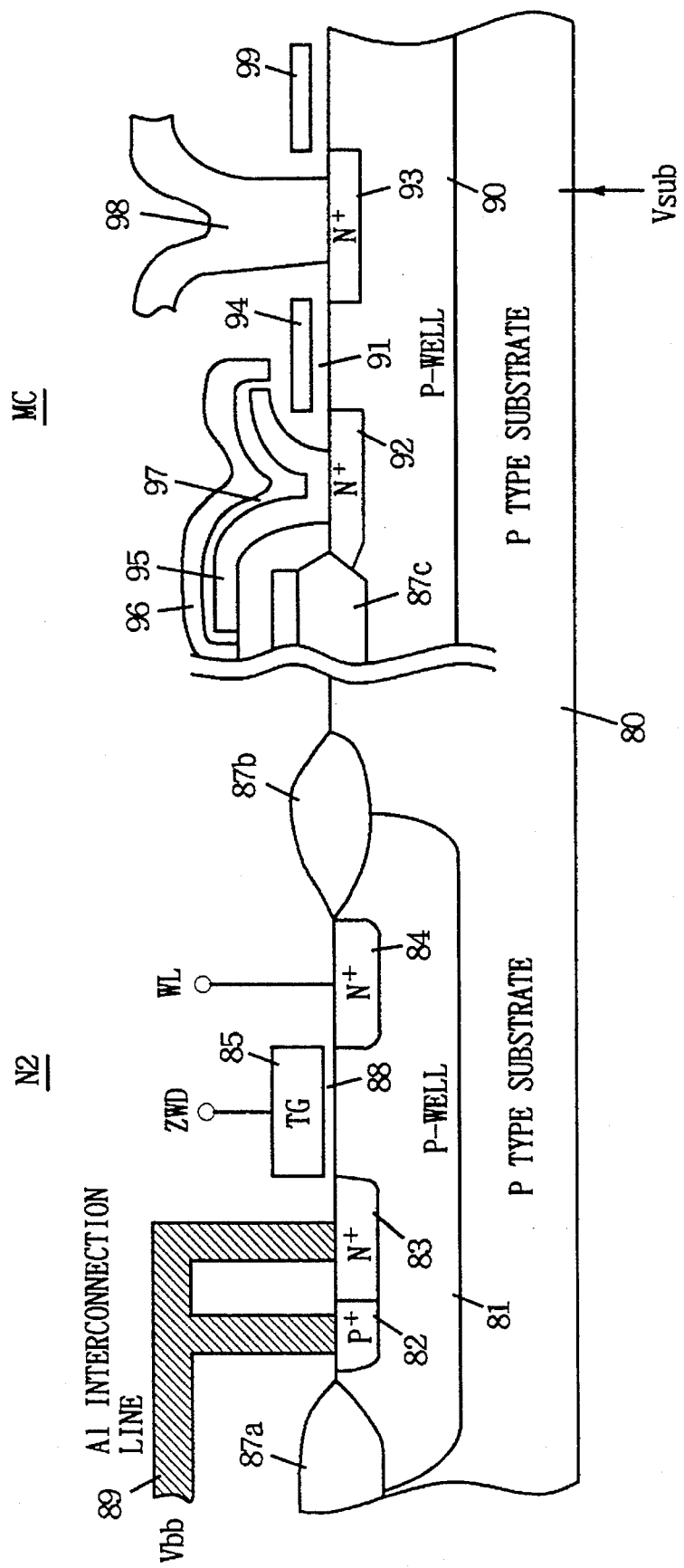
FIG. 7 shows a modification of sectional structures of the memory cell and the negative potential transmitting transistor included in the word driver shown in FIG. 1.

FIG. 7 shows another structure of the negative potential supply. In FIG. 7, portions and parts corresponding to those in FIG. 6 bear the same reference numerals. In FIG. 7, there is representatively shown a MOS transistor for transmitting negative potential Vbb included in the word driver. In the structure shown in FIG. 7, negative potential Vbb is applied to both P-type impurity region 82 and N-type impurity region 83 via a low resistance conductive line 89, e.g., made of an aluminum interconnection. P-well 81 is surely biased to negative potential Vbb via P-type impurity region 82. Even when the potential of substrate 80 varies due to charging and discharging of the signal line during operation of the DRAM, the bias voltage of P-well 81 can be surely fixed at negative potential Vbb, and MOS transistor N2 can surely operate to transmit negative potential Vbb to the nonselected word line.

Further, P-well 81 may have a triple diffusion layer structure or the like in which p-well 81 is isolated from P-type substrate 80 (the level converters shown in FIGS. 4 and 5 have a CMOS structure, and the triple diffusion layer structure is employed if the CMOS transistor is formed at the P-well). In this case, negative potential Vbb can be surely transmitted to the substrate region (well region) of the MOS transistor for supplying the negative potential, and the negative potential Vbb can be surely transmitted to the nonselected word line.

[RX decoder]

Figure 8:
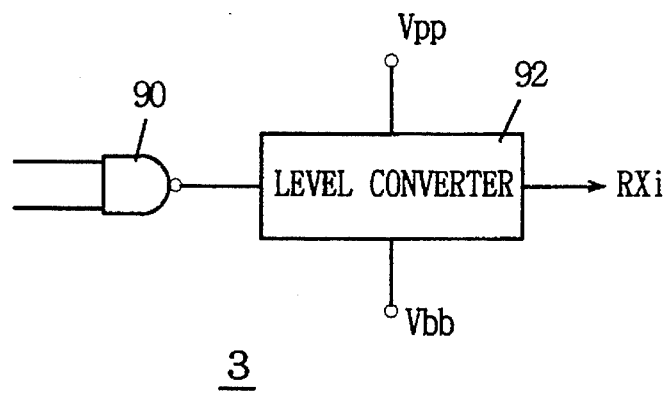
FIG. 8 schematically shows a structure of an RX decoder shown in FIG. 1.

FIG. 8 shows an example of the structure of RX decoder shown in FIG. 1. In FIG. 8, there is shown only a portion of the structure generating one word line drive signal RXi. If RX decoder 3 is adapted to select one word line from a word line group including four word lines, there are provided four structures, each being the same as that shown in FIG. 8.

In FIG. 8, RX decoder 3 includes an NAND decoder 90 decoding the internal address signal from the address buffer, and a level converter 92 converting the level of output of decoder 90. NAND decoder 90 operates with power supply potential Vcc and ground potential GND as the operation power supply potential. The structure of level converter 92 is the same as that of the level converter shown in FIG. 4. A high voltage Vpp is applied to node 68 shown in FIG. 4. More specifically, level converter 92 outputs signal RXi at negative potential Vbb level when the output of NAND decoder 90 is at the H-level of power supply potential Vcc level. When the output of NAND decoder 90 is at the L-level of the ground potential level, level converter 92 outputs signal RXi at high voltage Vpp level.

Figure 9:
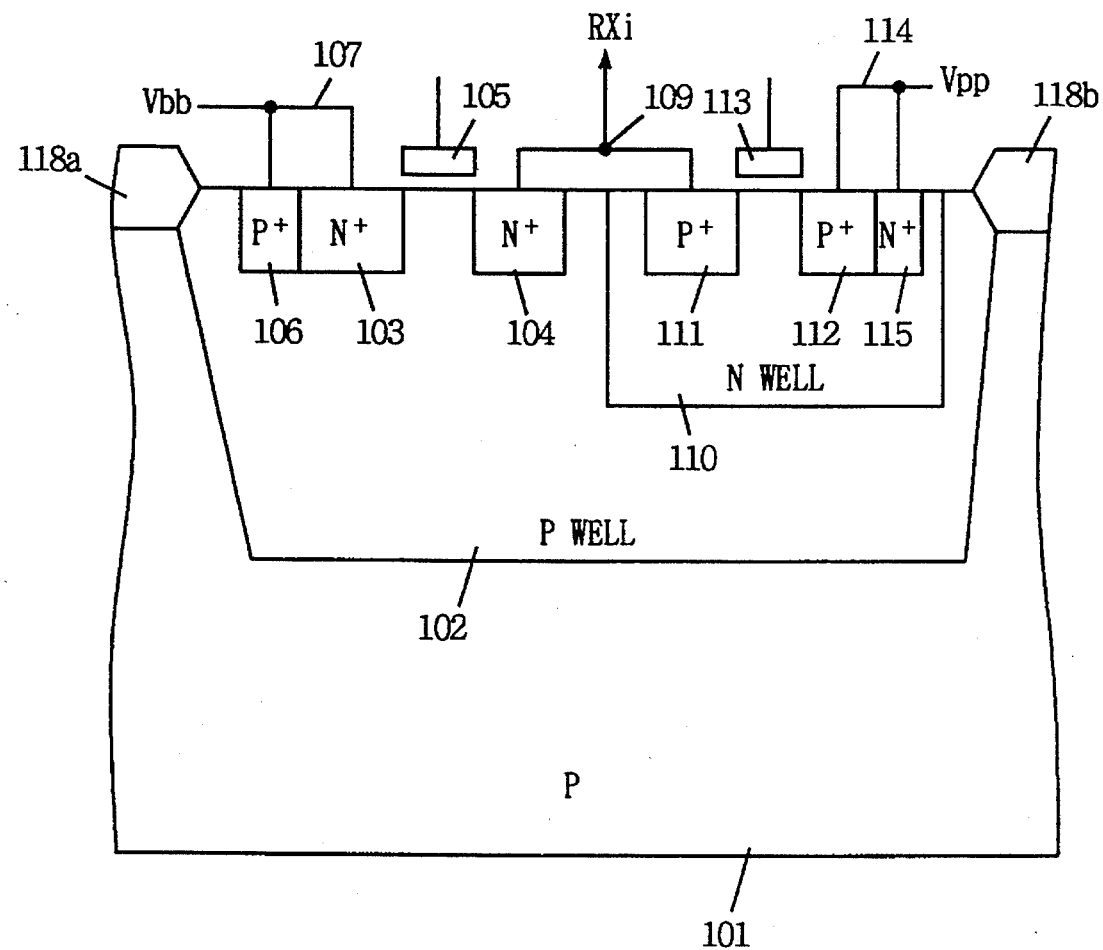
FIG. 9 schematically shows a sectional structure of an MOS transistor at a signal output stage of the RX decoder shown in FIG. 8.

FIG. 9 schematically shows a sectional structure of transistors in the output part of the level converter shown in FIG. 8. In FIG. 9, the output portion of level converter 92 includes an n-channel MOS transistor formed on a P-well 102 and a p-channel MOS transistor formed at an N-well 110. P-well 102 is formed at the surface of P-type substrate (semiconductor layer) 101. N-well 110 is formed at the surface of P-well 102.

The n-channel MOS transistor includes N-type impurity regions 103 and 104 formed at the surface of P-well 102, a gate electrode 105 formed on a region between impurity regions 103 and 104 with a gate insulating film therebetween, and a P-type high concentration impurity region 106. Negative potential Vbb is applied to impurity regions 103 and 106 via a signal line (low resistance conductive layer) 107. Gate electrode 105 is supplied with an inverted signal of the output of NAND decoder 90 shown in FIG. 8.

The p-channel MOS transistor includes P-type high concentration impurity regions 111 and 112 formed at the surface of an N-well 110, a gate electrode 113 formed on a channel region between impurity regions 111 and 112 with a gate insulating film therebetween, and an N-type high concentration impurity region 115 formed at the surface of N-well 110. High voltage Vpp is applied to impurity regions 112 and 115 via a signal line (low resistance interconnection layer) 114. Gate electrode 113 is supplied with the output of NAND decoder 90 shown in FIG. 8.

P-well 102 is biased to negative potential Vbb, and N-well 110 is biased to high voltage Vpp. Impurity regions 104 and 111 are connected to a signal line 109. Signal line 109 outputs word line drive signal RXi. The region of P-well 102 is delineated by thermal oxidation films 118a and 118b. Owing to isolation by P-well 102 from other element formation regions, signals at high voltage Vpp level and negative potential Vbb can be generated without adversely affecting circuit elements which operate with power supply potential Vcc and ground potential GND as the operation supply voltages.

In the structure shown in FIG. 9, N-well 110 is formed at the surface of P-well 102. Alternatively, the P-well may be formed at the surface of N-well. P-type substrate 101 may be an epitaxial layer.

[Modification 1 of Row Decoder]

Figure 10:
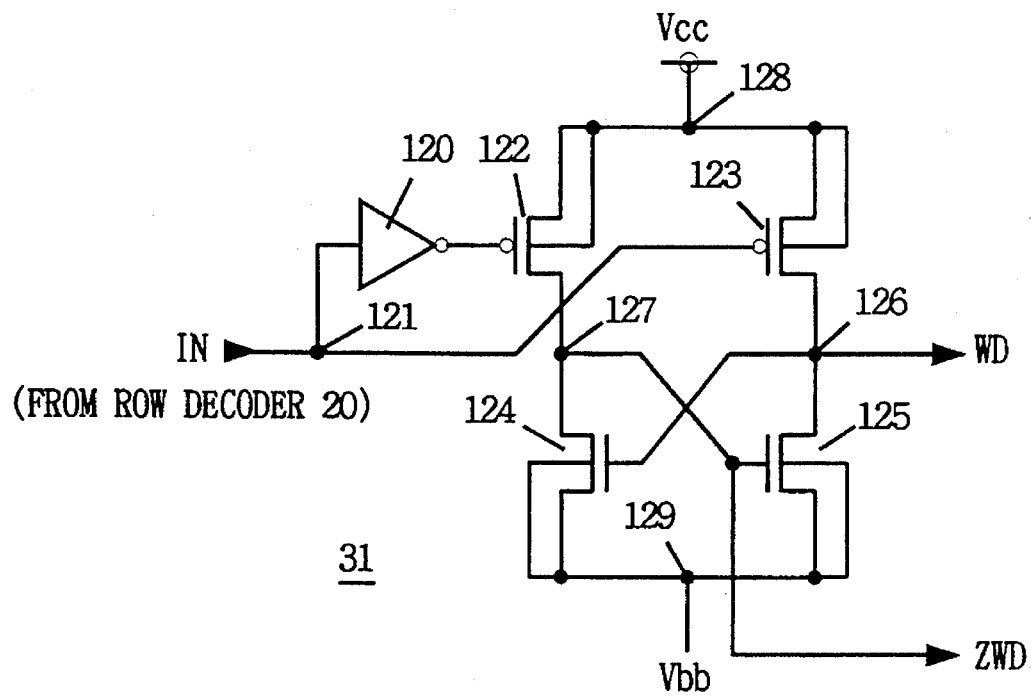
FIGS. 10 to 12 show first to third modifications of the level converter shown in FIG. 1, respectively.

FIG. 10 shows a structure of a first modification of the level converter circuit included in the row decode circuit. In FIG. 10, level converter 31 includes an inverter 120 which inverts output IN from row decoder 20 (see FIG. 1), a p-channel MOS transistor 123 which is turned on in response to signal IN on a node 121 to transmit power supply potential Vcc applied to a power supply node 128 to a node 126, a p-channel MOS transistor 122 which is turned on in response to the output of inverter 120 to transmit power supply potential Vcc on power supply node 128 to a node 127, an n-channel MOS transistor 124 which is responsive to the potential on node 126 to establish an electrical connection between node 127 and another power supply node 129, and an n-channel MOS transistor 125 which is responsive to the potential on node 127 to establish an electrical connection between node 126 and another power supply node 129. Node 126 outputs signal WD, and node 127 outputs signal ZWD. These signals WD and ZWD are applied to word driver shown in FIG. 1. Operation will now be described below.

When the input IN (output of row decoder 20) is at the H-level of power supply potential Vcc, the output of inverter 120 attains the L-level of ground potential GND level, MOS transistor 122 is off, and MOS transistor 123 is on. Node 127 is charged by MOS transistor 122 to power supply potential Vcc level, and MOS transistor 125 is turned on. Node 126 is discharged down to negative potential Vbb level via turned-on MOS transistor 125. MOS transistor 124 is turned off in response to the potential of negative potential Vbb level. In this state, signal WD attains the L-level of negative potential Vbb level, and signal ZWD attains the H-level of power supply potential Vcc level.

When input IN is at the L-level of ground potential level, the output of inverter 120 attains the H-level of power supply potential Vcc level, MOS transistor 122 is off, and MOS transistor 123 is on. Node 126 is charged to power supply potential Vcc level via MOS transistor 123, and MOS transistor 124 is turned on to discharge node 127 to negative potential Vbb. MOS transistor 125 is turned off in accordance with negative potential Vbb level of node 127. More specifically, when input IN is at the L-level of ground potential level, signal WD is at power supply potential Vcc level, and signal ZWD is at negative potential Vbb level.

In the structure of level converter shown in FIG. 10, mutually complementary signals WD and ZWD can be produced from one level converter. Therefore, the circuit scale can be reduced as compared with the structure of level converter shown in FIG. 1.

[Modification 2 of Level Converter]

Figure 11:
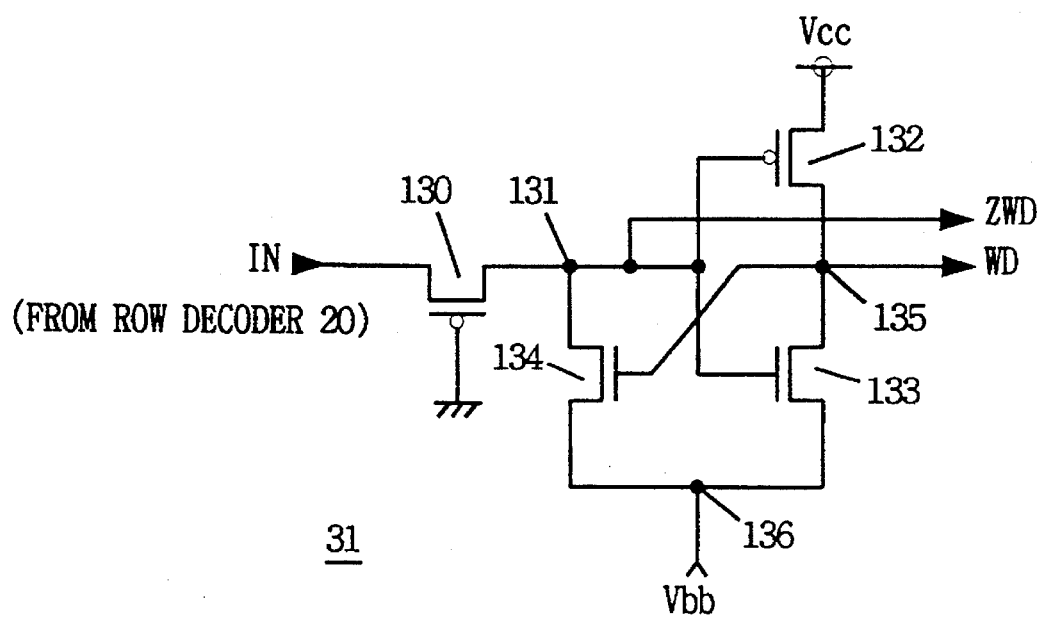

FIG. 11 shows a structure of a second modification of the level converter. In FIG. 11, level converter 31 includes a p-channel MOS transistor 130 which receives ground potential GND on its gate to transmit input IN (output of row decoder 20) to a node 131, a p-channel MOS transistor 132 which is responsive to the signal potential of node 131 to transmit power supply potential Vcc to an output node 135, an n-channel MOS transistor 133 which is responsive to the signal potential of node 131 to transmit negative potential Vbb received on another power supply potential node 136 to output node 135, and an n-channel MOS transistor 134 which is responsive to the potential of node 135 to transmit negative potential Vbb received on another power supply potential node 136 to node 131. MOS transistors 132 and 133 are complementarily turned on with each other. Signal WD is output from node 135, and signal ZWD is output from node 131. Operation will now be briefly described below.

When input IN (output of row decoder 20) is at power supply potential Vcc level, node 131 is charged via MOS transistor 130 to attain power supply potential Vcc level. MOS transistor 132 is turned off, MOS transistor 133 is turned on, and output node 135 is discharged down to negative potential Vbb level via MOS transistor 133. When output node 135 attains negative potential Vbb level, MOS transistor 134 is turned off, and node 131 maintains power supply potential Vcc level. Thereby, signals WD and ZWD attain negative potential Vbb level and power supply potential Vcc level, respectively.

When input IN is at the L-level of ground potential level, node 131 is discharged to the ground potential level via MOS transistor 130 (discharging via MOS transistor 130 provides a potential level higher than the ground potential level by the threshold voltage of MOS transistor 130) at node 131. In accordance with lowering of the potential level of node 131, MOS transistor 132 is turned on, and output node 135 is charged up to power supply potential Vcc level. In accordance with potential rise of node 135, MOS transistor 134 is turned on to discharge node 131 down to negative potential Vbb level. When the potential of node 131 decreases below the absolute value of the threshold voltage of MOS transistor 130, MOS transistor 130 has the gate potential higher than the sum of the source potential and threshold voltage, and thus is turned off. Thereby, node 131 is surely discharged down to negative potential Vbb level. Signal WD attains power supply potential Vcc level, and signal ZWD attains negative potential Vbb level.

The level converter shown in FIG. 11 differs from the level converter shown in FIG. 10 in that it does not use the inverter, so that the number of components can be reduced, and the circuit scale can be reduced.

[Modification 3 of Level Converter]

Figure 12:
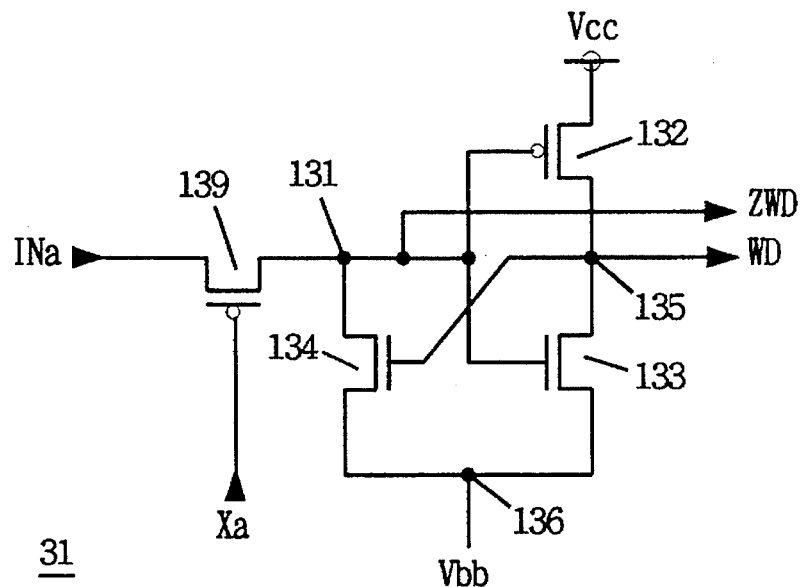

FIG. 12 shows a structure of a third modification of the level converter. Level converter 31 shown in FIG. 12 differs from the structure shown in FIG. 11 in that a p-channel MOS transistor 139 arranged at the input portion receives on its gate an address signal Xa. Structures other than the above are the same as those of the circuit shown in FIG. 11, and the corresponding portions bear the same reference numerals. Operation will now be described below.

When both input INa and address signal Xa are at the L-level of ground potential level, the node 131 is discharged by MOS transistor 134 to attain negative potential Vbb level. Since MOS transistors 132 and 133 form a CMOS inverter, signal WD sent from output node 135 attains power supply potential Vcc level. When the memory cell cycle is completed, input INa attains the H-level of power supply potential Vcc level, and node 131 is charged up to power supply potential Vcc level, so that MOS transistor 132 is turned off, and MOS transistor 133 is turned on. Thereby, signal WD attains negative potential Vbb level, and signal ZWD attains power supply potential Vcc level. Subsequently, address signal Xa attains the H-level, and MOS transistor 139 is turned off. The potential at power supply potential Vcc level on node 131 and the potential at negative potential Vbb level on node 135 are latched by MOS transistors 133 and 134.

Even when input INa is at the L-level of ground potential level, MOS transistor 139 maintains the off state when address signal Xa is at the H-level of power supply potential Vcc level, so that nodes 131 and 135 maintain the same potentials as those in the standby state.

When address signal Xa is at the L-level and input INa is at the H-level, MOS transistor 139 is on, but the potentials of nodes 131 and 135, i.e., signals ZWD and WD are the same as those in the standby state.

As shown in FIG. 12, since the level converter is provided with the address decoding function, the scale of row decode circuit shown in FIG. 1 can be reduced significantly. The reason of reduction of the scale of row decode circuit will be described below.

Figure 13:
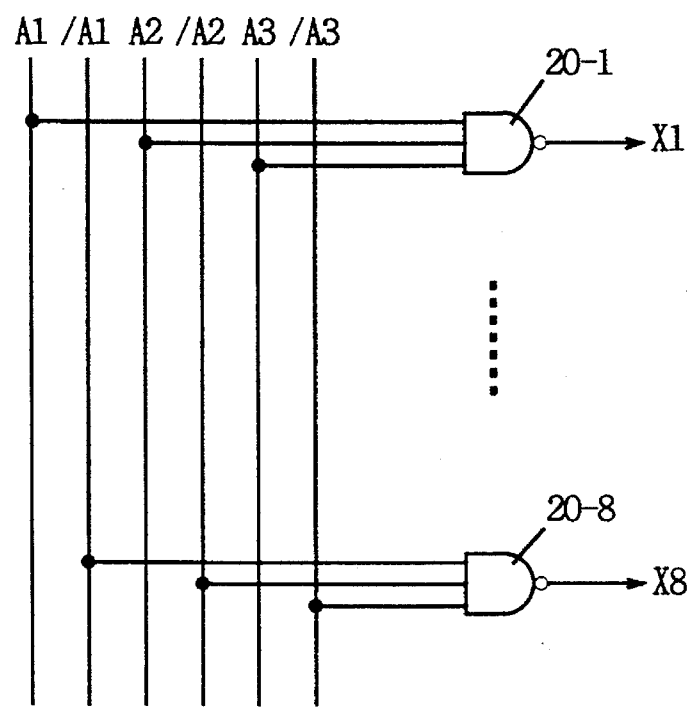
FIG. 13 illustrates an effect by the level converter shown in FIG. 12.

Referring to FIG. 13, the row decode circuit which decodes 3-bit address signals A1, A2 and A3 will now be discussed. When decoding 3-bit address signals A1, A2 and A3, there are also produced address signals /A1–/A3 complementary to address signals A1–A3. In this case, eight NAND decoders are required. In FIG. 13, there are shown only NAND decoders 20-1 and 20-8. Any one of outputs X1-X8 of NAND decoders 20-1 to 20-8 is set to the L-level of the selected state.

Figure 14:
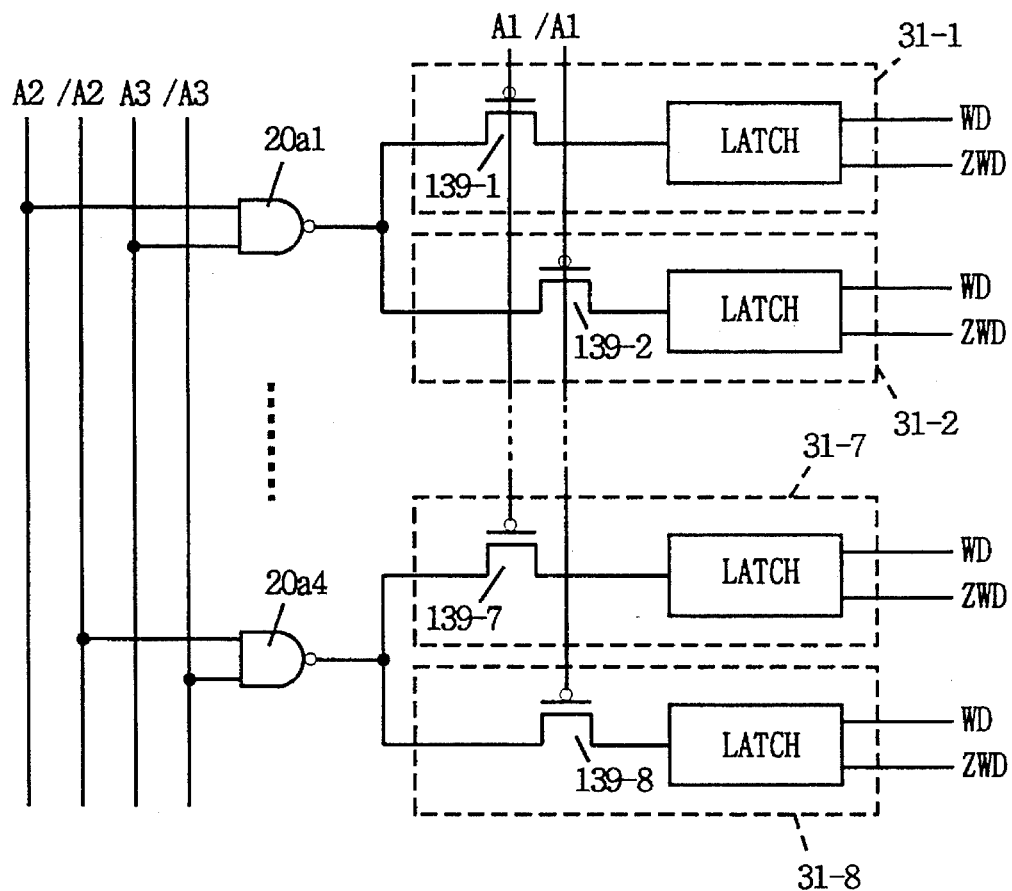
FIG. 14 illustrates an effect by the level converter shown in FIG. 12.

Meanwhile, if the level converter is provided with the decoding function as shown in FIG. 12, the row decode circuit is achieved by a structure shown in FIG. 14.

In FIG. 14, the row decode circuit includes four NAND decoders 20a1–20a4 in order to decode 2-bit address signals A2 and A3 (more accurately, four bits of complementary address signals A2, /A2, A3, /A3). The level converter circuit is provided with eight level converters 31-1 to 31-8. Level converters 31-1 to 31-8 include at their inputs p-channel MOS transistors 139-1 to 139-8, which receive address signal A1 or /A1. In accordance with address signals A2 and A3, one of four NAND decoders 20a1–20a4 in the row decode circuit outputs the signal at the L-level indicative of the selected state. Thereby, two level converters are specified. One of these two specified level converters is selected in accordance with address signals A1 and /A1. As a result, only one of eight level converters 31-1–31-8 is selected to supply signals WD and ZWD.

The row decode circuit shown in FIG. 13 requires eight 3-input NAND decoders. Meanwhile, the row decode circuit shown in FIG. 14 requires four 2-input NAND decoders. The level converters in both the structures are the same in number. The circuit scale of the row decode select circuit shown in FIG. 14 is significantly reduced as compared with that of the row decode circuit shown in FIG. 13. Thus, by utilizing the level converter shown in FIG. 12, the scale of the row decode circuit can be significantly reduced.

In order to achieve the structure in which address signal Xa applied to the level converter such as address signals A1 and /A1 is at the H-level during the standby state, it is necessary only to utilize such a structure that the address buffer (see FIG. 1) sets both address signals Xa such as address signals A1 and /A1 to the H-level when internal RAS signal RAS is inactive (at the H-level), and the structure can be achieved easily by utilizing the OR circuit.

[Modification 4 of Level Converter]

Figure 15:
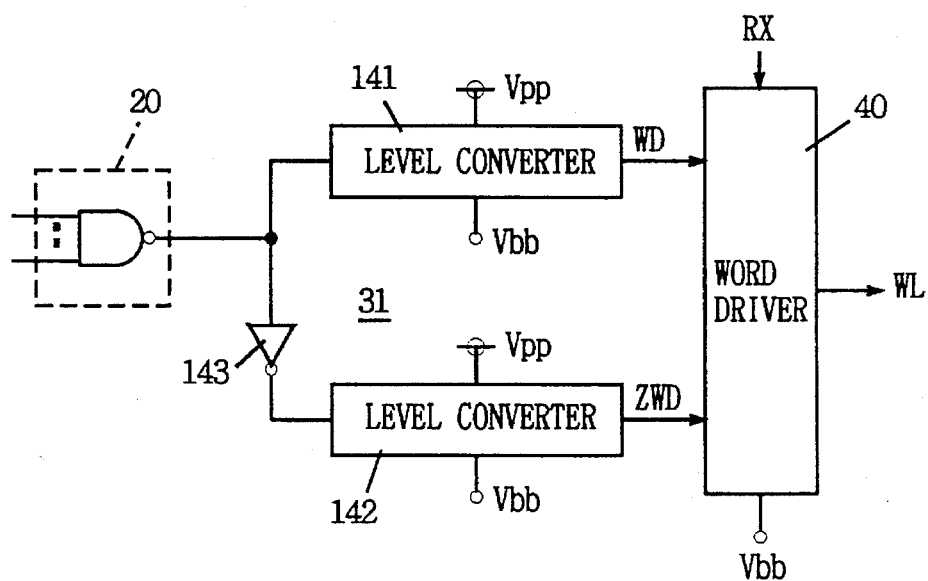
FIG. 15 shows a fourth modification of the level converter shown in FIG. 1.

FIG. 15 shows a structure of a fourth modification of the level converter. In FIG. 15, level converter 31 includes an inverter 143 which inverts the output of NAND decoder 20, a level converter 141 which converts the output signal of NAND decoder 20 having an amplitude of (Vcc–GND) into a signal having an amplitude of (Vpp–Vbb), a level converter 142 which converts the output signal of inverter 143 having an amplitude of (Vcc–GND) into a signal having an amplitude of (Vpp–Vbb), and a word driver 40 which transmits one of word line drive signal RX and negative potential Vbb to corresponding word line WL in accordance with outputs WD and ZWD of level converter 141 and 142. Level converters 141 and 142 have the same structure. The structure of level converter 141 or 142 is shown in FIG. 16.

Figure 16:
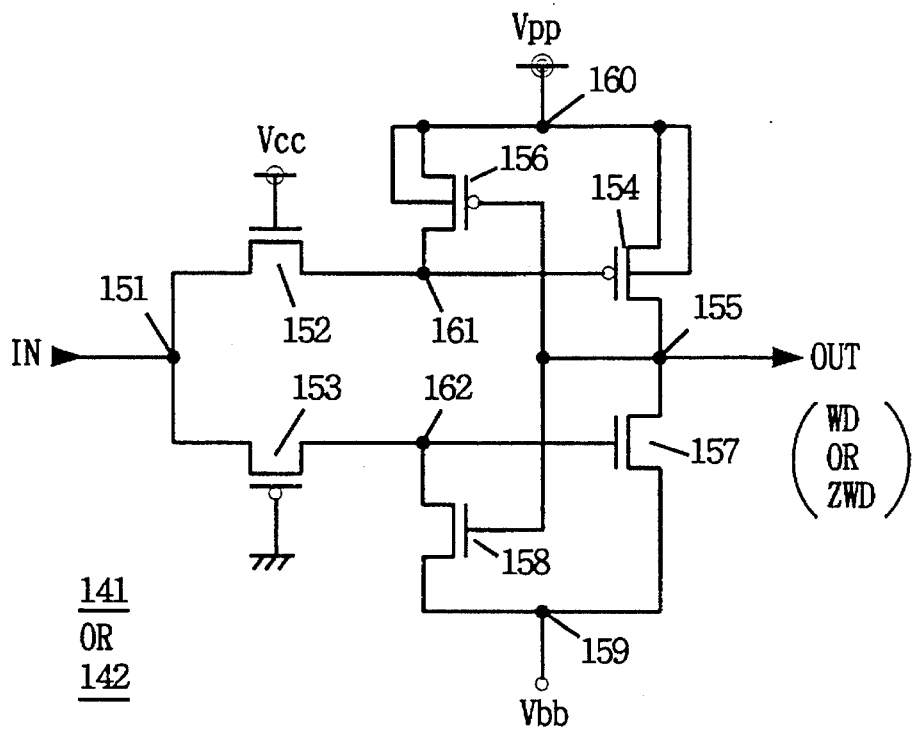
FIG. 16 shows an example of a structure of the level converter shown in FIG. 15.

In FIG. 16, level converter 141 (or 142) includes an n-channel MOS transistor 152 which transmits input IN applied to an input node 151 to a node 161, a p-channel MOS transistor 153 which transmits the potential on input node 151 to a node 162, a p-channel MOS transistor 154 which is responsive to the signal potential on node 161 to transmit high voltage Vpp applied to a power supply node 160 to an output node 155, a p-channel MOS transistor 156 which is responsive to the signal potential on output node 155 to transmit high voltage Vpp on power supply node 160 to node 161, an n-channel MOS transistor 157 which is responsive to the signal potential on node 162 to connect output node 155 to another power supply node 159, and an n-channel MOS transistor 158 which is turned on in response to the signal potential on output node 155 to connect node 162 to another power supply node 159. Another power supply node 159 is supplied with negative potential Vbb.

Power supply potential Vcc is applied to a gate of n-channel MOS transistor 152, and ground potential GND is applied to a gate of p-channel MOS transistor. MOS transistor 152 has a function of a decoupling transistor for decoupling node 161 from input node 151 when the potential of node 161 is at high voltage Vpp level. P-channel MOS transistor 153 has a function of a decoupling transistor for decoupling input node 151 from node 162 when node 162 attains negative potential Vbb. Signals WD and ZWD sent from level converters 141 and 142 have an amplitude of (Vpp–Vbb). The word driver, therefore, has a structure modified as shown in FIG. 17 for receiving high voltage Vpp.

Figure 17:
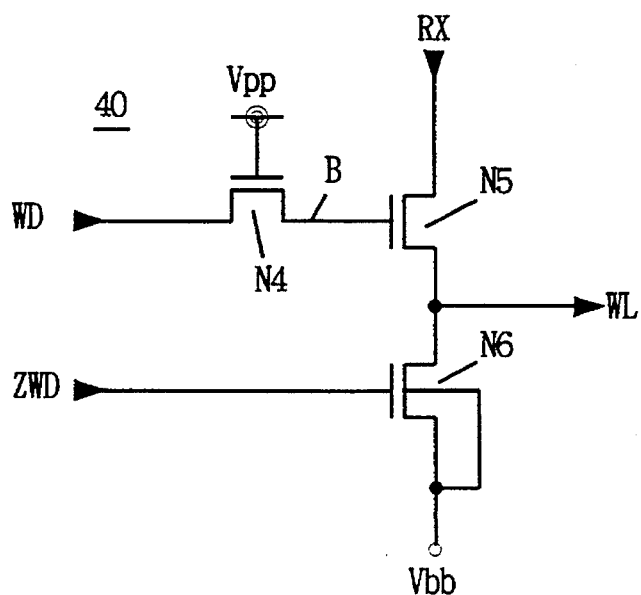
FIG. 17 shows an example of the structure of the word driver shown in FIG. 15.

FIG. 17 shows a structure of the word driver shown in FIG. 15. In FIG. 17, word driver 40 includes an n-channel MOS transistor N4 which receives high voltage Vpp on its gate and transmits output WD sent from level converter 141 to node B, an n-channel MOS transistor N5 which is responsive to the signal potential of node B to transmit word line drive signal RX onto word line WL, and an n-channel MOS transistor N6 which is responsive to output ZWD sent from level converter 142 to discharge word line WL to negative potential Vbb. Operation of the circuitry shown in FIGS. 15 to 17 will be described below.

When NAND decoder 20 shown in FIG. 15 is nonselected or in a standby state, its output is at the H-level of power supply potential Vcc level. In level converter 141, input IN is at power supply potential Vcc level, the potentials of nodes 161 and 162 have risen, so that n-channel MOS transistor 157 is on, and p-channel MOS transistor 154 is off. In this state, output node 155 is connected to another power supply node 159 via n-channel MOS transistor 157, and the potential of output node 155 is at negative potential Vbb level. When the potential of output node 155 is negative potential Vbb, n-channel MOS transistor 158 is off, and p-channel MOS transistor 156 is on. Therefore, node 161 is at high voltage Vpp level, and node 162 is at power supply potential Vcc level. Consequently, when input IN is at the H-level of power supply potential Vcc level, output WD of level converter 141 attains negative potential Vbb level.

When the output of NAND decoder 20 shown in FIG. 15 is at the L-level indicative of the selected state, nodes 161 and 162 in level converter circuit 141 shown in FIG. 16 are discharged to the ground potential level. In accordance with this discharging, MOS transistor 154 is turned on, and MOS transistor 157 is turned off, and output node 155 attains high voltage Vpp level. When the potential of output node 155 attains high voltage Vpp level, MOS transistor 156 is completely turned off, and node 161 holds the ground potential level. Meanwhile, in accordance with high voltage Vpp level of output node 155, MOS transistor 158 is turned on, and node 162 is set to negative potential Vbb level applied from another power supply node 159. When node 162 is at negative potential Vbb level, p-channel MOS transistor 153 is off. Thus, when input IN is at the L-level of ground potential GND level, output WD of level converter 141 is at high voltage Vpp level.

Level converter 142 receives the output of NAND decoder 20 via inverter 143 (see FIG. 15). Therefore, it outputs signal ZWD of logic complementary to that of output WD of level converter 141.

Outputs WD and ZWD of level converters 141 and 142 having the above structures shown in FIG. 16 are applied to word driver 40 shown in FIG. 17. When signal WD is at high voltage Vpp level, the potential of node B attains (Vpp–Vth) level. When word line drive signal RX is at high voltage Vpp level, the potential of node B rises to or above (Vpp+Vth) owing to the capacitive coupling between the gate and drain of MOS transistor N5. Thereby, high voltage Vpp is transmitted onto word line WL via MOS transistor N5. When word line drive signal RX is at negative potential Vbb level, MOS transistor N5 transmits word line drive signal RX at negative potential Vbb level onto word line WL. When signal WD is at high voltage Vpp level, signal ZWD is at negative potential Vbb level, and MOS transistor N6 is off.

When signal WD is at negative potential Vbb level, and signal ZWD is at high voltage Vpp level, the potential of node B is negative potential Vbb, and MOS transistor N5 maintains the off state regardless of the potential level of word line drive signal RX. Meanwhile, MOS transistor N6 is turned on, and word line WL is discharged to negative potential Vbb.

In the structure shown in FIG. 15, high voltage Vpp is transmitted to the gate of the MOS transistor for transmitting the word line drive signal in the word driver. Upon rise of word line drive signal RX, therefore, the potential of node B (gate of MOS transistor N5) can rise fast, and thus the potential of selected word line can rise fast. Even if the capacitance between the gate and drain of MOS transistor N5 is small, the gate potential of MOS transistor N5 can rise to or above (Vpp+Vth) level owing to the self-boost effect of MOS transistor N5.

[Modification 5 of Level Converter]

Figure 18:
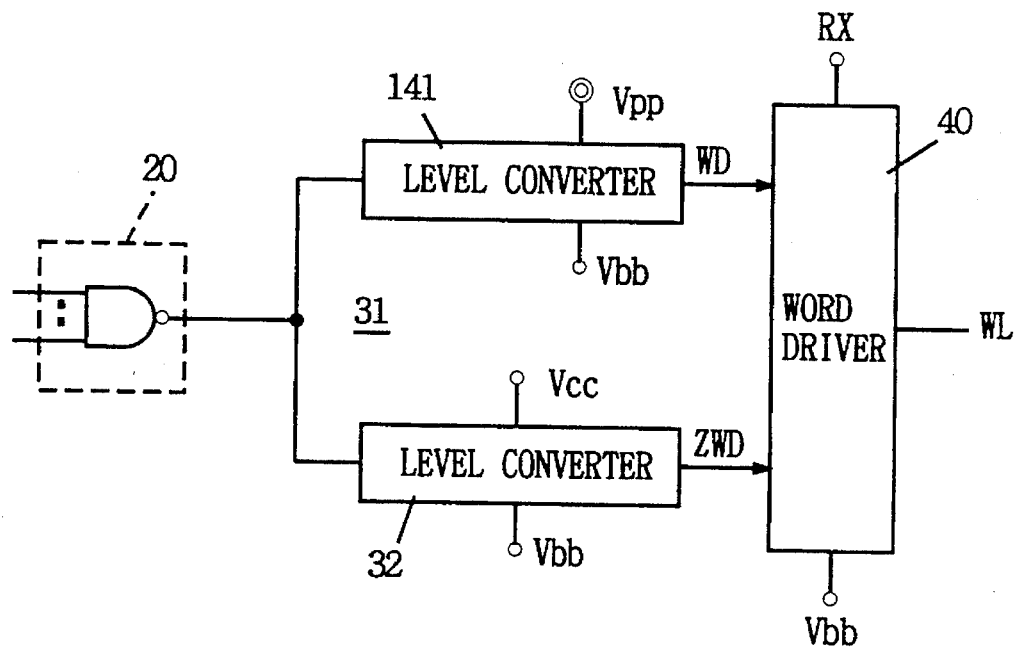
FIG. 18 shows a sixth modification of the level converter shown in FIG. 1.

FIG. 18 shows a structure of a fifth modification of the level converter. In FIG. 18, level converter 31 includes a level converter 141 which converts the output signal of row decoder 20 having an amplitude of (Vcc–GND) into a signal having an amplitude of (Vpp–Vbb), and a level converter 32 which converts the output signal of row decoder 20 having an amplitude of (Vcc–GND) into a signal having an amplitude of (Vcc–Vbb). Level converter 141 has the same structure as that shown in FIG. 16, and level converter 32 has the same structure as that shown in FIG. 5. Word driver 40 has the same structure as that shown in FIG. 17. In the word driver shown in FIG. 17, it is MOS transistor N5 for transmitting word line drive signal RX that requires the signal having binary levels of high voltage Vpp and negative potential Vbb. MOS transistor N6 for holding word line WL at negative potential Vbb can transmit negative potential Vbb to word line WL when it receives on its gate a signal at power supply potential Vcc level on its gate. Particularly, MOS transistor N6 does not require high voltage Vpp.

Therefore, as shown in FIG. 18, only the level converter producing signal WD contains the level converter structure which produces the signal having binary levels of high voltage Vpp and negative potential Vbb, and the level converter producing signal ZWD contains the level converter structure produces the signal having binary levels of power supply potential Vcc and negative potential Vbb. Circuits utilizing high voltage Vpp decrease in number, resulting in reduction of the power consumption.

[Modification 6 of Level Converter]

Figure 19:
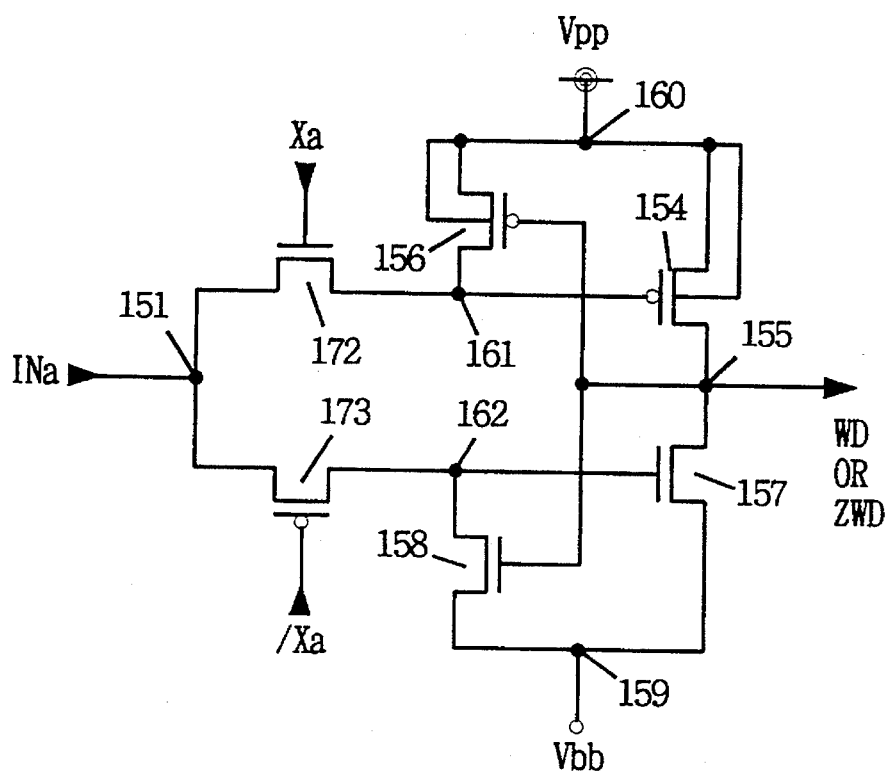
FIG. 19 shows a seventh modification of the level converter shown in FIG. 1.

FIG. 19 shows a sixth modification of the level converter. The level converter shown in FIG. 19 differs from the level converter shown in FIG. 16 in that MOS transistors 172 and 173 arranged at the input portion receive address signals Xa and /Xa, respectively. Structures other than the above are the same as those of the level converter shown in FIG. 16, and the corresponding portions bear the same reference numerals.

In the selected state, the output of NAND decoder 20 is at the L-level of the ground potential level, address signal Xa is at the H-level of power supply potential Vcc level, and address signal /XA is at the L-level of ground potential level. In this state, MOS transistors 172 and 173 are on, the potential levels of nodes 161 and 162 are at the ground potential level and negative potential Vbb level, respectively, as is done in the level converter in FIG. 16, and output WD or ZWD sent from output node 155 is at high potential Vpp level. Upon completion of the memory cycle, input IN attains the H-level of nonselected state, and both the potentials of nodes 161 and 162 rise. Thereby, MOS transistor 154 is turned off, and MOS transistor 157 is turned on, and output node 155 is discharged to negative potential Vbb level. In accordance with potential lowering of output node 155, MOS transistor 156 is turned off, and the potential of node 161 rises fast up to high potential Vpp level and thus surely turns off MOS transistor 154. In accordance with potential lowering of output node 155, MOS transistor 158 is turned off, output node 162 maintains the H-level (power supply potential Vcc level), and output node 155 is ultimately discharged down to negative potential Vbb level.

Thereafter, complementary address signals Xa and /Xa are set to the L-level and H-level indicative of the nonselected state, respectively, and both MOS transistors 172 and 173 are turned off.

In the nonselected state, the output of row decoder 20 is at the L-level, address signal Xa is at the L-level, and address signal /Xa is at the H-level. In this state, MOS transistors 172 and 173 are off as in the standby state. When the output of row decoder 20 is at the H-level of power supply potential Vcc level, and address signals Xa and /Xa are at power supply potential Vcc level and ground potential level, respectively, the potentials of nodes 161 and 162 are similar to those in the standby state even if MOS transistors 172 and 173 are turned on.

As shown in FIG. 19, owing to provision of the address decoding function at the level converter, the scale of the row decode circuit can be reduced as already described with reference to FIGS. 13 and 14.

During standby, when the output of NAND decoder 20 is at the H-level of power supply potential Vcc level, output WD of the level converter shown in FIG. 19 is at negative potential Vbb level indicative of the nonselected state regardless of the level of address signals Xa and /Xa.

According to the structure of the level converter shown in FIG. 19, the scale of row decode circuit can be significantly reduced.

The structure for providing the address decoding function in the level converter can also be applied to the structure shown in FIG. 18. This can be achieved by using the level converter shown in FIG. 19 as level converter 141 shown in FIG. 18, and using the level converter shown in FIG. 12 as level converter 32 shown in FIG. 18.

[Modification 7]

Figure 20:
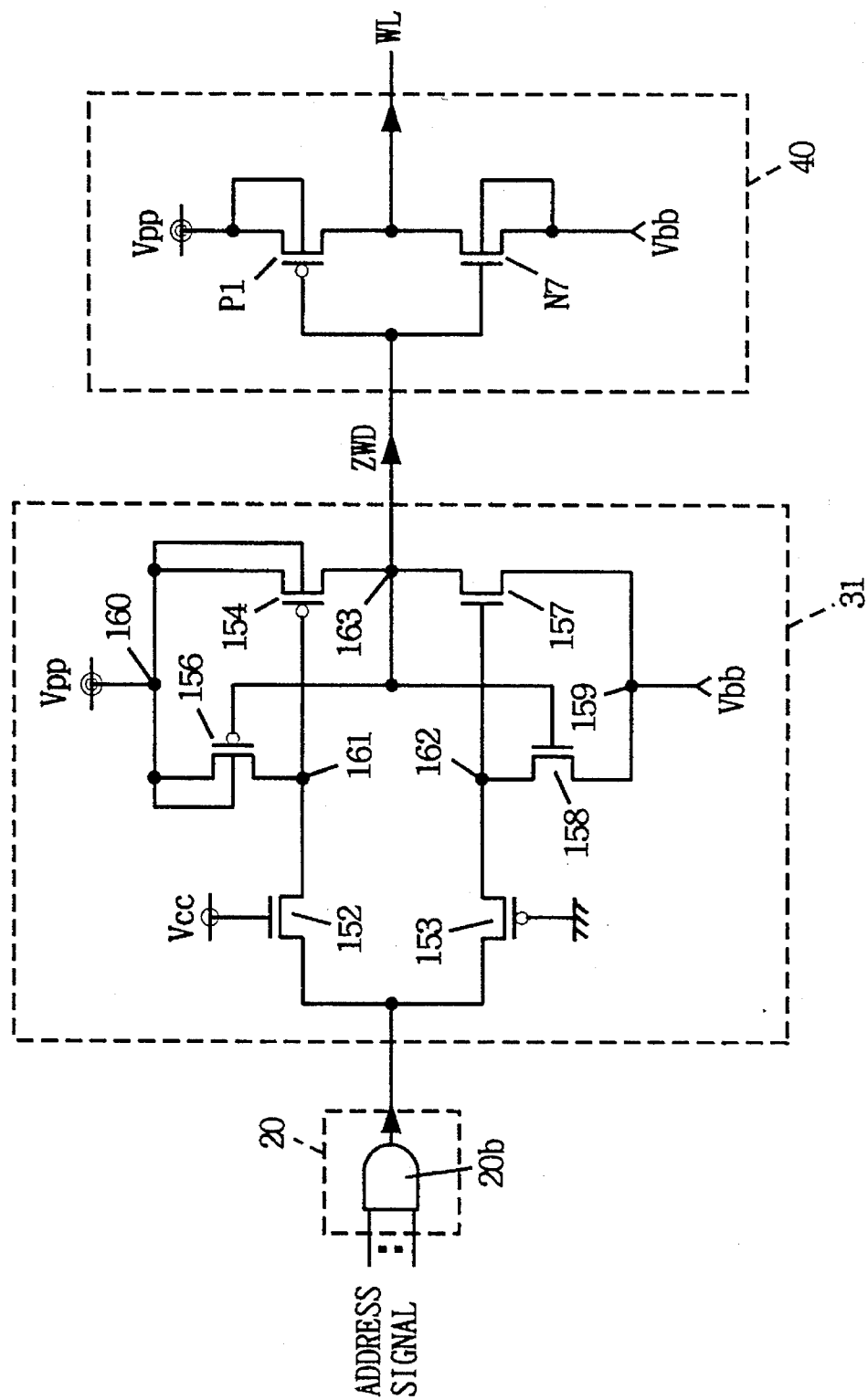
FIG. 20 shows a structure of a main portion of the seventh modification of the first embodiment of the invention.

FIG. 20 shows a seventh modification of the first embodiment of the invention. In the structure shown in FIG. 20, row decoder 20 includes an AND decoder 20b. Thus, row decoder 20 outputs a signal at the H-level of power supply potential Vcc level when selected.

Level converter 31 converts the H-level of power supply potential Vcc level of AND decoder 20b and L-level of ground potential into high potential Vpp level and negative potential Vbb level. The structure of the level converter 31 is the same as that of the level converter shown in FIG. 6, and the corresponding portions bear the same reference numerals.

Word driver 40 has a structure of a CMOS inverter which operates using high potential Vpp and negative potential Vbb as the operation power supply potentials. More specifically, word driver 40 includes a p-channel MOS transistor P1 which is turned on to transmit high potential Vpp onto word line WL when output ZWD of level converter 31 is at the L-level, and an n-channel MOS transistor N7 which is turned on to transmit negative potential Vbb to word line WL when output ZWD of level converter 31 is at the H-level. Operation will now be briefly described below.

During standby or nonselected state, the output of AND decoder 20b is at the L-level of ground potential GND level. In this state, level converter 31 has the potentials of nodes 161 and 162 are at the ground potential level and negative potential Vbb level, respectively, and output ZWD is at high potential Vpp level. In word driver 40, p-channel MOS transistor P1 is turned off in response to signal ZWD at high potential Vpp level sent from level converter 31, and also n-channel MOS transistor N7 is turned on, so that word line is held at negative potential Vbb level.

When the output of AND decoder 20b attains the H-level of power supply potential Vcc level indicative of the selected state, nodes 161 and 162 in level converter 31 are set to high potential Vpp level and power supply potential Vcc level, respectively. Therefore, output ZWD of level converter 31 attains negative potential Vbb level. In word driver 40, MOS transistor P1 is turned on in accordance with signal ZWD of negative potential Vbb level, and MOS transistor N7 is turned off, so that high potential Vpp is transmitted onto word line WL via turned-on MOS transistor P1.

Also in the structure shown in FIG. 20, in which the row decode circuit (row decoder 20) completely decodes the address signal and level converter 31 generates the signal specifying one word line in the memory cell array, the nonselected word line is held at the negative potential, and the channel leak of electric charges in the memory cell can be surely suppressed.

[Modification 8]

Figure 21:
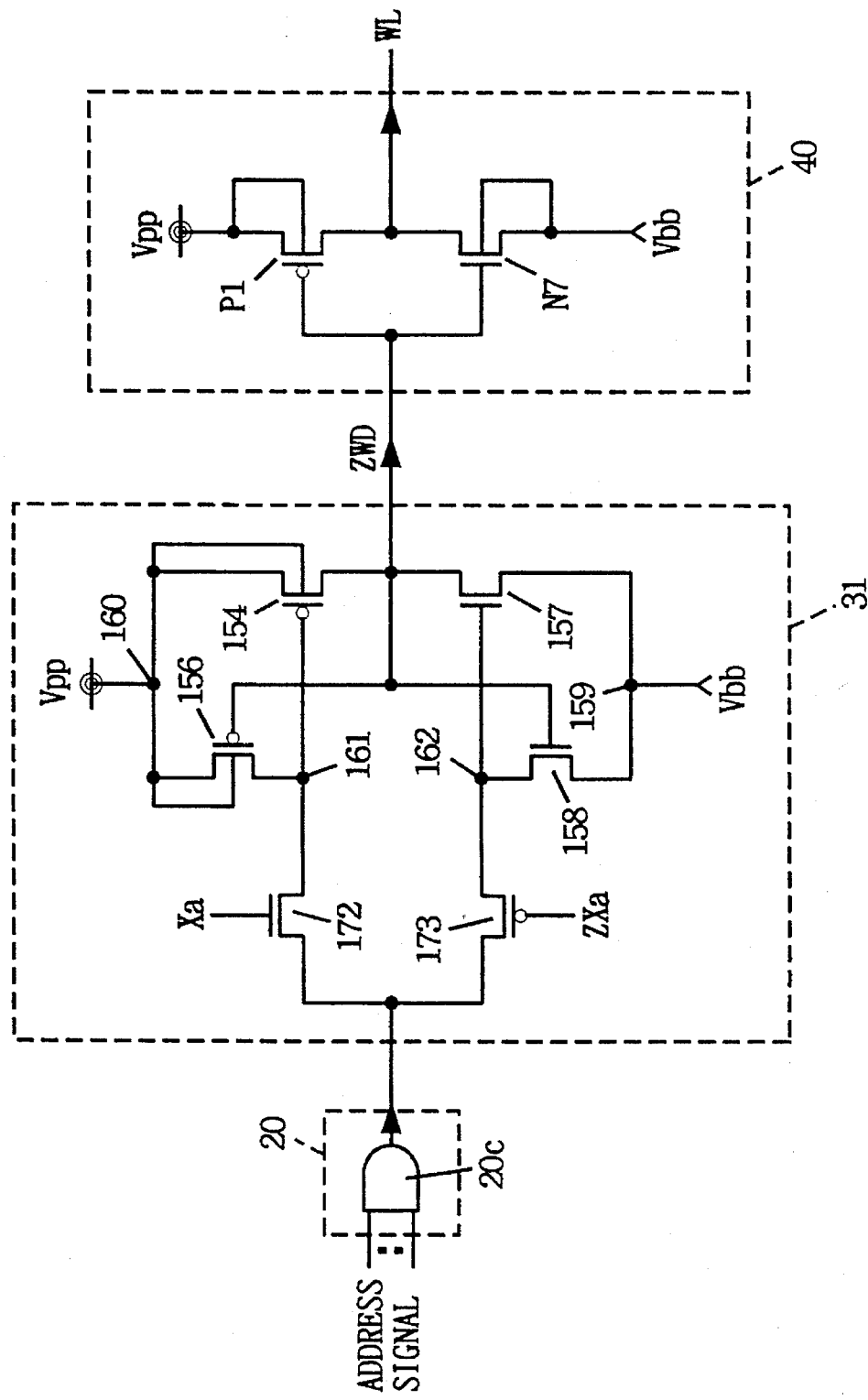
FIG. 21 shows a structure of an eighth modification of the first embodiment of the invention.

FIG. 21 shows a structure of an eighth modification of the first embodiment of the invention. In FIG. 21, level converter 31 includes at its input portion an n-channel MOS transistor 172 and a p-channel MOS transistor 173 receiving address signals Xa and /Xa on their gates, respectively, which structure is the difference from the structure shown in FIG. 20.

Row decoder 20 is formed of an AND circuit decoder 20c. Since level converter 31 has the function of decoding the address, a scale of AND decoder 20c is smaller than that of AND decoder 20b shown in FIG. 20.

When decoder 20c is selected, its outputs attains the H-level of power supply potential Vcc level. When address signals Xa and /Xa are at the H-level of power supply potential Vcc level and the L-level of ground potential GND level, respectively, nodes 161 and 162 of level converter 31 attain the high potential Vpp level and power supply potential Vcc level, and signal ZWD attains negative potential Vbb level. Thereby, word driver 40 transmits the signal at high potential Vpp level onto word line WL.

When address signals Xa and /Xa are at the L-level of ground potential GND level and the H-level of power supply potential Vcc level, respectively, both MOS transistors 172 and 173 are off. In this state, nodes 161 and 162 of level converter 31 maintain the last states. When the last cycle in which signal ZWD was set to negative potential Vbb level is completed, and the output of decoder 20c is set to the L-level of ground potential level, nodes 161 and 162 of level converter 31 are set to the ground potential level and negative potential Vbb level, respectively. Therefore, in the nonselected state including the standby state, signal ZWD maintains high potential Vpp level regardless of the state (i.e., on or off) of MOS transistors 172 and 173. When signal ZWD is at high potential Vpp level, word line WD is maintained at negative potential Vbb level by MOS transistor N7 in word driver 40.

In the structure shown in FIG. 21, since level converter 31 has the address decoding function, it is possible to reduce the bit number of the address signal applied to the row decode circuit, and thus it is possible to reduce the number and scale of the decoders included in the row decode circuit, so that the scale of row decode circuit can be significantly reduced.

[Second Embodiment]

Figure 22:
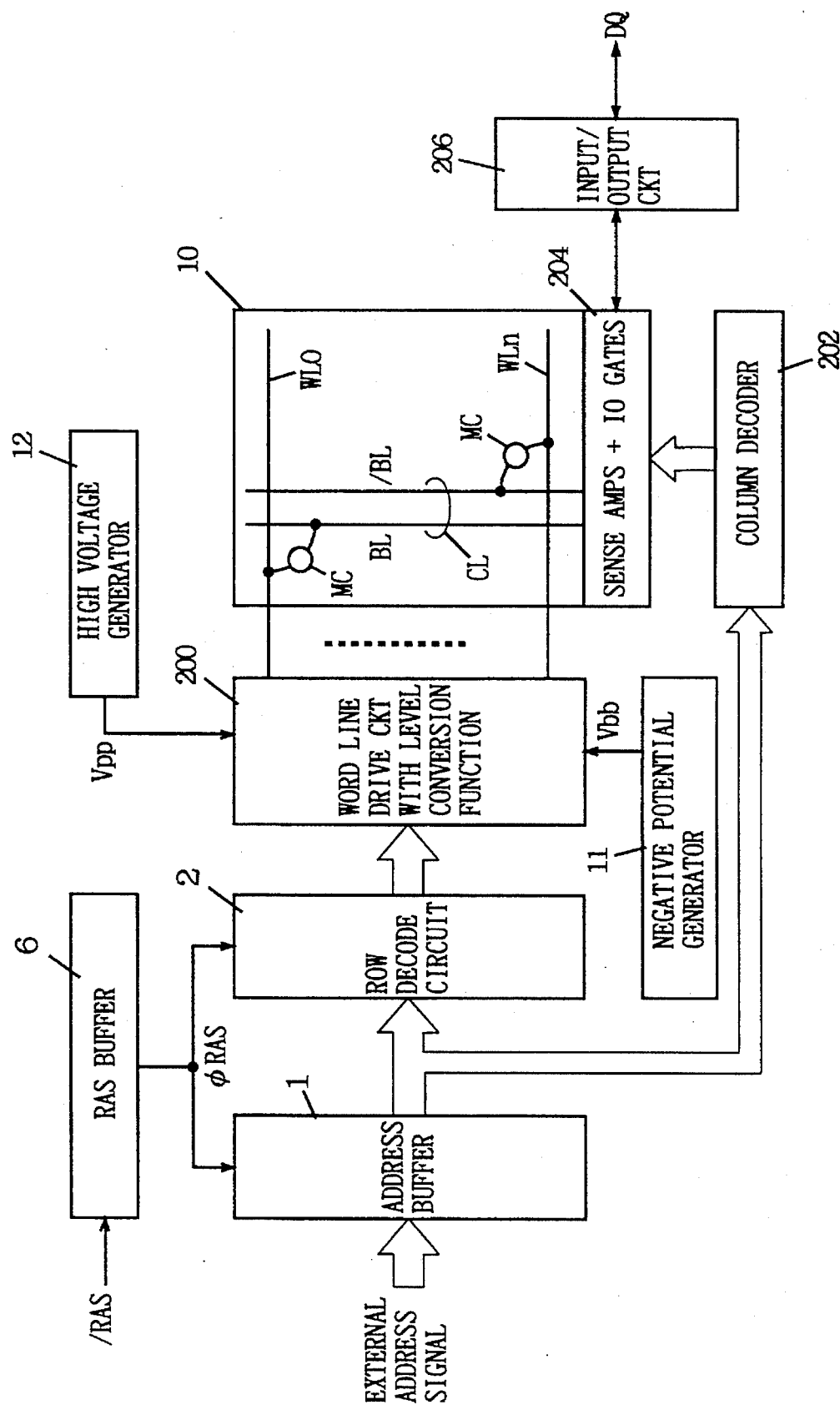
FIG. 22 schematically shows a whole structure of a semiconductor memory device according to a second embodiment of the invention.

FIG. 22 schematically shows an overall structure of a DRAM according to the second embodiment of the invention. The DRAM includes memory cell array 10 which includes memory cells MC arranged in a matrix of rows and columns, an address buffer 1 which receives an externally applied address signal and generates an internal address signal, and row decode circuit 2 which decodes the address signal sent from address buffer 1 to generate a signal specifying a corresponding row in memory cell array 10. In memory cell array 10, word lines WL are arranged corresponding to the respective rows of memory cells MC, and column lines CL are arranged corresponding to the respective columns of memory cells. In FIG. 22, there are representatively shown (n+1) word lines WL0–WLn and one column line CL. Column line CL is formed of a pair of bit lines BL and /BL.

Address buffer 1 and row decode circuit 2 operate in accordance with the timings determined by the output of RAS buffer 6b receiving signal /RAS. When internal RAS signal φRAS sent from RAS buffer 6 becomes active, address buffer 1 takes in the externally applied address signal to generate the internal address signal. In accordance with active internal RAS signal φRAS, row decode circuit 2 decodes the internal address signal sent from address buffer 1 and generates a signal specifying one word line (in the case where data input/output is performed on a bit-by-bit basis) in memory cell array 10.

The output of row decode circuit 2 is applied to a word line drive circuit 200 having a level converting function. Word line drive circuit 200 having the level converting function includes drivers provided corresponding to word lines WL0–WLn of memory cell array 10 respectively, and converts the signal of an amplitude of (Vcc–GND) sent from row decode circuit 2 into a signal of an amplitude of (Vpp–Vbb) to transmit the same onto the corresponding word line. The structure for the above operation will be specifically described later. The word line drive circuit 200 having the level converting function receives high voltage Vpp from high voltage generating circuit 12 and also receives negative potential Vbb from negative potential generating circuit 11.

The DRAM further includes, as peripheral circuitry, sense amplifier amplifying signals on column lines CL in memory cell array 10, and I/O gates which select and connect the corresponding column lines in memory cell array 10 to an I/O circuit 206 in accordance with a column select signal sent from a column decoder 202. The sense amplifiers and I/O gates are represented by one block 204. Column decoder 202 is activated in response to an internal CAS signal sent from a CAS buffer (not shown), and decodes the address signal sent from address buffer 1 to generate a signal specifying the corresponding column in memory cell array 10.

In the structure shown in FIG. 22, the word line drive circuit 200 having the level converting function can have a significantly reduced circuit scale owing to the structure in which the word line drive circuit itself has the function of converting the signal of an amplitude of (Vcc–GND) into the signal of an amplitude of (Vpp–Vbb), as will be specifically described later.

Figure 23:
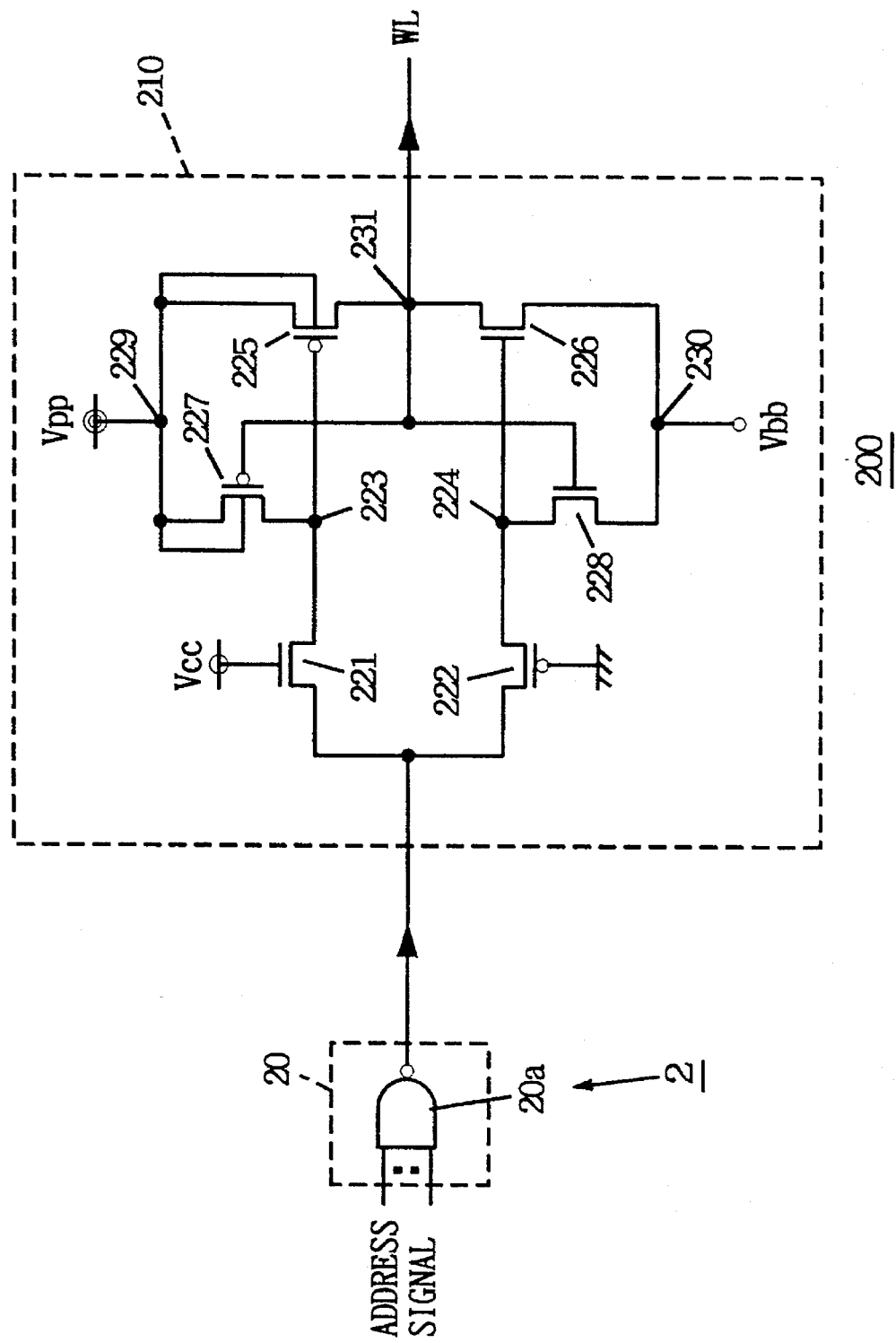
FIG. 23 shows a structure of a word line drive circuit with a level converting function shown in FIG. 22.

FIG. 23 shows a specific structure of the word line drive circuit having the level converting function. In FIG. 23, the word line drive circuit 200 having the level converting function includes a word line driver 210 provided corresponding to each word line WL. Corresponding to word line driver 210, there is provided row decoder 20 in row decode circuit 2. Row decoder 20 has a structure of a NAND decoder 20a. NAND decoder 20a outputs a signal at the L-level of ground potential GND level when selected. NAND decoder 20a outputs a signal specifying one word line.

Word line driver 210 includes an n-channel MOS transistor 212 which receives power supply potential Vcc on its gate and transmits the output of decoder 20 (20a) to a node 223, a p-channel MOS transistor 222 which receives ground potential GND on its gate to transmit the output of decoder 20 (20a) to a node 224, a p-channel MOS transistor 225 which is responsive to the potential on node 223 to transmit high voltage Vpp applied to a power supply node 229 to an output node 231, an n-channel MOS transistor 226 which is responsive to the potential of node 224 to transmit negative potential Vbb applied to another power supply node 230 to an output node 231, a p-channel MOS transistor 227 which is responsive to the signal potential of output node 231 to transmit high voltage Vpp applied to power supply node 229 to node 223, and an n-channel MOS transistor 228 which is responsive to the signal potential of output node 231 to transmit negative potential Vbb applied to another power supply node 230 to node 224.

The structure itself of word line driver 210 shown in FIG. 23 is the same as that of level converter 31 shown in FIG. 20. More specifically, when NAND decoder 20a outputs a signal at the ground potential level indicative of the selected state, in word driver 210 the potential of node 223 attains the ground potential level, the potential of node 224 attains negative potential Vbb level, and output node 231 receives high voltage Vpp via MOS transistor 225.

NAND decoder 20a outputs a signal at power supply potential Vcc level when nonselected (or in the standby state). In word line driver 210, when the potentials of nodes 223 and 224 rise, MOS transistor 225 is turned off, and MOS transistor 226 is turned on. This lowers the potential of output node 231. When output node 231 is discharged by MOS transistor 226 to attain the potential at negative potential Vbb level, MOS transistor 227 is turned on to transmit high voltage Vpp to node 223, so that MOS transistor 225 is turned off. MOS transistor 228 is turned off, and node 224 maintains power supply potential Vcc level applied from NAND decoder 20a. Thereby, a signal at negative potential Vbb level is transmitted to the nonselected word line from output node 231.

As can be seen from comparison with the structure shown in FIG. 20, in the structure of the second embodiment shown in FIG. 23 the word line is directly driven by the circuit performing the level conversion of the output of row decoder, and the shown arrangement does not require a word driver having the structure of the CMOS inverter shown in FIG. 20. Therefore, it is possible to reduce a scale of the circuitry performing the level conversion and word line driving. Since the potential of nonselected word line is maintained at negative potential Vbb level, generation of channel leak of electric charges in the memory cell transistor can be surely suppressed.

[Modification 1]

Figure 24:
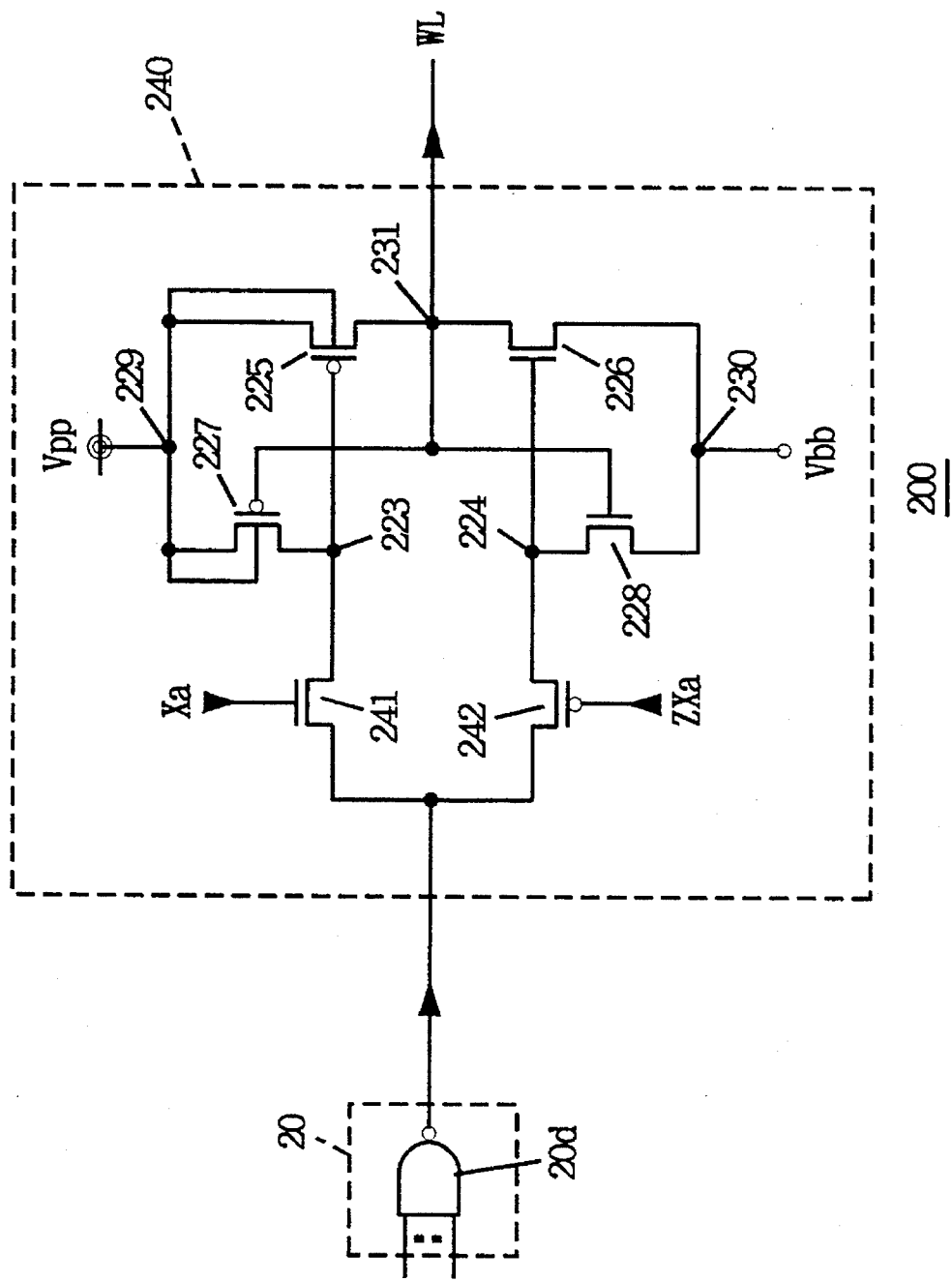
FIG. 24 shows a first modification of the word line drive circuit with the level converting function shown in FIG. 22.

FIG. 24 shows a structure of a main portion of a first modification of the second embodiment of the invention. In FIG. 24, there are shown only a word line driver 240 included in word line drive circuit 200 having the level converting function as well as row decoder 20 provided corresponding to word line driver 240.

Row decoder 20 includes an NAND decoder 20d. Word line driver 240 differs from word line driver 210 shown in FIG. 23 in that MOS transistors 241 and 242 arranged at the input stage receive on their gates address signals Xa and /Xa, respectively. Structures other than the above are the same, and corresponding portions bear the same reference numerals.

Operation itself of word line driver 240 shown in FIG. 24 is the same as that of level converter 31 shown in FIG. 21 except for the followings. The level converter shown in FIG. 21 outputs signal ZWD, while word line driver 240 shown in FIG. 24 transmits high voltage Vpp or negative potential Vbb onto word line WL in accordance with the output of row decoder 20 and address signals Xa and /Xa. When the potential of output node 231 is at high voltage Vpp level, MOS transistor 228 is on, node 224 is at negative potential Vbb level, and MOS transistor 226 is off. Meanwhile, when the potential of output node 231 is at negative potential Vbb level, MOS transistor 228 is off, and MOS transistor 227 is on, so that MOS transistor 225 is off. Word line driver 240 has a structure of so-called "half latch". Thereby, word line WL can be stably set to high potential Vpp or negative potential Vbb.

Address signals Xa and /Xa have mutually complementary logics. When the output of row decoder 20 is at the L-level, and address signal Xa is at the H-level, word line driver 240 transmits high voltage Vpp from output node 231 onto word line WL. When the output of row decoder 20 is at the H-level and/or address signal Xa is at the L-level, each node potential of word line driver 240 is the same as that in the standby state, and output node 231 transmits negative potential Vbb onto corresponding word line WL. According to the structure shown in FIG. 24, since the word line driver has the address decoding function, the number of address signals decoded by the row decode circuit (row decoder 20) can be reduced. Therefore, the number of the row decoders included in the row decode circuit and the circuit scale can be reduced.

[Third Embodiment]

Figure 25:
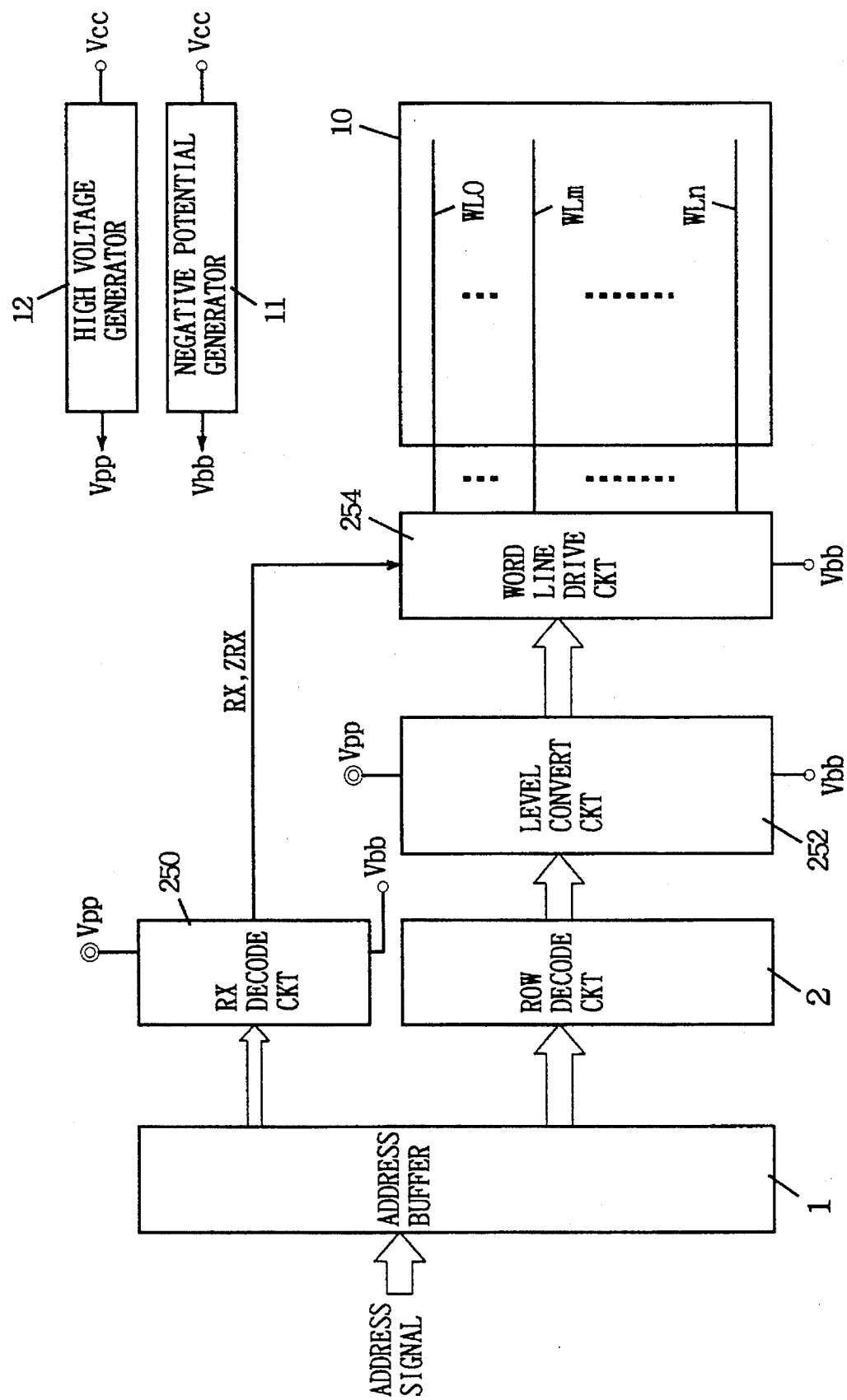
FIG. 25 schematically shows a whole structure of the semiconductor memory device according to a third embodiment of the invention.

FIG. 25 schematically shows a structure of a main portion of a DRAM according to a third embodiment of the invention. In FIG. 25, there is shown a structure of only circuitry related to row selection. In FIG. 25, DRAM includes row decode circuit 2 which decodes the internal address signal sent from address buffer 1 to produce a word line group specifying signal for specifying a group including a predetermined number of word lines in memory cell array 10, an RX decode circuit 250 which produces signals RX and ZRX for specifying a specific word line in the word line group specified by the word line group specifying signal, a level converting circuit 252 which converts a signal of an amplitude of (Vcc–GND) sent from row decode circuit 2 into a signal of an amplitude of (Vpp–Vbb), and a word line drive circuit 254 which is responsive to the output of level converter circuit 252 to transmit signal RX sent from RX decode circuit 250 or negative potential Vbb onto word line WL (WL0–WLn) in memory cell array 10.

RX decode circuit 250 produces a signal of an amplitude of (Vpp–Vbb) as will be described below. Signals RX and ZRX have mutually complementary logics.

Figure 26:
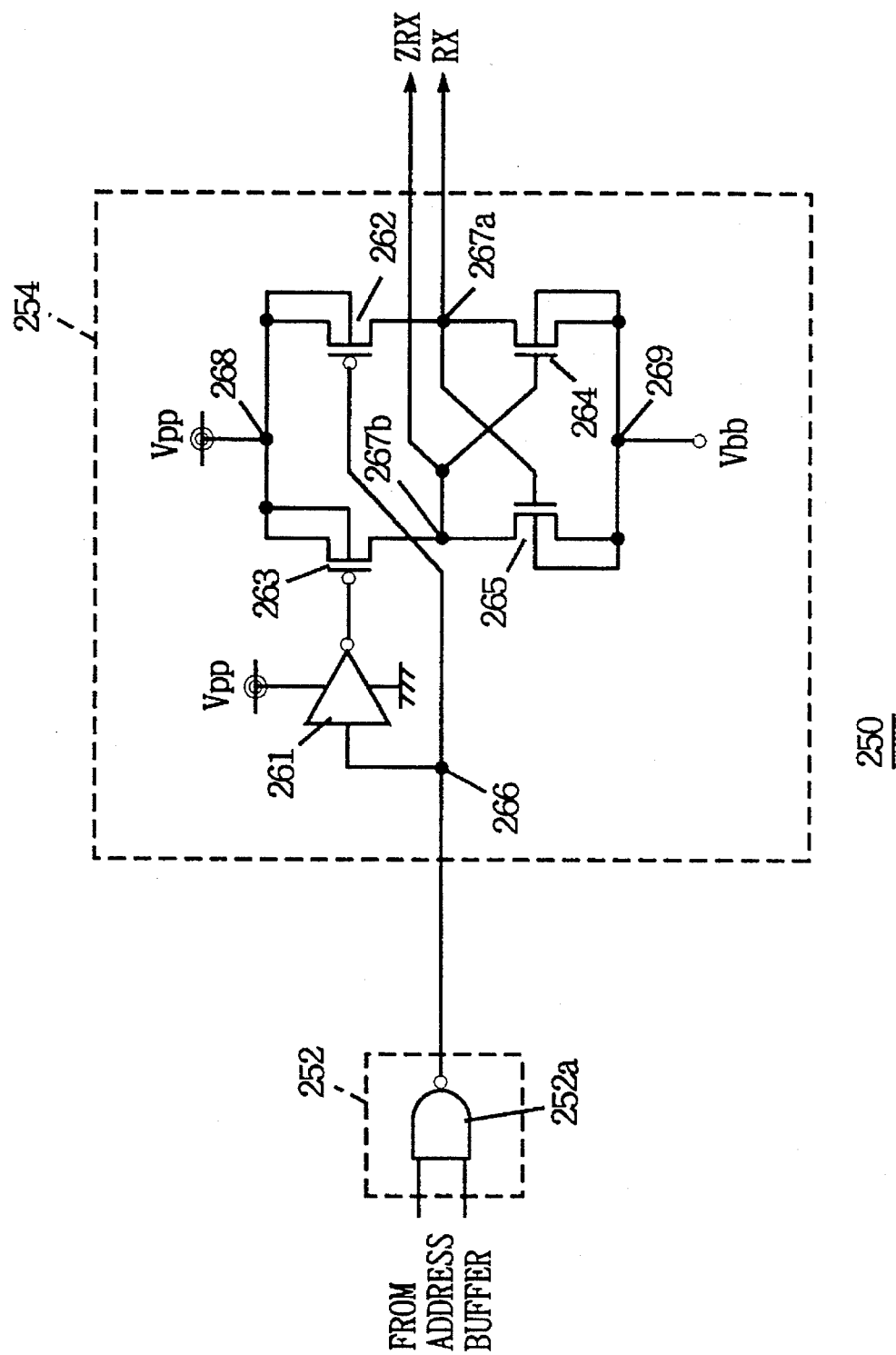
FIG. 26 shows an example of a structure of an RX decode circuit shown in FIG. 25.

FIG. 26 shows an example of the structure of RX decode circuit shown in FIG. 25. In FIG. 26, there is shown a structure of only a portion related to one signal RX and one signal ZRX. If the word line group specifying signal sent from row decode circuit 2 is to specify, e.g., four word lines, there are provided four structures, each being the same as that shown in FIG. 26.

In FIG. 26, RX decode circuit 250 includes a decode portion 252 which decodes the internal address signal sent from address buffer 1, and a level converter 254 which converts a signal of an amplitude of (Vcc–GND) sent from decode portion 252 into a signal of (Vpp–Vbb) and generates signals RX and ZRX having mutually complementary logics. Decode portion 252 is formed of an NAND decoder 252a.

Level converter 254 includes an inverter 261 which inverts the output of an amplitude of (Vcc–GND) of decode portion 252 applied to a node 266 and thereby produces a signal of an amplitude of (GND–Vpp), a p-channel MOS transistor 262 which is responsive to the potential of node 266 to transmit high voltage Vpp applied to power supply node 268 to an output node 267a, a p-channel MOS transistor 263 which is responsive to the output of inverter 261 to transmit high voltage Vpp received on a power supply node 268 to an inverted output node 267b, an n-channel MOS transistor 265 which is responsive to the signal potential of output node 267a to transmit negative potential Vbb received on another power supply node 269 to inverted output node 267b, and an n-channel MOS transistor 264 which is responsive to the potential of inverted output node 267b to transmit negative potential Vbb received on another power supply node 269 to output node 267a.

The structure of level converter 254 shown in FIG. 26 is the same as that of the level converter shown in FIG. 4, and operates in a similar manner. More specifically, when decoding portion 252 applies the output at the ground potential level to node 266, output node 267a is charged up to high voltage Vpp level by p-channel MOS transistor 262, and inverted output node 267b is discharged down to negative potential Vbb level by n-channel MOS transistor 265. Output node 267a outputs signal RX at high voltage Vpp level, and inverted output node 267b outputs signal ZRX at negative potential Vbb level.

When the potential of input node 266 is at power supply potential Vcc level, inverted output node 267b is charged up to high voltage Vpp level by p-channel MOS transistor 263, and output node 267a is discharged down to negative potential Vbb level by n-channel MOS transistor 264. In this case, therefore, signal ZRX at high voltage Vpp level and signal RX at negative potential Vbb level are output.

Figure 27:
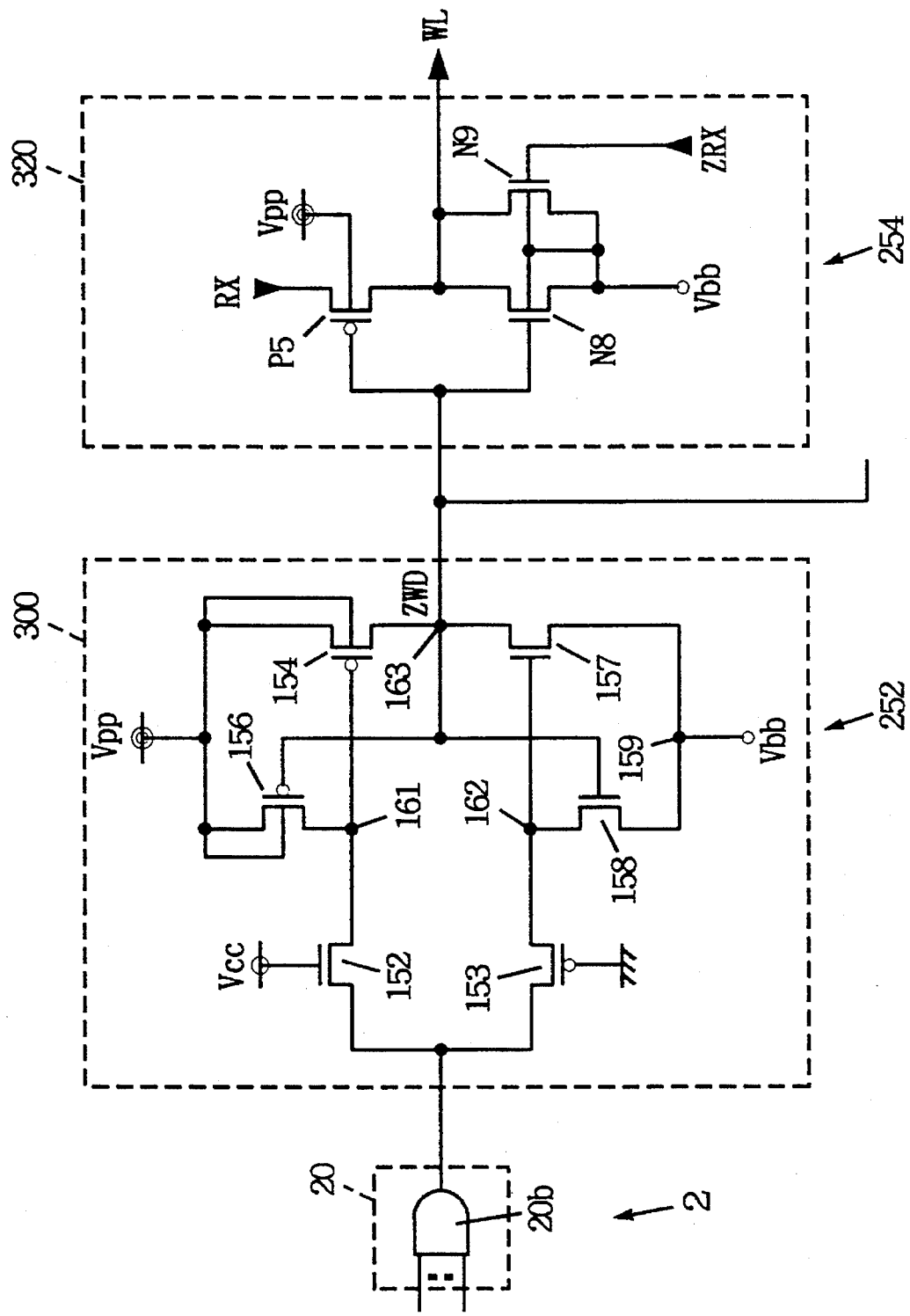
FIG. 27 shows an example of structures of a level converting circuit and a word line drive circuit shown in FIG. 25.

FIG. 27 shows structures of the row decode circuit, level converter circuit and word line drive circuit shown in FIG. 25. In FIG. 27, there is shown a structure of a portion for selecting one word line WL.

In FIG. 27, row decode circuit 2 includes row decoder 20 generating the word line group specifying signal. Row decoder 20 is formed of AND decoder 20b.

Level converter circuit 252 includes a level converter 300 provided corresponding to row decoder 20. Level converter 300 has the same structure as the level converter 31 shown in FIG. 20. Corresponding portions bear the same reference numerals.

Word line drive circuit 254 includes a word driver 320 provided corresponding to each word line WL. The plurality of word drivers 320 are provided for one level converter 300. Word driver 320 includes a p-channel MOS transistor P5 which is responsive to output ZWD of level converter 300 to transmit signal RX onto corresponding word line WL, an n-channel MOS transistor N8 which is responsive to signal ZWD sent from level converter 300 to transmit negative potential Vbb to word line WL, and an n-channel MOS transistor N9 which is responsive to inverted signal ZRX to transmit negative potential Vbb to word line WL. The substrate of p-channel MOS transistor P5 receives high voltage Vpp. Signal RX and word line WL change between high voltage Vpp and negative potential Vbb so as to prevent reverse biasing of a PN junction in MOS transistor P5 (i.E., junction between an impurity region and a substrate region). Negative potential Vbb is applied to substrate regions of n-channel MOS transistors N8 and N9. Operation will now be described below.

Operation of row decoder 20 and level converter 300 is the same as that previously descibed with reference to FIG. 20. When the output of AND decoder 20b is at the H-level (Vcc level) indicative of the selected state, level converter 300 outputs signal ZWD at negative potential Vbb level. When the output of AND decoder 20b is at the L-level (ground potential level) indicative of the nonselected state, signal ZWD sent from level converter 300 is at high voltage Vpp level.

When signal ZWD sent from level converter 300 is at high voltage Vpp level, p-channel MOS transistor P5 is off, n-channel MOS transistor N8 is on, and word line WL is set to negative potential Vbb by MOS transistor N8.

When signal ZWD is at negative potential Vbb level, MOS transistor N8 is off, and p-channel MOS transistor P5 is on. When signal RX is at high voltage Vpp level, inverted signal ZRX is at negative potential Vbb level, and MOS transistor N9 is off. Word line WL receives signal RX at high voltage Vpp level from MOS transistor T5 to raise its potential to high voltage Vpp level.

When signal ZWD is at negative potential Vbb level and signal RX is at negative potential Vbb level, the signal RX at negative potential Vbb level is transmitted onto word line WL via MOS transistor P5. Assuming that MOS transistor P5 has the threshold voltage of Vthp, MOS transistor P5 transmits the potential of (Vbb+|Vthp|) onto word line WL. Thus, word line WL is set to the level of (Vbb+|Vthp|) by MOS transistor P5. When signal RX is at negative potential Vbb level, inverted signal ZRX is at high voltage Vpp level. Therefore, MOS transistor N9 is on, and surely sets the potential of this word line WL to negative potential Vbb level. By utilizing word driver 320 shown in FIG. 27, the potential of nonselected word line WL can be surely held at negative potential Vbb level, so that generation of channel leak at the transistor included in the memory cell can be suppressed, and "disturb refresh" characteristics can be improved.

[Modification 1]

Figure 28:
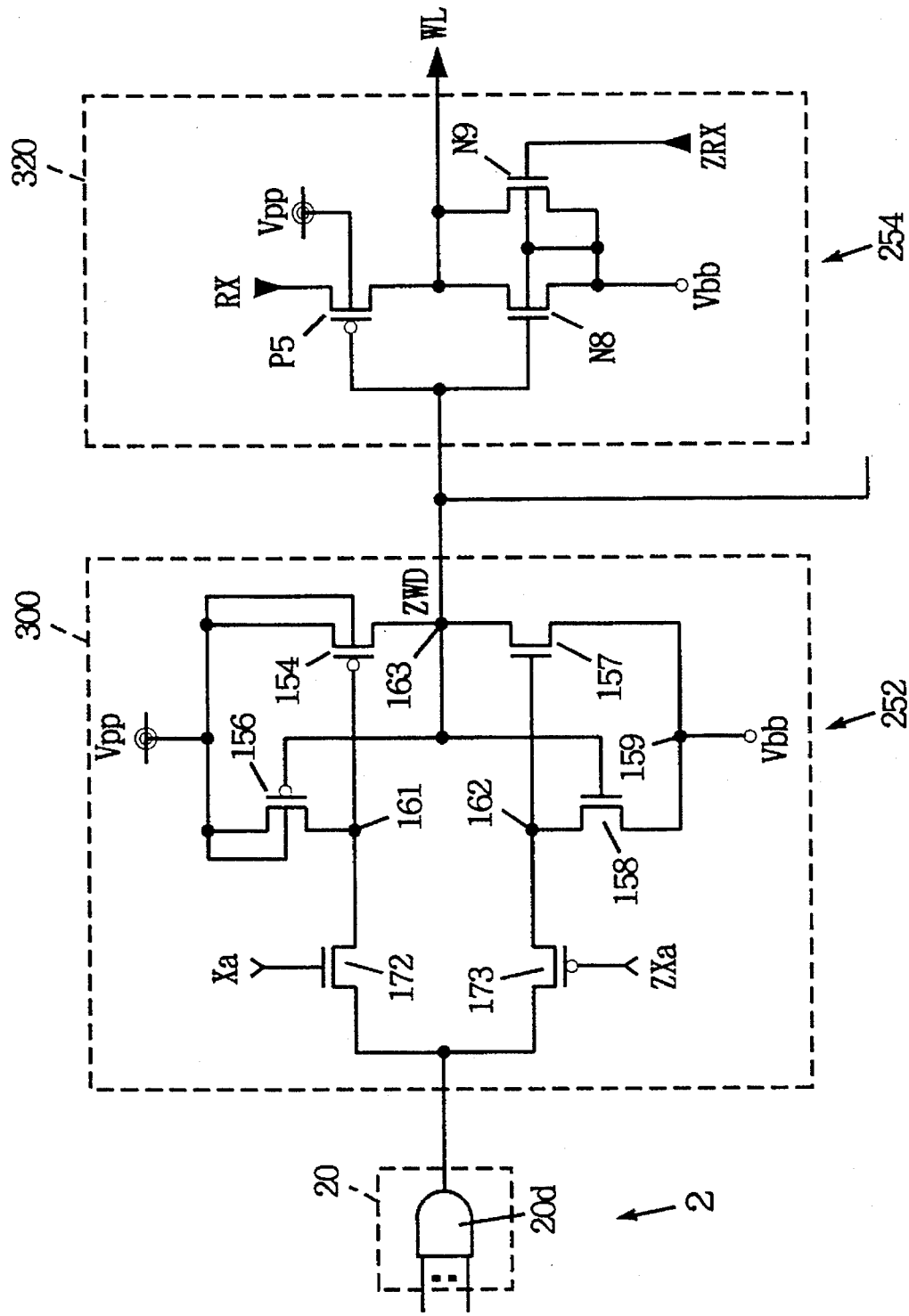
FIG. 28 shows structures of a first modification of the level converting circuit and the word line drive circuit shown in FIG. 25.

FIG. 28 shows a first modification of the third embodiment of the invention. In the structure shown in FIG. 28, MOS transistors 172 and 173 arranged at the input portion of level converter 300 receive address signal Xa and inverted address signal ZXa on their gates, respectively. Structures other than the above are the same as those shown in FIG. 27. Corresponding portions bear the same reference numerals.

The structure of level converter 300 shown in FIG. 28 is the substantially same as that of level converter 31 shown in FIG. 21. Since level converter 300 has the address decoding function, the number and scale of row decoders 20 (AND decoders 20d) included in row decode circuit 2 can be reduced.

[Fourth Embodiment]

Figure 29:
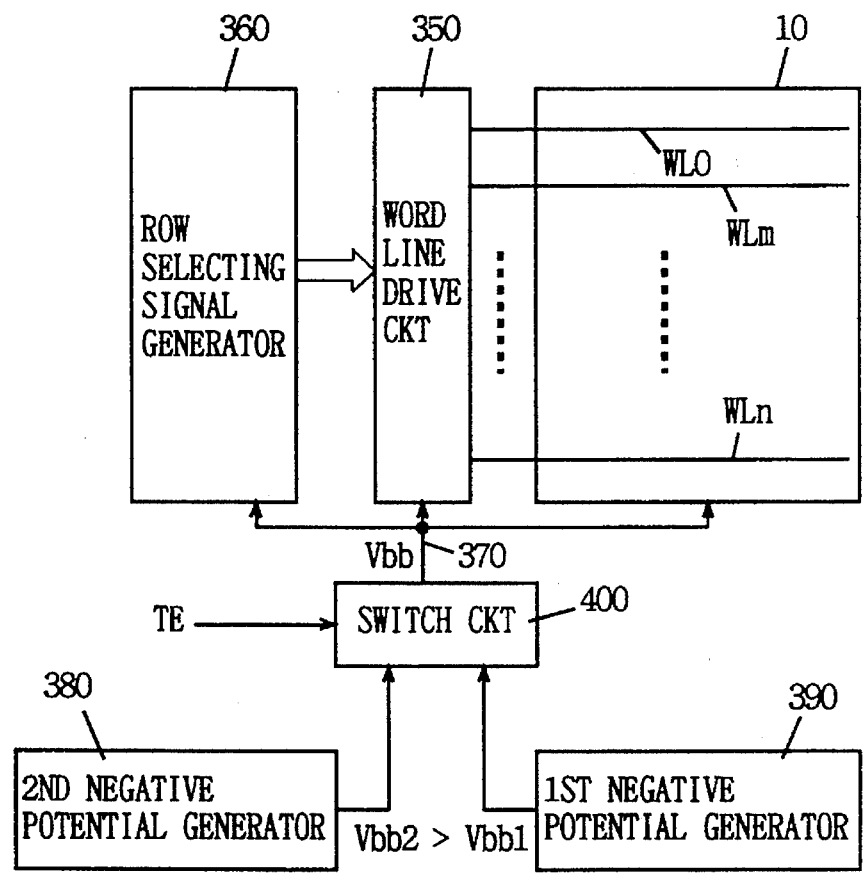
FIG. 29 schematically shows a structure of a main portion of a semiconductor memory device according to a fourth embodiment of the invention.

FIG. 29 shows a structure of a major portion of a DRAM which is a fourth embodiment of the invention. In FIG. 29, a row select signal generating circuit 360 corresponds to the address buffer, row decode circuit and level converter circuit used in the embodiments shown in FIGS. 1 to 28. Row select signal generating circuit 360 may include an RX decoder. A word line drive circuit 350 may be any of the word line drive circuits used in the embodiments shown in FIGS. 1 to 28. Word line drive circuit 350 is required only to satisfy a function of transmitting high voltage Vpp and negative potential Vbb onto word lines WL0–WLn in memory cell array 10, or onto the word line specified by the externally applied address signal and the remaining word lines, respectively.

In FIG. 29, the DRAM further includes a first negative potential generating circuit 390 generating a first negative potential Vbb1, a second negative potential generating circuit 380 generating a second negative potential Vbb2, and a switch circuit 400 which selects one of outputs of negative potential generating circuits 380 and 390 in accordance with a test mode instructing signal TE and transmits the selected output as negative potential Vbb to word line drive circuit 350 via a power supply line 370. Power supply line 370 extending from switch circuit 400 also supplies negative potential Vbb to a level converting portion included in row select signal generating circuit 360 and the substrate region of memory cell array 10. First negative potential Vbb1 is smaller (larger in absolute value) than second negative potential Vbb2 (Vbb2>Vbb1). Operation will now be briefly described below.

In the normal operation mode, test mode instructing signal TE is at the L-level, and switch circuit 400 (of which structure will be specifically described later) selects first negative potential Vbb1 generated by first negative potential generating circuit 390 to transmit the same onto power supply line 370.

In the test mode, test mode instructing signal TE is at the H-level, and switch circuit 400 selects second negative potential Vbb2 generated by second negative potential generating circuit 380 to transmit the same onto power supply line 370. In the test operation mode, second negative potential Vbb2 is transmitted to the nonselected word lines. Second negative potential Vbb2 is smaller in absolute value than first negative potential Vbb1. In this case, it becomes more likely than the case using first negative potential Vbb1 that affects by floating up of the word line potential caused by the capacitive coupling as well as by variation of the potential of bit line are caused. Thus, by reducing the absolute value of negative potential Vbb in the test operation mode, acceleration test of "disturb refresh" can be executed. More specifically, the absolute value of negative potential Vbb applied to the gate of the memory transistor is reduced in the test mode operation, whereby it is possible to enhance formation of a weakly inverted region at the channel region of the memory transistor, and hence it makes electric charges easy to move by the channel leak. Thereby, the acceleration test of "disturb refresh" can be executed.

Structures of various portions will be described below.

Figure 30:
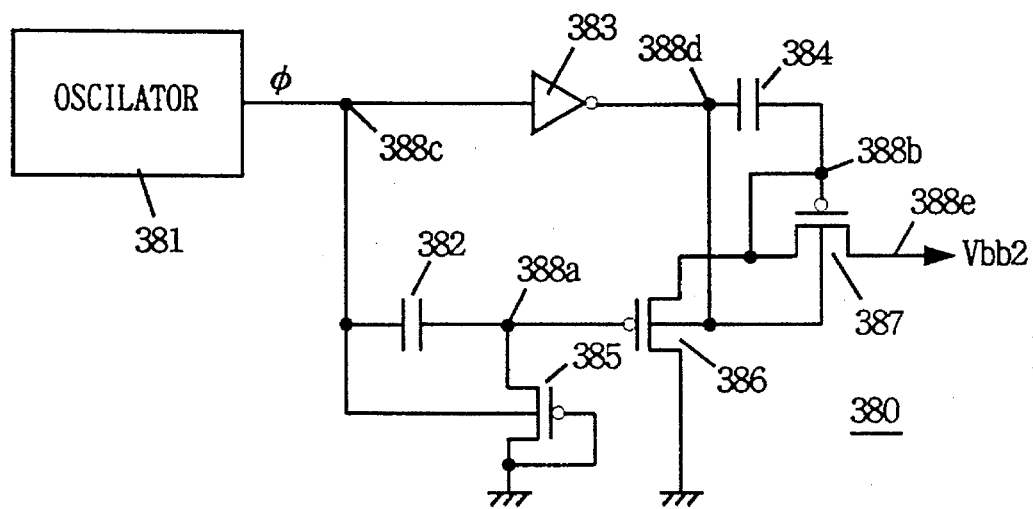
FIG. 30 shows an example of a structure of a second negative potential generating circuit shown in FIG. 29.

FIG. 30 shows an example of a structure of the second negative potential generating circuit. In FIG. 30, second negative potential generating circuit 380 includes an oscillator 381 which generates a clock pulse φ having predetermined width and period, a capacitor 382 transmitting clock pulse φ, which is transmitted to a node 388c from oscillator 381, to a node 388a, an inverter 383 inverting clock pulse φ on node 388c, a capacitor 384 transmitting a clock pulse, which is transmitted from inverter 383 to a node 388d, to a node 388b by capacitive coupling, a p-channel MOS transistor 385 having one conductive terminal (source) connected to node 388a, a gate and the other conductive terminal (drain) connected to receive ground potential GND, and a substrate (back gate) connected to node 388c, a p-channel MOS transistor 386 having a gate connected to node 388a, one conductive terminal connected to node 388b, and the other conductive terminal connected to receive the ground potential, and a p-channel MOS transistor 387, having one conductive terminal connected to the output node and the other conductive terminal (drain) connected to node 388b.

Both the substrate regions (back gates) of MOS transistors 386 and 387 are connected to node 388d. Substrate regions (back gates) of MOS transistors 385, 386 and 387 are not fixed at power supply potential Vcc level but are connected to the internal nodes for the purpose of minimizing the electric field applied across impurity regions and substrate regions of these MOS transistors 385, 386 and 387 when nodes 388a and 388b attain the negative potential. Operation will be briefly described below. In the following description, it is assumed that MOS transistors 385, 386 and 387 have the same threshold voltage, of which absolute value is Vthp.

When clock pulse φ rises to the H-level (Vcc level), the potential of node 388a is raised by the capacitive coupling of capacitor 382. MOS transistor 385 is turned on to discharge node 388, so that the potential of node 388a goes up to Vthp. Meanwhile, inverter 383 sets the potential of node 388d to the L-level (ground potential level), and the potential of node 388b is lowered to a negative potential by the capacitive coupling. The gate potential of MOS transistor 386 is Vthp, and MOS transistor 386 is off. Meanwhile, MOS transistor 387 is on, so that electrons flow from node 388d to node 388e, and the potential of node 388e lowers. When the potential difference between nodes 388e and 388d becomes Vthp, MOS transistor 388b is turned off. When clock pulse φ falls to the L-level, the potential of node 388a is lowered to the negative potential by the capacitive coupling, so that MOS transistor 385 is turned off, and MOS transistor 386 is turned on. Even when the output of inverter 383 rises to the H-level and the potential of node 388b rises due to the capacitive coupling of capacitor 384, MOS transistor 386 discharges the potential of node 388b to the ground potential level. By repeating this operation, the potential of node 388b changes between GND and −Vcc.

Thereby, negative potential Vbb2 output from output node 388e goes to −(Vcc−Vthp).

Figure 31:
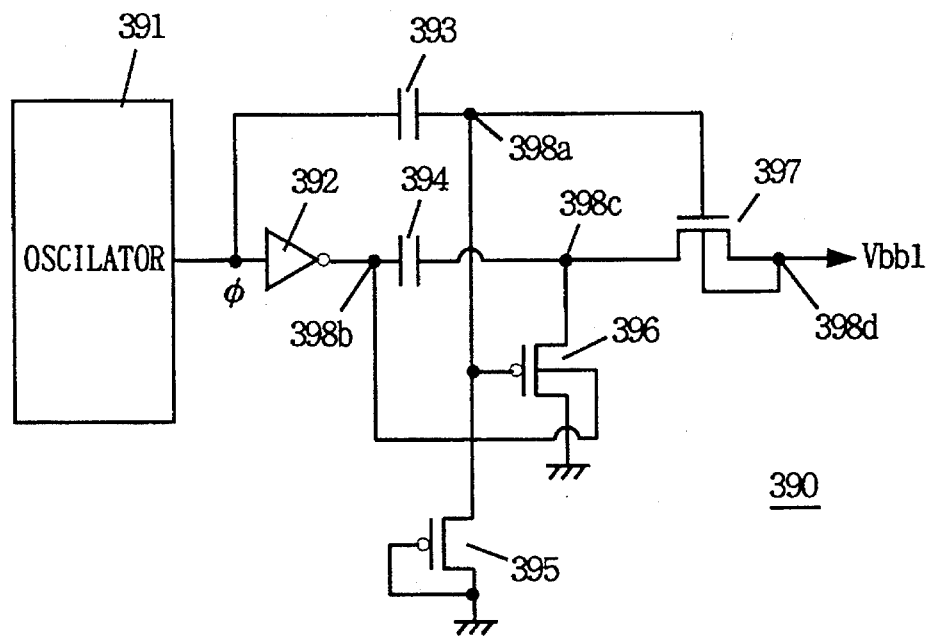
FIG. 31 shows an example of a structure of a first negative voltage generating circuit shown in FIG. 29.

FIG. 31 shows an example of a structure of the first negative potential generating circuit shown in FIG. 21. In FIG. 31, a first negative potential generating circuit 390 includes an oscillator 391 generating clock pulse φ having predetermined width and period, an inverter 392 inverting clock pulse φ, a capacitor 393 transmitting clock pulse φ to a node 398a by capacitive coupling, a capacitor 394 transmitting the output of inverter 392 to a node 398c by capacitive coupling, a p-channel MOS transistor 395 diode-connected between node 398a and a ground potential supply node, a p-channel MOS transistor 396, having conductive terminal connected to node 398c, the other conductive terminal connected to the ground potential supply node and gate connected to node 398a, and an n-channel MOS transistor 397, one conductive terminal (drain) connected to node 398c, its gate connected to node 398a, and the other conductive terminal (source) and substrate region connected to output node 398a. The substrate region of MOS transistor 396 is connected to node 398b. Operation will now be described below.

For simplicity reasons, it is assumed that the absolute values of threshold voltages of p-channel MOS transistors 395 and 396 as well as the threshold voltage of n-channel MOS transistor 397 are all equal to Vth. When clock pulse φ rises to the H-level (Vcc level), the potential of node 398a rises, and MOS transistor 395 is turned on. Thereby, the potential of node 398a is clamped at Vth. Meanwhile, the output of inverter 392 attains the L-level, and the potential of node 398c lowers to the negative potential through the capacitive coupling of capacitor 394. MOS transistor is turned off. Meanwhile, MOS transistor 397 is on, and electrons flow from node 398c to an output node 398d. Thereby, the potential of output node 398d lowers, and nodes 398c and 398d have the same potential (MOS transistor 397 has the gate potential of Vth).

When clock pulse φ falls to the L-level, the potential of node 398a lowers to the negative potential level through the capacitive coupling of capacitor 393, and MOS transistor 395 is turned off. Meanwhile, the output of inverter 392 rises to the H-level, and the potential of node 398c rises through the capacitive coupling of capacitor 394. The potential of node 398a is negative so that MOS transistor 396 is turned on to discharge the potential of node 398c to the ground potential level, and MOS transistor 397 is turned off. By repeating the above operation, the potential of node 398c oscillates between the levels of −Vcc and the ground potential. The potential of node 398a oscillate between Vth and (−Vcc+Vthp). Thereby, first negative potential Vcc1 output from output node 398d ultimately reaches −Vcc level.

Figure 32:
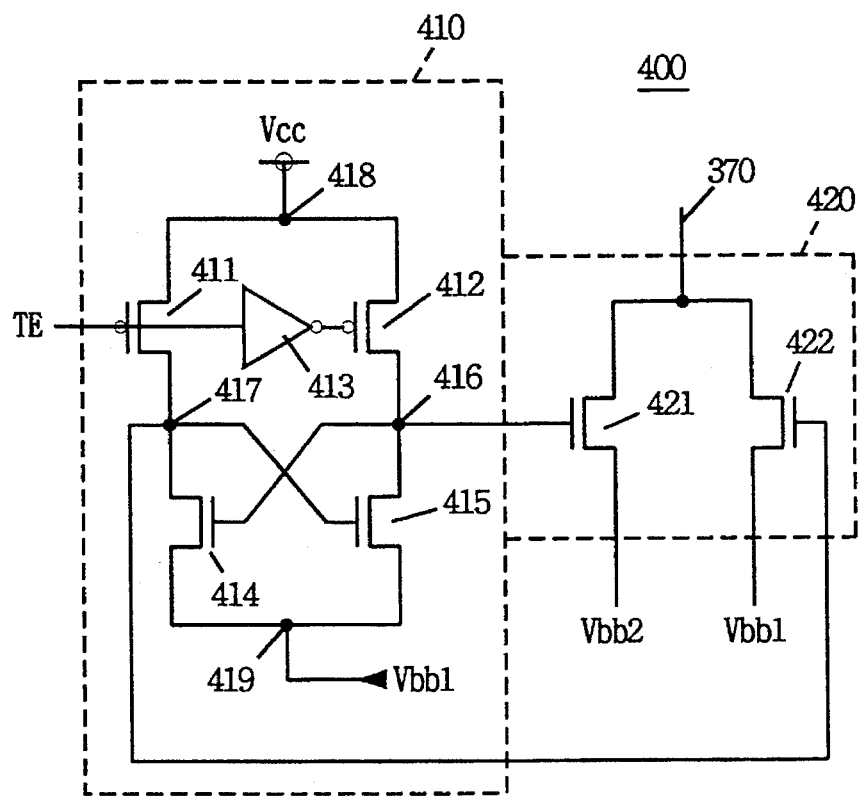
FIG. 32 shows an example of a structure of a switch circuit shown in FIG. 29.

FIG. 32 shows an example of a structure of switch circuit 400 shown in FIG. 29. In FIG. 32, switch circuit 400 includes a level converter 410 which converts the level of test mode instructing signal TE having an amplitude of Vcc, and a selector circuit 420 which selects one of negative potentials Vbb1 and Vbb2 to transmit the selected one to power supply line 370.

Level converter 410 includes a p-channel MOS transistor 411 which is responsive to test mode instructing signal TE to transmit power supply potential Vcc of a power supply node 418 to an output node 417, an inverter 413 inverting test mode instructing signal TE, a p-channel MOS transistor 412 which is responsive to the output of inverter 413 to transmit power supply potential Vcc applied to power supply node 418 to another output node 416, an n-channel MOS transistor 414 which is responsive to the signal potential on output node 416 to discharge output node 417 to first negative potential Vbb1 applied to another power supply node 419, and an n-channel MOS transistor 415 which is responsive to the signal potential on output node 417 to discharge output node 416 to first negative potential Vbb1 level. P-channel MOS transistors 411 and 412 are mutually complementarily turned on, and n-channel MOS transistors 414 and 415 are mutually complementarily turned on. MOS transistors 412 and 415 are mutually complementarily turned on, and MOS transistors 411 and 414 are mutually complementarily turned on.

Select circuit 420 includes n-channel MOS transistor 421 which receives on its gate the signal potential from output node 416 of level converter 410 and transmits second negative potential Vbb2 to power supply line 370, and n-channel MOS transistor 422 which receives on its gate the signal potential of output node 417 of level converter 410 and transmits first negative potential Vbb1 to power supply line 370. Operation will be briefly described below.

When test mode instructing signal TE is at the L-level, MOS transistor 411 is on, MOS transistor 412 is off, and output node 417 is charged to power supply potential Vcc level. Output node 416 is discharged to first negative potential Vbb1 level by MOS transistor 415 which is turned on in response to the potential at power supply potential Vcc level on output node 417. MOS transistor 414 is turned off in accordance with the signal at first negative potential Vbb1 level on output node 416.

In selector circuit 420, MOS transistor 421 is off (Vbb1<Vbb2), and MOS transistor 422 is on. Therefore, power supply line 370 receives first negative potential Vbb1. More specifically, when test mode instructing signal TE is at the L-level of inactive state, the normal operation mode is executed, and first negative potential Vbb1 is selected and transmitted onto power supply line 370.

When test mode instructing signal TE is at the H-level of power supply potential level, MOS transistor 411 is off, MOS transistor 412 is on, and the potential of output node 416 is at power supply potential Vcc level. Output node 417 is discharged down to first negative potential Vbb1 level by MOS transistor 414. MOS transistor 415 is off in accordance with first negative potential Vbb1 level of output node 417. In selector circuit 420, MOS transistor 421 receiving the signal potential at power supply potential Vcc level from output node 416 is turned on, and n-channel MOS transistor 422 receiving on its gate the signal potential at first negative potential Vbb1 level from output node 417 is turned off. Thereby, second negative potential Vbb2 is transmitted onto power supply line 370. During the test mode, negative potential Vbb applied to the nonselected word line is set to a value shallower (smaller in absolute value) than that during the normal operation mode, whereby the acceleration test of "disturb refresh" can be executed.

[Modification 1]

Figure 33:
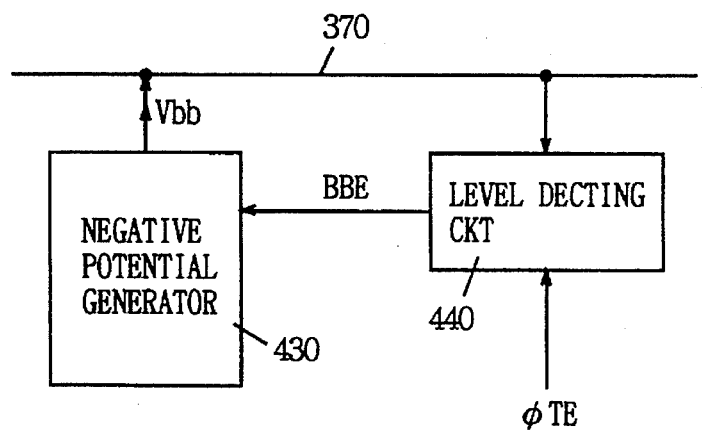
FIG. 33 shows a first modification of a semiconductor memory device according to the fourth embodiment of the invention.

FIG. 33 shows a structure of a first modification of the fourth embodiment of the invention. In FIG. 33, a negative potential generating circuitry includes a negative potential generating circuit 430 which supplies negative potential Vbb onto negative potential power supply line 370, and a level detecting circuit 440 which detects the level of negative potential Vbb on negative potential power supply line 370 and generates a signal BBE for controlling activation and deactivation of negative potential generating circuit 430 in accordance with the results of detection. Level detecting circuit 440 has a determination reference level switched by a test mode instructing signal φTE. Level detecting circuit 440 deactivates signal BBE and stops the operation of negative potential generating circuit 430, when negative potential Vbb on negative potential power supply line 370 goes to a level lower (i.e., larger in absolute value) than a predetermined potential. Negative potential generating circuit 430 includes the charge pump circuit shown in FIGS. 30 and 31, and stops its charge pump operation when signal BBE sent from level detecting circuit 440 is deactivated. Thereby, supply of negative charges (electrons) to negative potential power supply line 370 is stopped, and the potential level of negative potential Vbb on negative potential power supply line 370 rises. When negative potential Vbb on negative potential power supply line 370 increases to or above a predetermined level, level detecting circuit 440 activates signal BBE and negative potential generating circuit 340. Activated negative potential generating circuit 430 supplies electrons to negative potential power supply line 370 to lower the potential on negative potential power supply line 370. Thereby, negative potential generating circuit 430 supplies negative potential power supply line 370 with negative potential Vbb which is held at a level predetermined by level detecting circuit 442.

The negative potential on negative potential power supply line 370 is supplied to the word line drive circuit, row select signal generating circuit and memory cell array 10 shown in FIG. 29. The nonselected word lines receive negative potential Vbb on negative potential power supply line 370. In accordance with test mode instructing signal φTE, level detecting circuit 440 raises the reference level for determining the active and inactive states of signal BBE. Thereby, the potential level of negative potential Vbb on negative potential power supply line 370 during the test operation mode becomes higher than that during the normal operation mode, and, negative potential Vbb transmitted to the nonselected word line increases. By increasing negative potential Vbb transmitted to the nonselected word line during the test mode operation, the acceleration test of "disturb refresh" can be achieved. Structures of respective portions will be described below.

Figure 34:
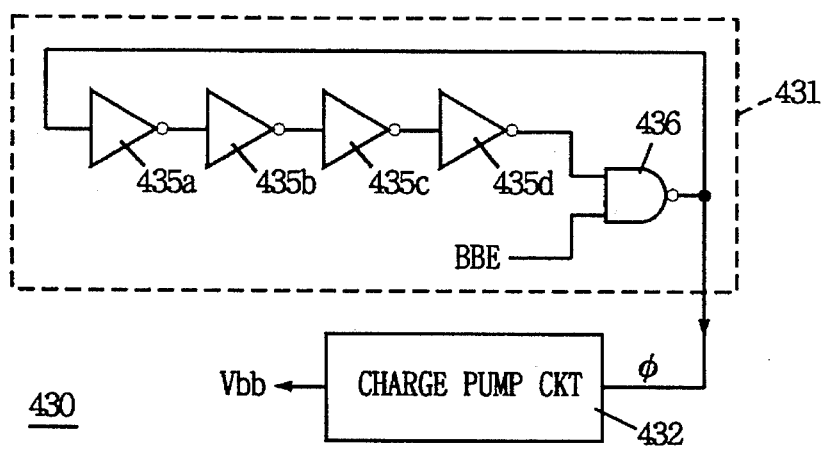
FIG. 34 shows an example of a structure of a negative voltage generating circuit shown in FIG. 33.

FIG. 34 shows an example of the structure of negative potential generating circuit shown in FIG. 33. In FIG. 34, negative potential generating circuit 430 includes an oscillator 431 generating clock signal φ, and a charge pump circuit 432 which performs charge pump operation to generate negative potential Vbb in accordance with clock pulse φ sent from oscillator 431. Charge pump circuit 432 may include either of structures of the charge pump circuits shown in FIGS. 30 and 32.

Oscillator 431 includes four inverters 435a, 435b, 435c and 435d connected in series, and a 2-input NAND circuit 436 receiving the output of inverter 435d and enable signal BBE. The output of NAND circuit 436 is supplied to the input portion of inverter 435a at the first stage. NAND circuit 436 outputs clock pulse φ. The number of inverters included in oscillator 431 is required only to be even and may be other than four.

When signal BBE is at the inactive state of "L", the output of NAND circuit 436 is fixed at the H-level. More specifically, clock pulse φ does not change, and the charge pump operation of charge pump circuit 432 is inhibited. When signal BBE is at the H-level of active state, NAND circuit 436 functions as an inverter. Therefore, oscillator 431 functions as a ring oscillator including five inverters connected in series, and generates clock pulse φ having a pulse width and a period depending on the number of inverters and a delay time. In accordance with periodically changing clock pulse φ, charge pump circuit 432 performs the charge pump operation to generate negative potential Vbb. Signal BBE can act to activate/deactivate charge pump circuit 432 and can maintain the level of negative potential Vbb at a predetermined level, because charge pump circuit 432 supplies negative charges (electrons) to negative potential power supply line 370 during its operation.

Figure 35:
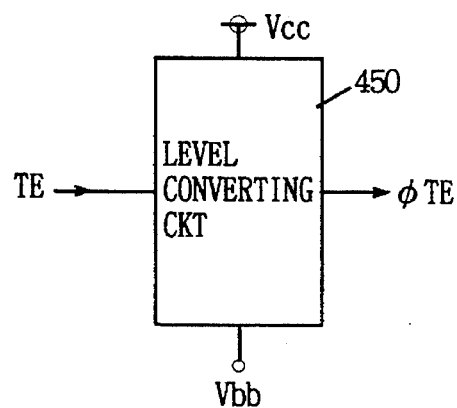
FIG. 35 schematically shows a circuit structure generating a test mode instructing signal φTE shown in FIG. 33.

FIG. 35 shows a circuit generating test mode instructing signal φTE. In FIG. 35, test mode instructing signal φTE is generated by a level converter 450 which converts the level of test mode instructing signal TE. Structure of level converter 450 is the same as that of level converter 410 shown in FIG. 32. Test mode instructing signal TE may be applied externally and directly, or may be generated by an appropriate structure utilizing combination of a timing relationship among a plurality of signals and a value of a predetermined address signal bit. Further, such a structure may be employed that test mode instructing signal TE is generated by raising the potential of a specific pin terminal to or above a predetermined potential level. Level converter 450 converts test mode instructing signal TE having an amplitude (Vcc–GND level) into test mode instructing signal φTE having an amplitude of (amplitude Vcc–Vbb).

Figure 36:
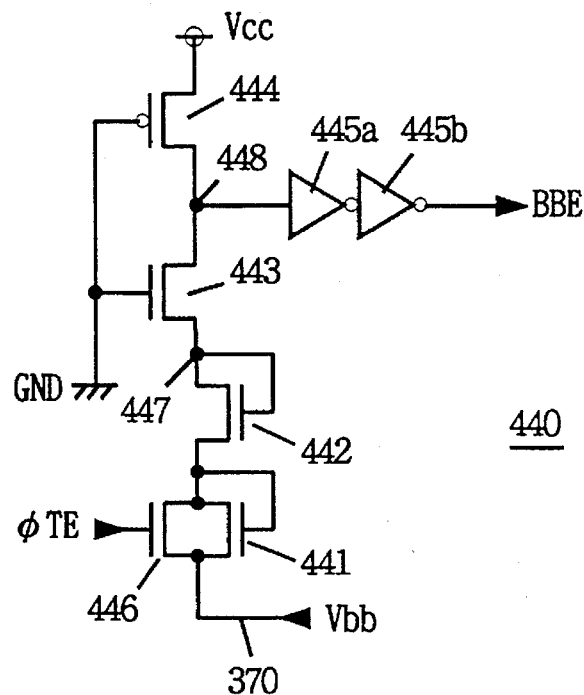
FIG. 36 shows an example of a structure of a level detecting circuit shown in FIG. 33.

FIG. 36 shows an example of a structure of level detecting circuit 440 shown in FIG. 33. In FIG. 36, level detecting circuit 440 includes two diode-connected n-channel MOS transistors 441 and 442 which are connected in series between negative potential power supply line 370 and a node 447, an n-channel MOS transistor 446 which is arranged in parallel to MOS transistor 441, and receives test mode instructing signal φTE on its gate, an n-channel MOS transistor 443 which is arranged between nodes 448 and 447, and receives ground potential GND on its gate, a p-channel MOS transistor 444 which is arranged between power supply node (Vcc node) and node 448, and receives ground potential GND on its gate, and two inverters 444a and 445b connected in series for amplifying the signal potential on output node 448. Inverter 445d supplies enable signal BBE. Operation will now be described below.

It is now assumed that all the threshold voltages of MOS transistors 441, 442 and 443 are the same and equal to Vth. When the potential V(447) of node 447 satisfies the relationship of $V(447)=Vbb+2 \cdot Vth \leqq -Vth$ MOS transistor 443 is on, a current flows through MOS transistors 441, 442 and 443, and the potential of node 448 lowers. More specifically, when there is a relationship of Vbb<–3·Vth, the potential of node 448 lowers, signal BBE attains the L-level, and operation of negative potential generating circuit 430 (charge pump circuit 432) stops.

Meanwhile, when potential V(447) of node 447 satisfies the relationship of $V(447)=Vbb+2 \cdot Vth > -Vth$ MOS transistor 443 is turned off, and the node 448 is charged to the potential at power supply potential Vcc level via normally turned-on p-channel MOS transistor 444. In this case, signal BBE is at the H-level, and negative potential generating circuit 430 (charge pump circuit 432) operates to lower the level of negative potential Vbb. By this operation, negative potential Vbb on negative potential power supply line 370 is held at –3·Vth.

When test mode instructing signal φTE attains the H-level, MOS transistor 446 is turned on, and thus MOS transistor 441 is short-circuited. In this case, the potential V(447) of node 447 goes to the following value:

$V(447)=Vbb+Vth$

Similarly to the aforementioned case, when the following relationship is satisfied:

$V(447)=Vbb+Vth<-Vth$

MOS transistor 443 is on, and signal BBE is at the L-level. When the following relationship is satisfied:

$V(447)=Vbb+Vth>-Vth$

MOS transistor 443 is off, and signal BBE is at the H-level. Thus, in the test operation mode, negative potential Vbb is se to the level of –2·Vth. Negative potential Vbb in the test mode is higher than that in the normal operation mode.

When signal BBE is set to the L-level, the current which flows during the on-state of MOS transistor 443 can be a minute current by setting the on-resistance of MOS transistor 444 to a sufficiently large value, whereby the current flowing into negative potential power supply line 370 can be reduced to a negligible value. MOS transistor 443 is turned on only when negative potential Vbb is not higher than a predetermined level, and the potential of negative potential power supply line 370 can be increased by applying the current to negative potential power supply line 370 via MOS transistors 443, 442 and 441, and thus negative potential Vbb can be restored faster to the predetermined potential level.

[Modification of Level Detecting Circuit]

Figure 37:
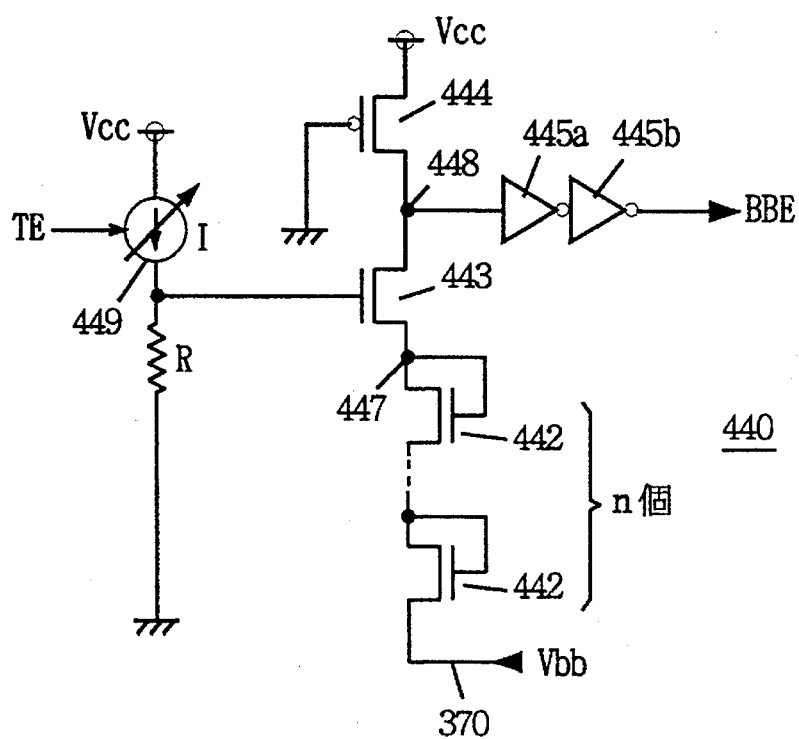
FIG. 37 shows a first modification of the level detecting circuit shown in FIG. 33.

FIG. 37 shows a modification of the level detecting circuit shown in FIG. 33. In FIG. 37, level detecting circuit 440 includes n n-channel MOS transistors 442 connected in series between negative potential power supply line 370 and node 447, n-channel MOS transistor 443 arranged between nodes 448 and 447, p-channel MOS transistor 444 which is arranged between power supply node (Vcc node) and node 448, and receives on its gate the ground potential to function as a pull-up resistance, and two inverters 445a and 445b amplifying the signal potential of node 448.

Level detecting circuit 440 further includes a resistance R arranged between the gate of MOS transistor 443 and the ground potential supply node, and a variable constant current source 449 supplying a current I to resistance R. Variable constant current source 449 changes its supply current amount in accordance with test mode instructing signal TE. When test mode instructing signal TE is active, variable constant current source 449 increases its supply current I. Operation will now be described below.

In the following description, it is likewise assumed that the threshold voltages of MOS transistors 442 and 443 are equal to Vth. The potential of node 447 is Vbb+n·Vth. The potential of gate of MOS transistor 443 is I·R. MOS transistor 443 is on in the case of:

$I \cdot R - Vth \geqq Vbb + n \cdot Vth$ and is off in the case other than the above, so that signals BBE attains "L" and "H", respectively.

Thus, in the level detecting circuit shown in FIG. 37, input signal BBE is generated to satisfy the following relationship:

$I \cdot R - Vth = Vbb + n \cdot Vth$

From this formula, negative potential Vbb can be expressed as follows:

$Vbb = I \cdot R - (n+1) \cdot Vth.$

In the test operation mode, test mode instructing signal TE is activated, and the value of current I supplied from variable constant current source 449 is increased. Thus, in the test mode operation, the potential level of negative potential Vbb rises.

As shown in FIG. 37, the gate potential of MOS transistor 443 for level detection is changed in accordance with test mode instructing signal TE, whereby the potential level of negative potential Vbb during the test mode operation can be shallow (smaller in absolute value) than negative potential Vbb level during the normal operation mode.

The number n of n-channel MOS transistors 442 diode-connected in series between node 447 and negative potential power supply line 370 is an appropriately determined natural number. In the structure of the level detecting circuit shown in FIG. 37, the potential level of negative potential Vbb in the test mode operation can be set more flexibly than the structure shown in FIG. 36. In the structure shown in FIG. 36, the potential level of negative potential Vbb in the test mode changes by a value corresponding to threshold voltage Vth of MOS transistor 441. In the structure shown in FIG. 37, the potential by which negative potential Vbb changes in the test mode can be set to an appropriate value by the value of current I.

Figure 38:
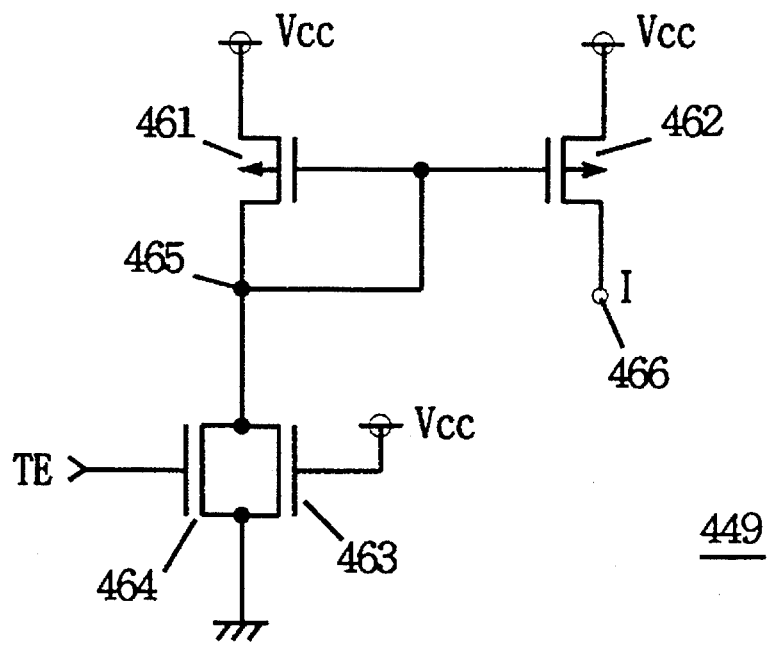
FIG. 38 shows an example of a variable constant current source shown in FIG. 37.

FIG. 38 shows an example of the structure of variable constant current source shown in FIG. 37. In FIG. 38, variable constant current source 449 includes a p-channel MOS transistor 461 which is connected between the power supply potential node and a node 465, and has a gate connected to node 465, a p-channel MOS transistor 462 which is arranged between the power supply potential node and output node 466, and has a gate connected to node 465, an n-channel MOS transistor 463 which is arranged between node 465 and ground potential node, and has a gate receiving power supply potential Vcc, and an n-channel MOS transistor 464 which is arranged between node 465 and the ground potential node, and receives test mode instructing signal TE on its gate. The current supply capability of MOS transistor 463 is smaller than that of p-channel MOS transistor 461.

P-channel MOS transistors 461 and 462 form a current mirror circuit. If these MOS transistors 461 and 462 have the same size, MOS transistors 461 and 462 supply the currents of the same value. In the normal operation mode, test mode instructing signal TE is at the L-level, and n-channel MOS transistor 464 is off. In this state, p-channel MOS transistor 461 supplies the current of which quantity depends on the current supply capacitance of MOS transistor 463. The current supplied by MOS transistor 461 is mirrored by MOS transistor 462 and is output from output node 466. The mirror current I supplied by MOS transistor 462 is applied to resistance R shown in FIG. 37.

In the test mode, test mode instructing signal TE is at the H-level, and MOS transistor 464 is on. Two MOS transistors 463 and 464 are connected in parallel, and a large quantity of current flows from node 465 to the ground potential. Thus, the quantity of current supplied by MOS transistor 461 increases, and mirror current I flowing from MOS transistor 462 increases.

The current I supplied from output node 466 can be determined to achieve an intended change of the current by setting the ratio of gate width to gate length of each of MOS transistors 463 and 464 to appropriate values.

[Modification 2]

FIG. 38 shows a structure of a second modification of the fourth embodiment of the invention. In FIG. 38, there are provided a negative potential generating circuit 470 which supplies negative potential Vbb to negative potential power supply line 370, and a clamp circuit 480 which clamps negative potential Vbb of negative potential power supply line 370 at a predetermined potential level. The negative potential Vbb on negative potential power supply line 370 is supplied by the row selection signal generating circuit to the word line drive circuit and memory cell array similarly to the structure shown in FIG. 29. Clamp circuit 480 changes its clamp level in accordance with test mode instructing signal TE. When test mode instructing signal TE is activated to instruct the test operation mode, the clamp level of clamp circuit 480 is set to a shallow value (large in absolute value). Thus, in the test operation mode, the potential level of negative potential Vbb of negative potential power supply line 370 is increased, whereby the potential level of negative potential Vbb transmitted to the nonselected word line is increased, and the acceleration test of "disturb refresh" is achieved. Specific structures will be described below.

Figure 39:
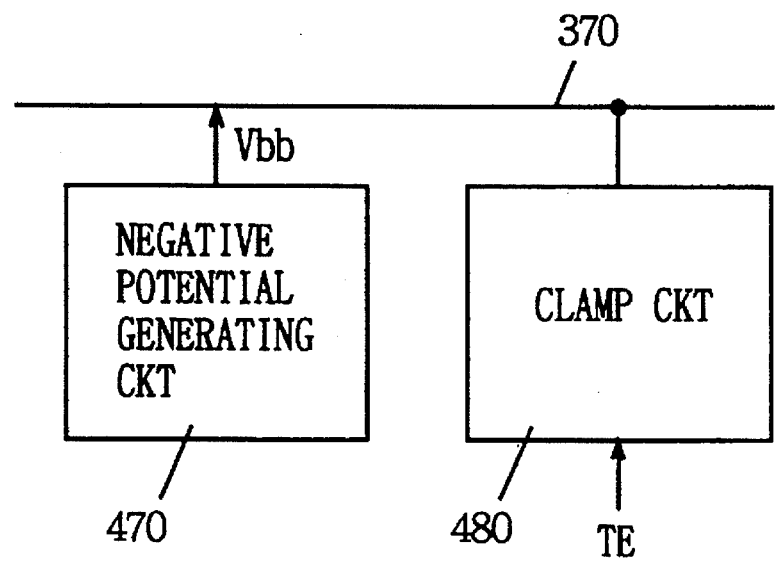
FIG. 39 shows a third modification of the semiconductor memory device according to the fourth embodiment of the invention.
Figure 40:
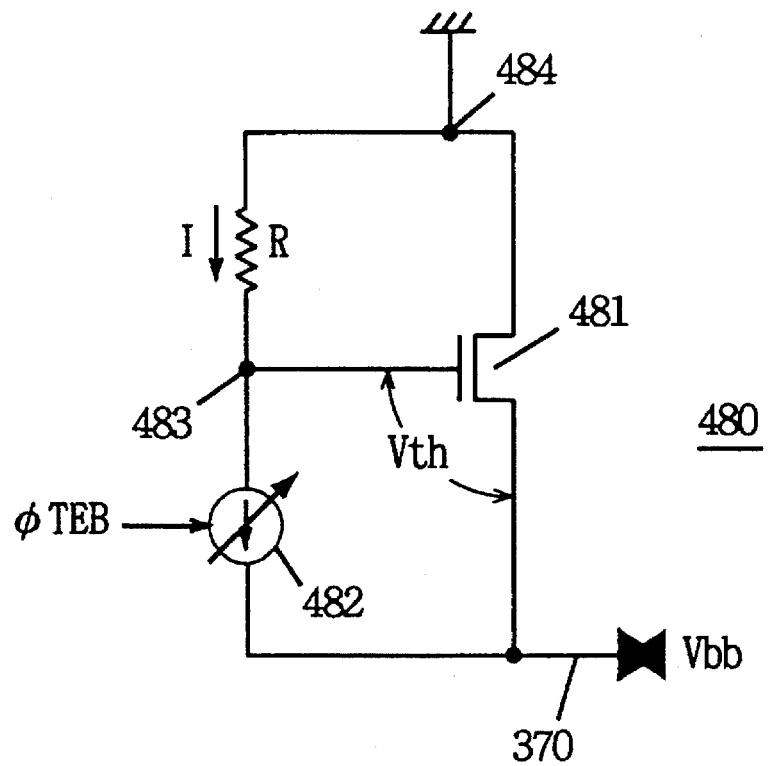
FIG. 40 shows an example of a structure of a clamp circuit shown in FIG. 39.

FIG. 40 shows an example of a structure of the clamp circuit shown in FIG. 39. In FIG. 40, clamp circuit 480 includes an n-channel MOS transistor 481 which is arranged between a ground node 484 and negative potential power supply line 370, and has a gate connected to ground node 484 via resistance R, and a variable constant current source 482 arranged between a node 483 and negative potential power supply line 370. Variable constant current source 482 changes its supply current in accordance with an inverted signal φTEB of test mode instructing signal φTE. When test mode instructing signal φTEB is at the H-level, variable constant current source 482 increases its supplying current. When test mode instructing signal φTEB is at the L-level of negative potential Vbb level indicative of the test operation mode, variable constant current source 482 reduces its supply current.

MOS transistor 481 operates in accordance with a source follower. The gate potential (i.e., potential of node 483) of MOS transistor 481 is represented by –I·R. When negative potential Vbb of negative potential power supply line 370 decreases below (–I·R–Vth), MOS transistor 481 is turned on and causes flow of the current from ground node 484 to negative potential power supply line 370 to increase its potential. When negative potential Vbb increases above (–I·R–Vth), MOS transistor 481 is turned off. Thus, MOS transistor 481 has a function of clamping the lowest level of negative potential Vbb at (–I·R–Vth).

When the test mode is instructed and signal φTEB is set to negative potential Vbb, variable constant current source 482 reduces its supply current. Thus, the value of current I decreases, and the potential level of negative potential Vbb rises. Owing to this structure, the absolute value of negative potential Vbb can be reduced in the test operation mode, and acceleration test of "disturb refresh" can be achieved. Resistance R and the internal resistance of variable constant current source 482 are both set to sufficiently large values so as to prevent flow of a minute current to negative potential power supply line 370.

Figure 41:
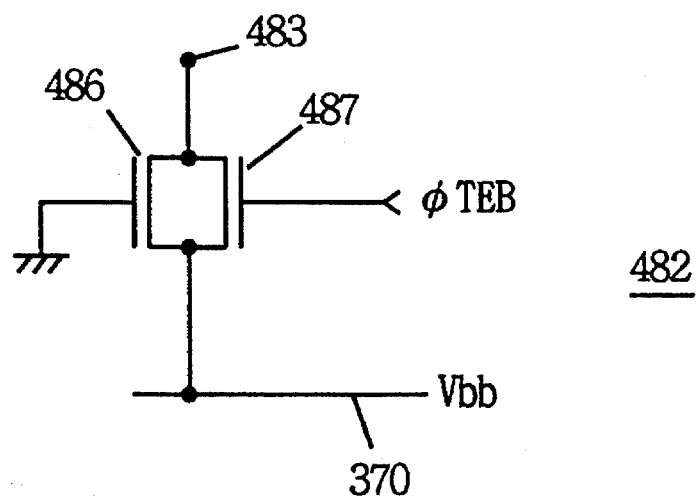
FIG. 41 shows an example of a structure of a variable constant current source shown in FIG. 40.

FIG. 41 shows an example of a structure of a variable constant current source 428. In FIG. 41, variable constant current source 482 includes an n-channel MOS transistor 486, which is arranged between node 483 and negative potential power supply line 370, and receives on its gate the ground potential, and an n-channel MOS transistor 487, which is arranged between a node 483 and negative potential power supply line 370, and receives inverted test mode instructing signal φTEB on its gate. On-resistances of MOS transistors 486 and 487 are set to sufficiently large values. When signal φTEB is set to negative potential Vbb to instruct the test mode, MOS transistor 487 is turned off, and the current flows from node 483 to negative potential power supply line 370 only via MOS transistor 486. MOS transistor 486 supplies a constant current in accordance with potential difference |Vbb| between its gate and source.

When signal φTEB attains the H-level (power supply potential Vcc level), the current flows from node 483 through MOS transistors 486 and 487 to negative potential power supply line 370. Thus, when signal φTEB is at the H-level, two MOS transistors supply the current, so that the quantity of the flowing current increases.

It can be seen that the gate of MOS transistor 486 is connected to ground potential GND in order to reduce the current. However, the gate of MOS transistor 486 may be connected to receive power supply potential Vcc.

Signal φTEB may be a signal having an amplitude of (GND–Vbb). For signal φTEB, the level converter shown in FIG. 32 is utilized, and more specifically, signal φTEB is generated by level converter 410 shown in FIG. 32 via its output node 417.

[Modification 3]

Figure 42:
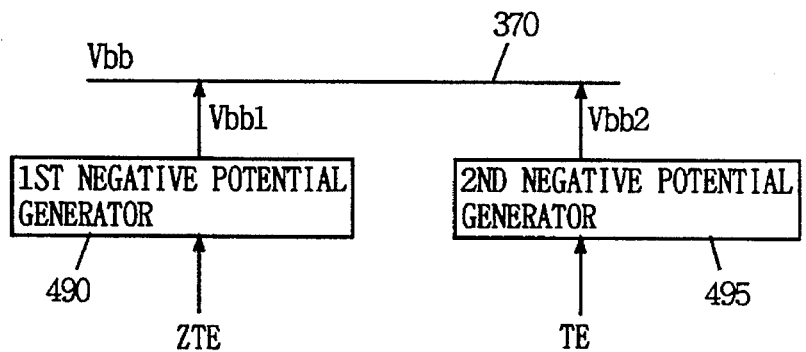
FIG. 42 schematically shows a structure of a fourth modification of the semiconductor memory device according to the fourth embodiment of the invention.

FIG. 42 schematically shows a structure of a third modification of the fourth embodiment of the invention. A structure shown in FIG. 42 includes negative potential generating circuits 490 and 495. First negative potential generating circuit 490 is activated to generate negative potential Vbb1 when an inverted test mode instructing signal ZTE is at the H-level indicative of the normal operation mode. Second negative potential generating circuit 495 is activated to generate negative potential Vbb2 when test mode instructing signal TE is at the H-level indicative of the test operation mode. Negative potentials Vbb1 and Vbb2 satisfy the relationship of Vbb1<Vbb2. Thus, when test mode instructing signal TE is active and instructs the test operation mode, second negative potential Vbb2 is selected as negative potential Vbb and the level of negative potential transmitted onto the nonselected word line is increased. Thereby, the acceleration test of "disturb refresh" is achieved. Since only one of the two negative potential generating circuits operates, it is possible to reduce the power consumption required for generating the negative potential.

Figure 43:
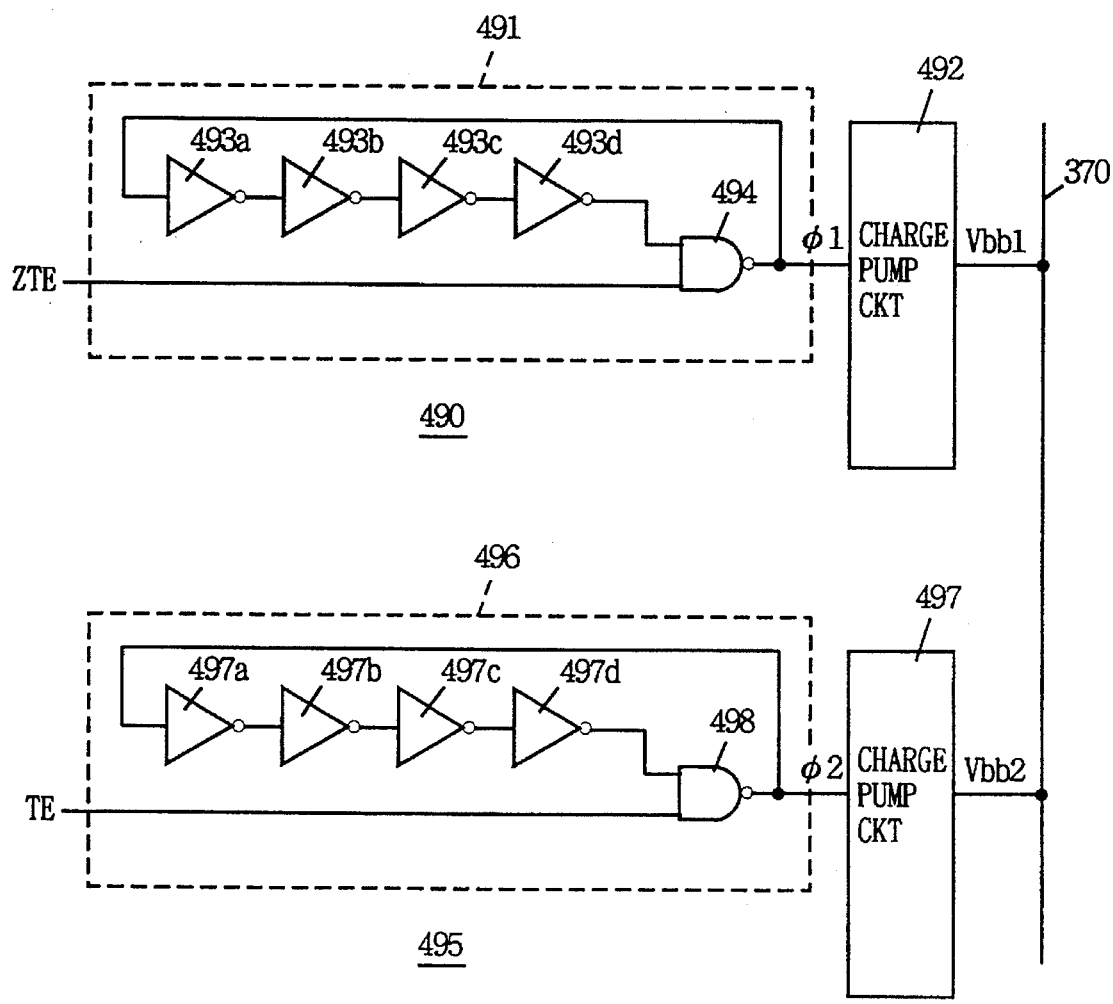
FIG. 43 specifically shows a structure shown in FIG. 42.

FIG. 43 specifically shows a structure of first and second negative potential generating circuits shown in FIG. 42. In FIG. 43, first negative potential generating circuit 490 includes an oscillator 491 which is activated in response to inverted test mode instructing signal ZTE to generate a clock pulse φ1 having predetermined width and period, and a charge pump circuit 492 which generates first negative potential Vbb1 by the charge pump operation in accordance with clock pulse φ1 sent from oscillator 491. The structure of charge pump circuit 492 is the same as that shown in FIG. 31. Oscillator 491 includes four cascaded inverters 493a–493d, and an NAND circuit 494 receiving the output of inverter 493d and inverted signal ZTE. The output of NAND circuit 494 is supplied to the input portion of inverter 493a. NAND circuit 494 outputs clock pulse φ1.

Second negative potential generating circuit 495 includes an oscillator 496 which is activated in response to signal TE to generate a clock pulse φ2 having predetermined width and period, and a charge pump circuit 497 which generates second negative potential Vbb2 by the charge pump operation in accordance with clock pulse φ2 sent from oscillator 496. The structure of charge pump circuit 497 is the same as that shown in FIG. 30. Oscillator 496 includes four inverters 497a–497d, and an NAND circuit 498 receiving the output of inverter 497a and signal TE. The output of NAND circuit 498 is supplied to the input portion of inverter 497a. NAND circuit 498 outputs clock pulse φ2. Operation will be described below.

In the normal operation mode, signal TE is at the L-level (ground potential level), and signal ZTE is at the H-level (power supply potential Vcc level). NAND circuit 494 of oscillator 491 functions as an inverter, and the output of NAND circuit 498 of oscillator 496 is fixed at the H-level. Oscillator 491 oscillates and generates periodically changing clock pulse φ1 which is applied to charge pump circuit 492. Clock pulse φ2 supplied from oscillator 496 is fixed at the H-level, and the charge pump circuit 497 does not perform the charge pump operation. Therefore, in the normal operation mode, first negative potential Vbb1 is transmitted onto negative potential power supply line 370 from charge pump circuit 492.

In the test mode, signal TE is set to the H-level (power supply potential Vcc level), and signal ZTE is set to the L-level (ground potential level). In this case, clock pulse φ1 supplied from NAND circuit 494 of oscillator 491 is fixed at the H-level, and the charge pump operation of charge pump circuit 492 stops. The NAND circuit 498 of oscillator 496 functions as an inverter, and oscillator 496 generates clock pulse φ2. Charge pump circuit 497 performs the charge pump operation in accordance with clock pulse φ2 to transmit second negative potential Vbb2 onto negative potential power supply line 370.

In this third modification, the power consumed for generating the negative potential can be significantly reduced, due to alternative activation of negative potential generating circuits 490 and 495.

[Fifth Embodiment]

Figure 44:
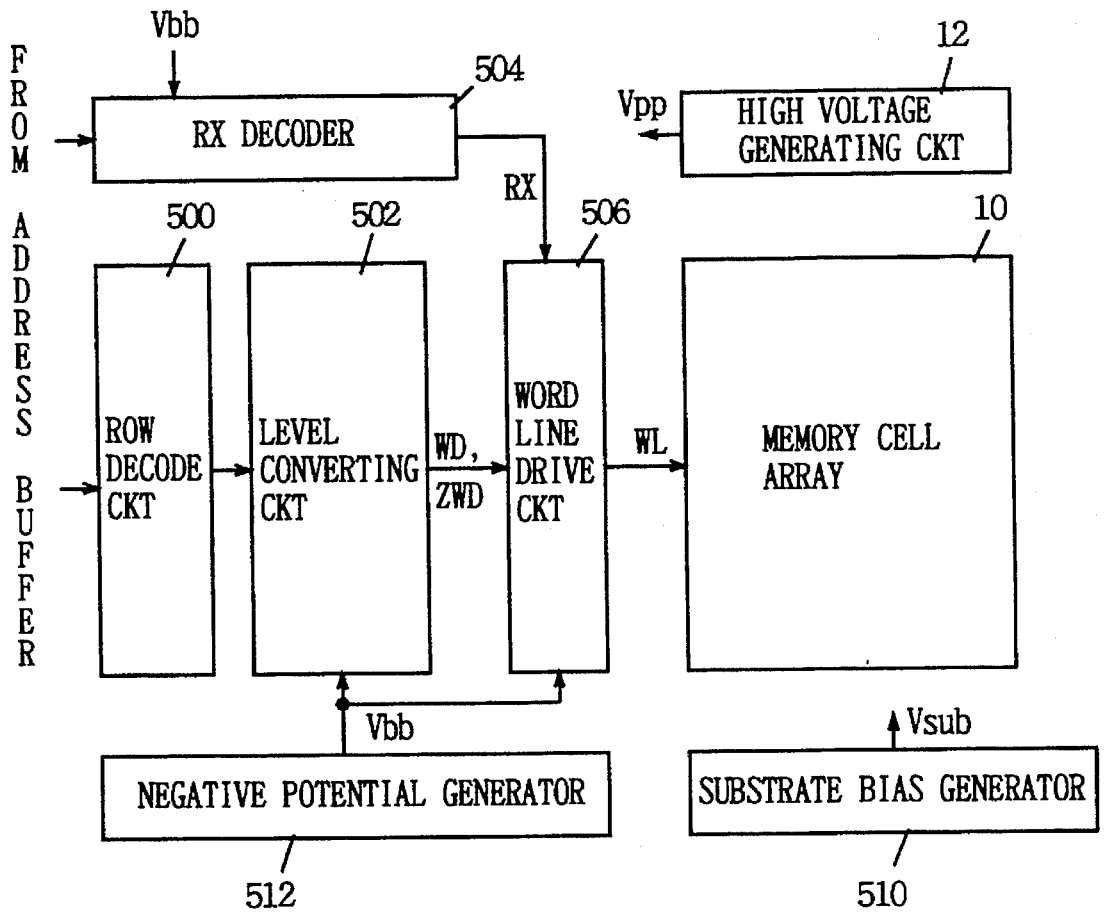
FIG. 44 schematically shows a whole structure of a semiconductor memory device according to a fifth embodiment of the invention.

FIG. 44 shows a structure of a main portion of a DRAM according to a fifth embodiment of the invention. The DRAM shown in FIG. 44 includes a substrate bias generating circuit 510 which generates substrate bias voltage Vsub applied to the substrate region, and a negative potential generating circuit 512 which generates negative potential Vbb to be transmitted to the nonselected word line. Owing to provision of negative potential generating circuit 512 independently from substrate bias generating circuit 510, values of substrate bias voltage Vsub and negative potential Vbb can be changed independently, so that it is possible to achieve not only the acceleration test of "dynamic refresh (disturb refresh)" but also the acceleration test of "pause refresh" which will be described later. Substrate bias voltage Vsub and negative potential Vbb must satisfy the condition of Vsub<Vbb. This is required for maintaining the reverse bias state of the PN junction between the impurity region and substrate region of the MOS transistor.

The DRAM further includes a row decode circuit 500 which decodes the internal row address signal sent from the address buffer, and generates a signal of an amplitude of (Vcc–GND) specifying a corresponding row (word line group) in memory cell array 10, a level converter circuit 502 which converts the signal of an amplitude of (Vcc–GND) sent from row decode circuit 500 into a signal of an amplitude of (Vcc–Vbb), an RX decoder 504 which decodes a predetermined address signal sent from the address buffer to generate a signal of an amplitude of (Vpp–Vbb), and a word line drive circuit 506 which transmits the signal of an amplitude of (Vpp–Vbb) to memory cell array 10 in accordance with outputs WD and ZWD of level converter circuit 502 as well as output RX of RX decoder 504. High voltage Vpp generated by high voltage generating circuit 12 is applied to RX decoder 504. High voltage Vpp may be applied to level converter circuit 502 in accordance with the structure of word line drive circuit 506.

Figure 45:
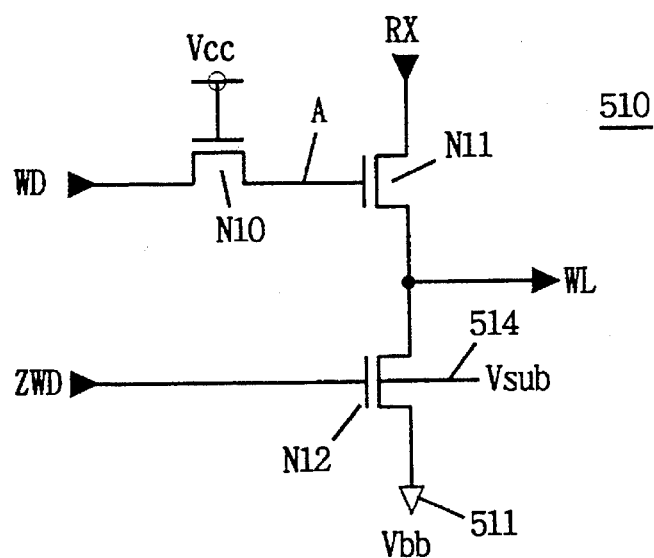
FIG. 45 shows a structure of a word driver included in a word line drive circuit shown in FIG. 44.

FIG. 45 shows a structure of the word driver related to one word line included in word line drive circuit 506. In FIG. 45, word driver 510 includes an n-channel MOS transistor N10 which transmits to node A signal WD of an amplitude of Vcc–Vbb supplied from the corresponding level converter included in level converter circuit 502, an n-channel MOS transistor N11 which transmits signal RX sent from the RX decoder onto corresponding word line WL in accordance with the signal potential on node A, and an n-channel MOS transistor N12 which transmits negative potential Vbb onto word line WL in accordance with signal ZWD of amplitude of (Vcc–Vbb) sent from the corresponding level converter. Substrate bias voltage Vsub is applied to substrate region (back gate) 514 of MOS transistor N12. Substrate bias voltage Vsub is also supplied to MOS transistors N10 and N11. Power supply potential Vcc is applied to the gate of MOS transistor N10.

In the standby state and nonselected state, signal WD is at the L-level of negative potential Vbb level, and signal ZWD is at the H-level of power supply potential Vcc level. In this state, MOS transistor N11 is off, MOS transistor N12 is on, and negative potential Vbb is transmitted to word line WL. When selected, signal WD is at the H-level of power supply potential Vcc level, and signal ZWD is at negative potential Vbb level. MOS transistor N12 is off, and MOS transistor N11 is on. When signal RX is at high voltage Vpp, the self-boost operation of MOS transistor N11 acts to raise the potential of node A, and signal RX at high voltage Vpp level is transmitted onto corresponding word line WL via MOS transistor N11. When signal RX is at negative potential Vbb level, signal RX at negative potential Vbb level is similarly transmitted onto corresponding word line WL via MOS transistor N11.

Figure 46:
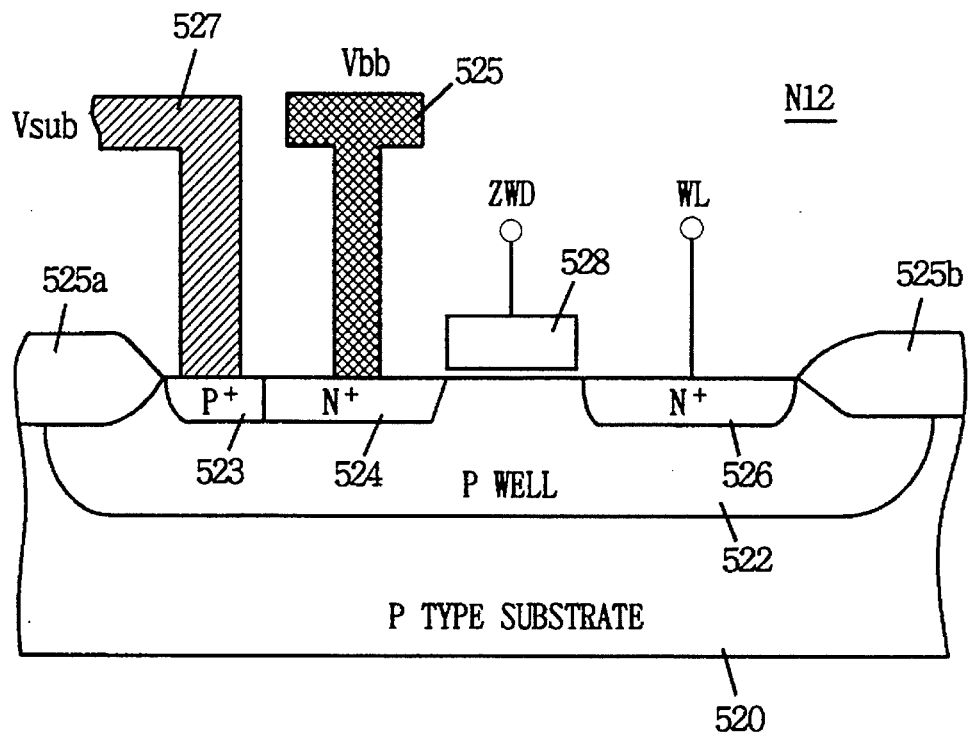
FIG. 46 schematically shows a sectional structure of a load potential transmitting MOS transistor shown in FIG. 45.

FIG. 46 schematically shows a sectional structure of the MOS transistor for transmitting negative potential Vbb shown in FIG. 45. In FIG. 46, MOS transistor N12 is formed in a P-well 522 formed at a surface of a P-type substrate 520. MOS transistor N12 includes high concentration N-type impurity regions 524 and 526 formed at the surface of P-well 522, and a gate electrode 528 formed on a channel region between impurity regions 524 and 526 with a gate insulating film therebetween. Impurity region 524 is supplied with negative potential Vbb via an interconnection line 525 of a low resistance such as an aluminum interconnection line. Impurity region 526 is connected to corresponding word line WL. Gate electrode 528 is supplied with signal ZWD from the corresponding level converter. A region in P-well 522 at which MOS transistor N12 is formed is delineated by LOCOS films (thermal oxidation film: field insulating films) 525a and 525b. A high concentration P-type impurity region 523 is also formed at the surface of P-well 522. High concentration P-type impurity region 523 is supplied with substrate bias voltage Vsub via a low resistance interconnection layer 527 such as an aluminum interconnection layer. P-well 522 is biased to substrate bias voltage Vsub level via high concentration P-type impurity region 523 and low resistance interconnection layer 527.

If P-type substrate 520 is fixed at (i.e., biased to) substrate bias voltage Vsub, low resistance interconnection layer 527 may be eliminated.

Figure 47:
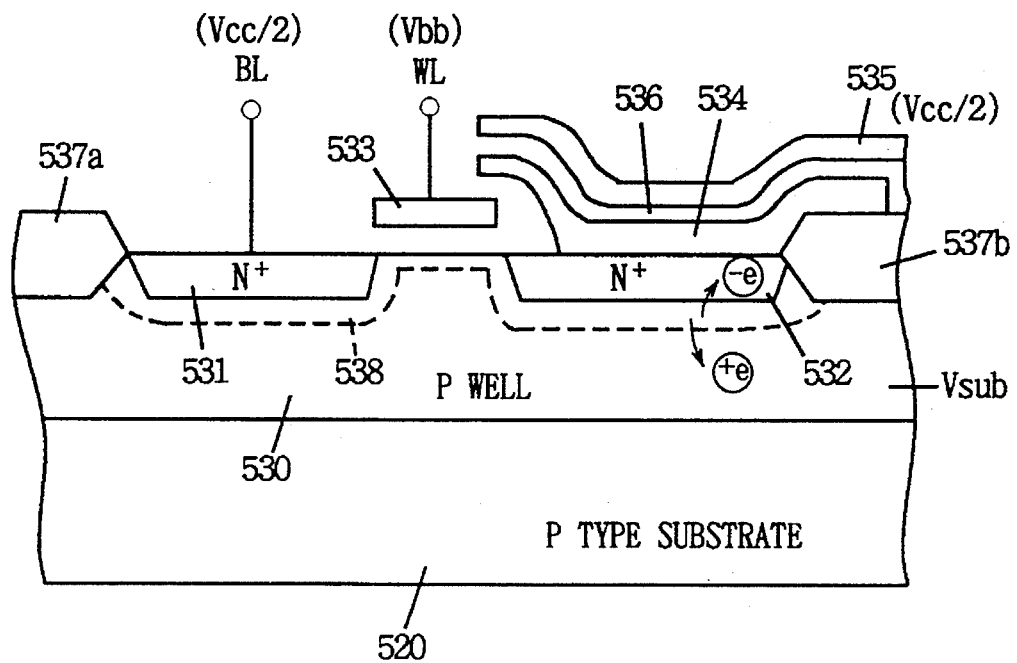
FIG. 47 shows a schematic sectional structure of a memory cell included in a memory cell array shown in FIG. 44 and also illustrates an effect of the fifth embodiment of the invention.

FIG. 47 schematically shows a sectional structure of the memory cell. In FIG. 47, the memory cell is formed in a P-well 530 formed on P-type substrate 520. P-well 530 may be the same as P-well 522 shown in FIG. 46. P-well 522 (FIG. 46) and P-well 530 (FIG. 47) may be different from each other. If P-well 522 is to be biased to negative potential Vbb, and P-well 530 is to be biased to substrate potential Vsub, an N-well is provided surrounding P-well 522 in order to prevent coupling between Vbb and Vsub, and thus P-well 522 is isolated from P-type substrate 530. This N-well is supplied with negative potential Vbb via a P-layer. This structure is referred to as a triple well structure, and is used in such a case that multiple wells having different well potentials are formed on the same substrate.

The memory cell includes high concentration impurity regions 531 and 532 formed at the surface of P-well 530, a gate electrode 533 formed on the channel region between impurity regions 531 and 532 with a gate insulating film therebetween, a conductive layer 534 connected to impurity region 532, and a conductive layer 535 formed on conductive layer 534 with an insulating film 536 therebetween. Impurity region 532 and conductive layer 534 forms one electrode of a memory cell capacitor, i.e., storage node (SN), and the other conductive layer 535 forms the other electrode (cell plate SP) of the memory cell capacitor. In general, intermediate potential Vcc/2 is applied to conductive layer 535. Impurity region 531 is connected to bit line BL (or /BL). Gate electrode 533 is connected to corresponding word line WL. The memory cell is isolated from adjacent memory cells by field insulating films 537a and 537b.

During standby, a precharge potential at intermediate potential Vcc/2 is applied to bit line BL, and negative potential Vbb is applied to word line WL. Substrate bias voltage Vsub is applied to the P-well 530. Impurity region 532 forming the storage node holds electric charges corresponding to stored data. A depletion layer 538 is formed at the surface of P-well 530. If negative potential Vbb is applied to word line WL, depletion layer 538 having an extremely small width or substantially no depletion layer is formed at the channel region under gate electrode 533.

N-type impurity region (storage node) 532 and P-well 530 are in the reversely biased state (i.e., potential of storage node is power supply potential Vcc or ground potential level). A portion of depletion layer 538 between impurity region 532 and P-well 530 has a large width. The reason for this is that holes in P-well 530 are pulled toward the negative potential electrode side, and, in impurity region 532, electrons are moved away from the PN junction. A reverse current is generated at the PN junction in the reversely biased state. This reverse current is mainly a current produced in proportion to the number of electron/hole pairs produced at the depletion layer. In general, the width of depletion layer 538 increases in proportion to (–½)nd power of the voltage applied across its region, and the current in the reverse direction increases as this reverse bias voltage increases. Therefore, due to the leak current (i.e., current in the reverse direction) flowing from impurity region 532 to P-well 530, charges (positive electric charges) stored as information in the storage node (impurity region 532) flow out, and thus the stored information is lost. In order to reduce such current in the reverse direction (i.e., substrate leak current), it is desired to reduce a voltage applied across depletion layer 538 in impurity region 532. By employing such a structure that substrate bias voltage Vsub and negative potential Vbb are set independently from each other, it is possible to suppress appropriately both of destruction of stored information, which may be caused by the channel leak current, and destruction of stored information, which may be caused by the current in the reverse direction (substrate leak current). A characteristics of holding electric charges of a memory cell affected by the substrate leak current is referred to as a "pause refresh" characteristic.

The potential of substrate bias voltage Vsub may be increased in a negative direction while maintaining the potential of negative potential Vbb constant, whereby the substrate leak current can be increased, so that the acceleration test of charge holding characteristic of the memory cell in the standby state can be achieved.

The structure for achieving the acceleration test of "pause refresh" can be achieved by applying the structure for performing the acceleration test of "disturb refresh", which is already described in connection with the fourth embodiment, to the substrate bias generating circuit.

The level converter circuit and the RX decoder can utilize any of the structures already described in connection with the first and fourth embodiments. Potentials of applied signals are converted into the level of negative potential Vbb different from substrate bias voltage Vsub.

In the memory cell formation region, substrate bias voltage Vsub is applied in order to prevent soft error caused by electron/hole pairs formed in the P-well by α ray. This is also applied to the memory cell array peripheral region. Therefore, negative substrate bias voltage Vsub is applied to the substrate region (well or substrate) of the word line drive circuit including the word drivers. If such negative substrate bias voltage Vsub is not applied to the remaining peripheral region, the circuit structures of the portions for outputting the signal at negative potential Vbb level, which has already been described in connection with the first and fourth embodiments, can be utilized without any significant modification. If substrate bias voltage Vsub is applied to the substrate region of such circuit formation region, a structure, of which example is shown in FIG. 48, can be utilized.

Figure 48:
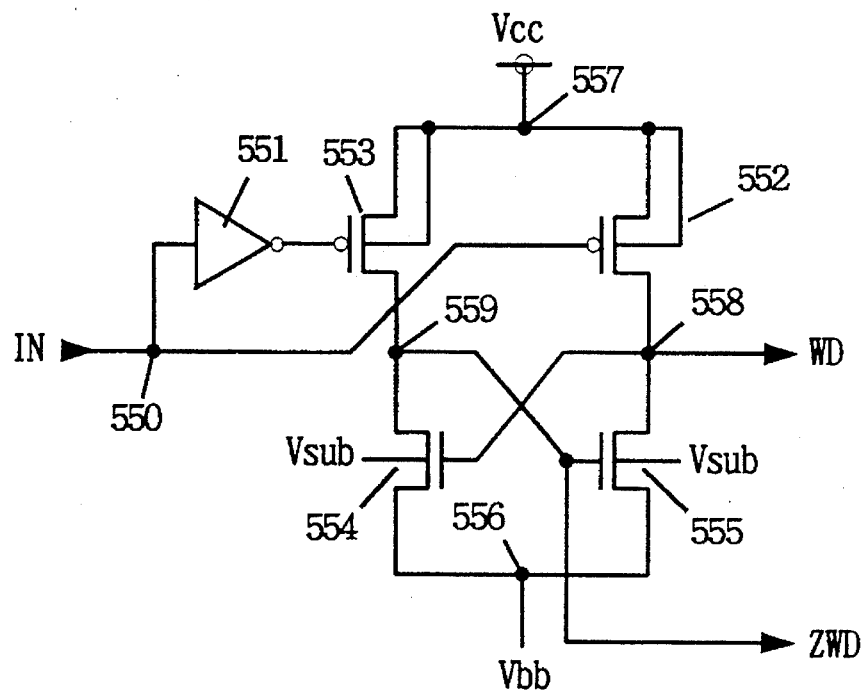
FIG. 48 shows an example of a structure of a level converting circuit shown in FIG. 44.

FIG. 48 shows an example of a level converter. The level converter shown in FIG. 48 converts a signal of an amplitude of (Vcc–GND) sent from the row decoder included in the row decode circuit into the signal of an amplitude of (Vcc–Vbb) for supplying to the word driver.

In FIG. 48, the level converter includes an inverter 551 which inverts signal IN applied to an input node 550, a p-channel MOS transistor 552 which is responsive to the signal potential of input node 550 to transmit power supply potential Vcc of a power supply node 557 to an output node 558, a p-channel MOS transistor 553 which is responsive to the output of inverter 551 to transmit power supply potential Vcc of power supply node 557 to an inverted output node 559, an n-channel MOS transistor 554 which is responsive to the signal potential on output node 558 to transmit negative potential Vbb received on a node 556 to inverted output node 559, and an n-channel MOS transistor 555 which is responsive to the signal potential on inverted output node 559 to transmit negative potential Vbb received on another power supply node 556 to output node 558. Substrate regions of p-channel MOS transistors 552 and 553 are connected to power supply node 557. Substrate bias potential Vsub is applied to the substrate regions (back gates) of n-channel MOS transistors 554 and 555.

Also in the structure shown in FIG. 48, signals WD and ZWD having amplitudes of power supply potential Vcc and negative potential Vbb can be output in accordance with input signal IN applied to input node 550, similarly in the arrangement of FIG. 10.

Figure 49:
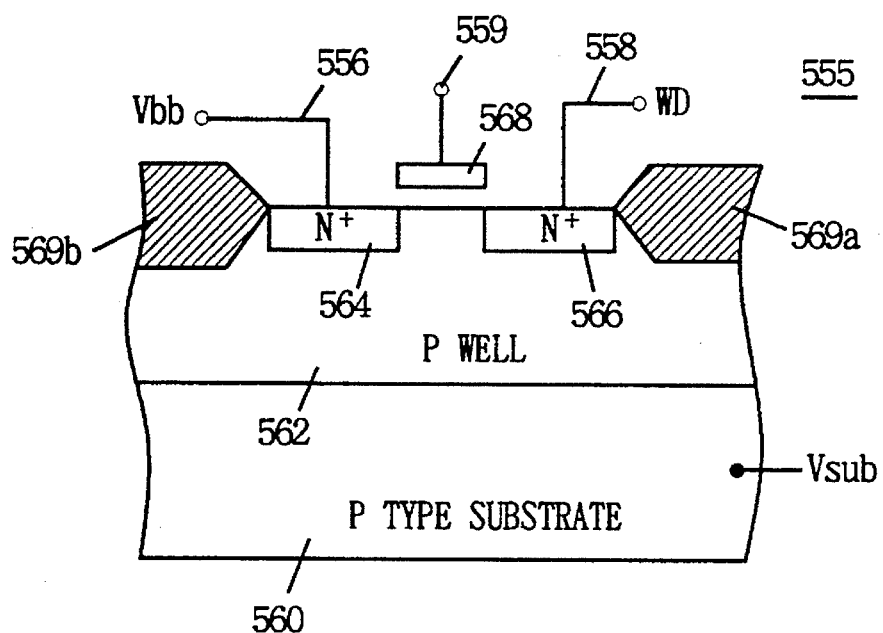
FIG. 49 schematically shows a sectional structure of a load potential generating MOS transistor shown in FIG. 48.

FIG. 49 schematically shows a sectional structure of n-channel MOS transistor 555 shown in FIG. 48.

In FIG. 49, MOS transistor 555 is formed in P-well 562 on a P-type substrate 560. P-type substrate 560 is supplied with substrate bias voltage Vsub, and P-well 562 receives substrate bias voltage Vsub.

MOS transistor 555 includes high concentration n-type impurity regions 564 and 566 formed at the surface of P-well 562, and a gate electrode 568 formed on the channel region between impurity regions 564 and 566 with a gate insulating film therebetween. Impurity region 564 receives negative potential Vbb via node 556. Gate electrode 568 is connected to inverted output node 559 shown in FIG. 49. Impurity region 566 is connected to node 558, and outputs signal WD. P-type substrate 560 may be a well.

[Modification of Word Line Drive Portion]

Figure 50:
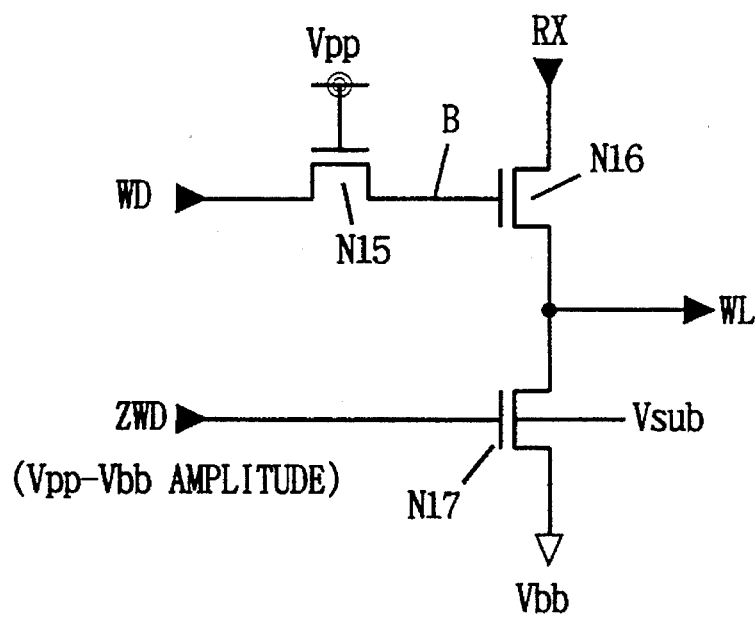
FIG. 50 shows an example of a structure of the word driver included in the word line drive circuit shown in FIG. 44.

(1) FIG. 50 shows a first modification of the word driver. Signals WD and ZWD sent from the level converter to the word driver shown in FIG. 50 have an amplitude of (Vpp–Vbb). This level converter may be formed of, for example, the level converter shown in FIG. 16. The word driver shown in FIG. 50 includes an n-channel MOS transistor N15 which receives high voltage Vpp on its gate and transmits signal WD to node B, an n-channel MOS transistor N16 which is responsive to the signal potential on node B to transmit signal RX onto word line WL, and an n-channel MOS transistor N17 which is responsive to signal ZWD to transmit negative potential Vbb onto word line WL.

Signal RX applied to MOS transistor N16 is generated, for example, from the RX decoder shown in FIG. 26, and has an amplitude of (Vpp–Vbb). MOS transistor N17 receives substrate bias voltage Vsub on its substrate region (back gate). Onto word line WL is transmitted a negative potential Vbb, of which potential level can be set independently from substrate bias voltage Vsub. Acceleration tests of both "disturb refresh" and "pause refresh" can be performed.

Figure 51:
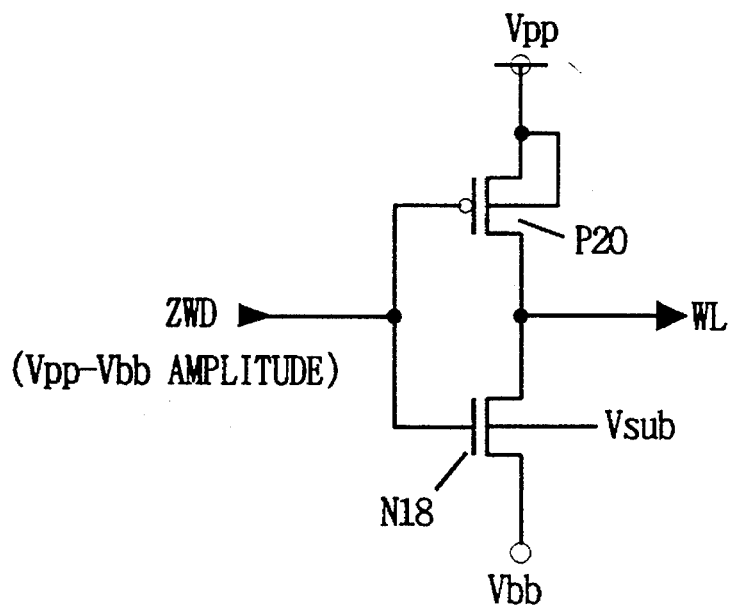
FIG. 51 shows a first modification of the word driver included in the word line drive circuit shown in FIG. 44.

(2) FIG. 51 shows still another modification of the word driver. The word driver shown in FIG. 51 has a structure of a CMOS inverter, which operates with high voltage Vpp and negative potential Vbb as both power supply potentials, and inverts signal ZWD for transmission onto word line WL. Signal ZWD is applied, for example, from the level converter shown in FIG. 27. Signal ZWD has an amplitude of (Vpp–Vbb). A p-channel MOS transistor P20 has a source and back gate (substrate region) connected to receive high potential Vpp. An n-channel MOS transistor N18 has a source connected to receive negative potential Vbb, and a substrate region (back gate) connected to receive substrate bias voltage Vsub. Also in the structure of word driver shown in FIG. 51, substrate bias voltage Vsub and negative potential Vbb can be independently set to appropriate potential levels, so that acceleration tests of "pause refresh" and "disturb refresh" can be achieved. Further, negative potential Vbb can be set to an optimum value.

Figure 52:
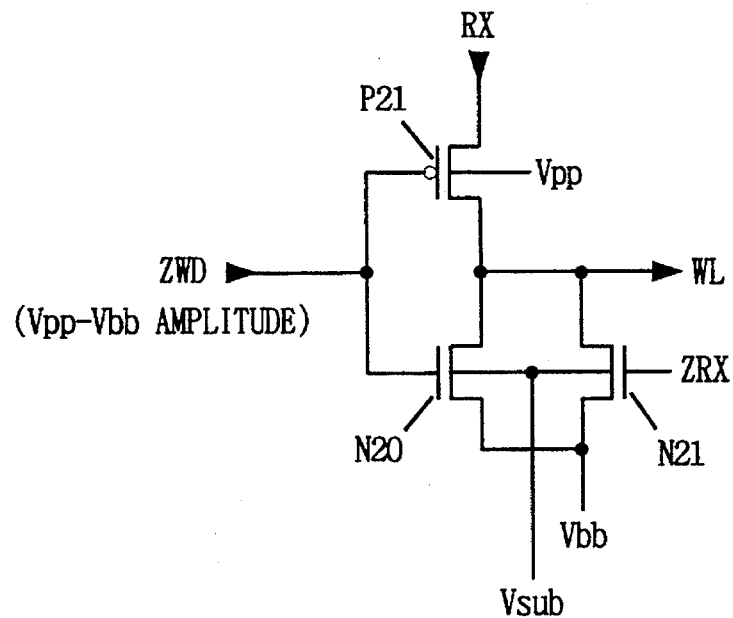
FIG. 52 shows a second modification of the word driver included in the word line drive circuit shown in FIG. 44.

(3) FIG. 52 shows still another modification of the word driver. The word driver in FIG. 52 includes a p-channel MOS transistor P21 which is responsive to signal ZWD of an amplitude of (Vpp–Vbb) to transmit signal RX of an amplitude of (Vpp–Vbb) onto word line WL, an n-channel MOS transistor N20 which is responsive to signal ZWD to transmit negative potential Vbb onto word line WL, and an n-channel MOS transistor N21 which is responsive to inverted signal ZRX to transmit negative potential Vbb onto word line WL. High voltage Vpp is applied to a substrate region (back gate) of MOS transistor P21. Substrate bias voltage Vsub is applied to substrate regions of MOS transistors N20 and N21. Signals RX and ZRX have an amplitude of (Vpp–Vbb), and are output from the RX decoder shown in FIG. 26.

In the word driver shown in FIG. 52, when signal ZWD is at high voltage Vpp level, MOS transistor N20 discharges word line WL to negative potential Vbb. When signal ZWD is at negative potential Vbb level, signal RX is transmitted onto word line WL via MOS transistor P21. When signal RX is at high voltage Vpp level, word line WL is raised to high voltage Vpp level. At this time, signal ZRX is at negative potential Vbb level, and MOS transistor N21 is off. When signal RX is at the L-level of negative potential Vbb level, signal RX is transmitted onto word line WL via MOS transistor P21. The potential of word line WL, however, goes to Vbb+|Vthp|. Vthp is a threshold voltage of MOS transistor P21. Inverted signal ZRX is at the H-level of high voltage Vpp level, MOS transistor N21 is on, and word line WL is discharged to negative potential Vbb level.

By utilizing the structure shown in FIG. 52, nonselected word line WL can be surely set to negative potential Vbb. Since substrate bias voltage Vsub and negative potential Vbb are set independently of each other, the acceleration test of "disturb refresh" and "pause refresh" can be achieved.

(4) Yet Another Modification of Word Driver

Figure 53:
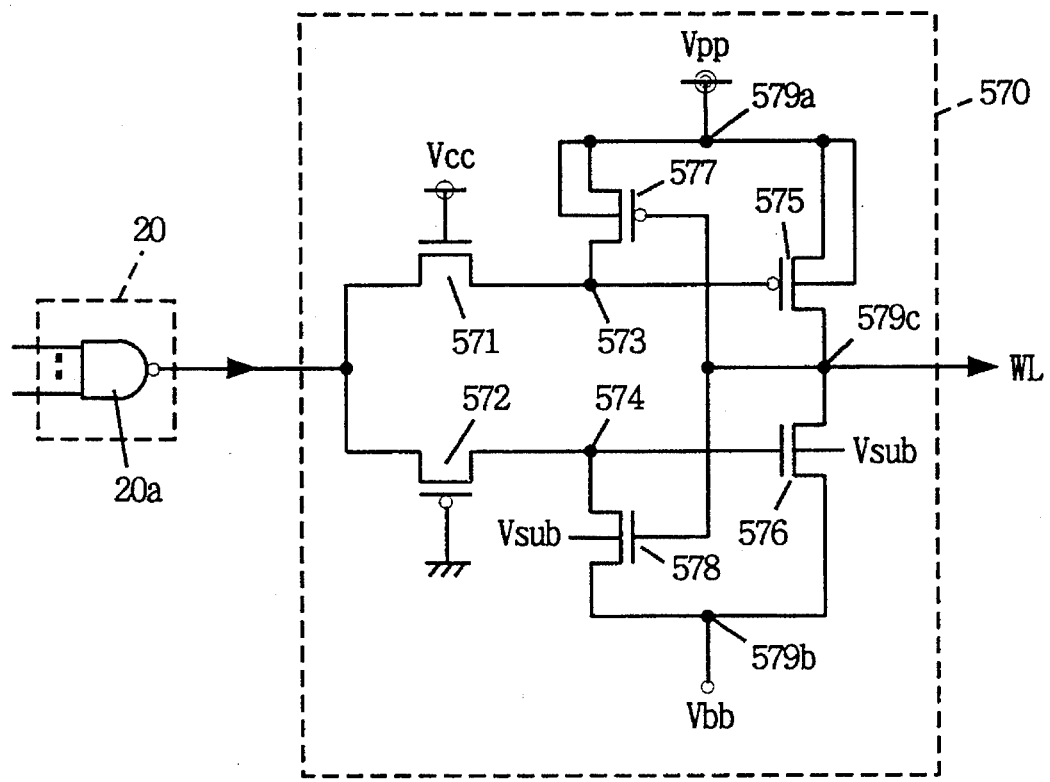
FIG. 53 shows still another modification of a word line driver in the semiconductor memory device of the fifth embodiment of the invention.

FIG. 53 shows yet another modification of the word driver. Word driver 570 shown in FIG. 53 converts the decode signal of an amplitude of (Vcc–GND) sent from row decoder 20 into a signal of an amplitude of (Vpp–Vbb), and transmits the converted signal onto corresponding word line WL. In FIG. 53, word driver 570 includes an n-channel MOS transistor 571 which transmits the output of row decoder 20 to a node 573, a p-channel MOS transistor 572 transmitting the output of row decoder 20 to a node 574, a p-channel MOS transistor 575 which is responsive to the signal potential on node 573 to transmit high voltage Vpp on a power supply node 579 onto the corresponding word line WL, an n-channel MOS transistor 576 which is responsive to the signal potential on node 574 to transmit negative potential Vbb received on another power supply node 579b onto word line WL via an output node 579c, a p-channel MOS transistor 577 which is responsive to the signal potential on output node 579c to transmit high voltage Vpp to node 573, and an n-channel MOS transistor 578 which is responsive to the signal potential of output node 579c to transmit negative potential Vbb to node 574.

MOS transistor 571 receives power supply potential Vcc on its gate. MOS transistor 572 receives ground potential GND on its gate. Substrate regions (back gates) of MOS transistors 575 and 577 are connected to a power supply node 579a and receive high voltage Vpp. Substrate regions (back gates) of MOS transistors 576 and 578 are supplied with substrate bias voltage Vsub. Row decoder 20 includes NAND decoder 20a. Row decoder 20 selects one word line WL in the memory cell array. Thus, row decoder 20 completely decodes the address signal applied thereto. When the output of row decoder 20 is at the L-level (ground potential GND level) indicative of the selected state, MOS transistor 575 is on, MOS transistor 576 is off, and high voltage Vpp is transmitted from output node 579c onto corresponding word line WL. At this time, node 574 is discharged down to negative potential Vbb level by MOS transistor 578, and MOS transistor 576 is completely off.

When the output of row decoder 20 is at the H-level (Vcc level) indicative of the nonselected state, MOS transistor 575 is off, and MOS transistor 576 is on. In this case, negative potential Vbb is applied to word line WL via output node 579c. MOS transistor 577 is turned on, the potential of node 573 is raised to high voltage Vpp level, and MOS transistor 575 is turned off.

Also in the structure shown in FIG. 53, negative potential Vbb is generated by a circuit different from that generating the substrate bias voltage Vsub. The acceleration tests of "disturb refresh" and "pause refresh" can be achieved.

Either negative potential Vbb or substrate bias voltage Vsub can be applied to the substrate region (back gate) of MOS transistor 571. In connection with practical arrangement of transistors in word driver 570, if MOS transistor 571 is formed in the same substrate region (or well region) as that of MOS transistors 576 and 578, substrate bias voltage Vsub is applied to the back gate (substrate region) of MOS transistor 571. If MOS transistor 571 is formed in the substrate region (or well region) different from those of MOS transistors 576 and 578, substrate bias voltage Vsub may be applied to the substrate region (back gate) of MOS transistor 571, negative potential Vbb may be applied thereto, or the output of row decoder 20 may be applied thereto.

(5) Further Another Structure of Word Driver

Figure 54:
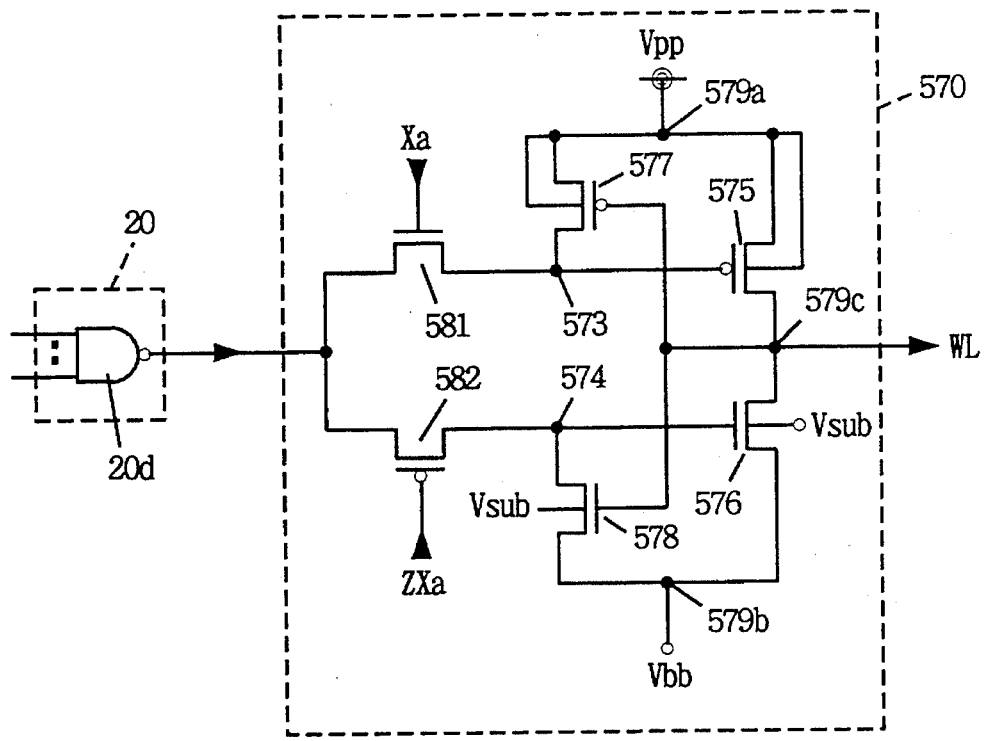
FIG. 54 shows an alternative example of the word line driver shown in FIG. 53.

FIG. 54 shows further another structure of the word driver.

Word driver 570 shown in FIG. 54 differs from the word driver shown in FIG. 53 in that MOS transistors 581 and 582 arranged at the input stage of the driver 570 receive address signal Xa and inverted address signal ZXa, respectively. Structures other than the above are the same, and corresponding portions bear the same reference numerals. In the structure shown in FIG. 54, the number of address signals applied to NAND decoder 20d included in row decoder 20 is smaller than that to NAND decoder 20a included in row decoder 20 shown in FIG. 53. Since word driver 570 itself has an address decoding function as well as a function of level-converting the decode signal, it is possible to reduce not only the circuit scale of the row decoder circuit but also the scale of the word line drive circuit. Since negative potential Vbb set independently from substrate bias voltage Vsub can be transmitted onto nonselected word line WL, both acceleration tests of "disturb refresh" and "pause refresh" can be achieved.

(6) Further Modification of Word Driver

Figure 55:
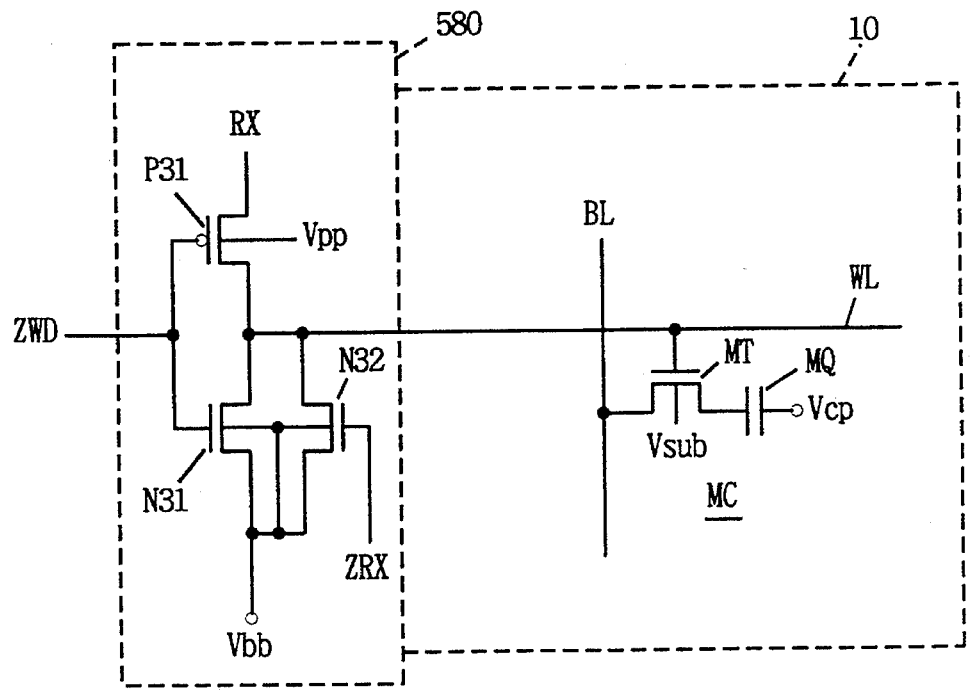
FIG. 55 shows a structure of a sixth modification of the word driver in the fifth embodiment of the invention.

FIG. 55 shows a further modification of the word driver. In FIG. 55, a word driver 580 includes a p-channel MOS transistor P31 which is responsive to signal ZWD to transmit drive signal RX onto word line WL, an n-channel MOS transistor N31 which is responsive to signal ZWD to transmit negative potential Vbb to word line WL, and an n-channel MOS transistor N32 which is responsive to inverted signal ZRX to transmit negative potential Vbb to word line WL. Negative potential Vbb is applied to the substrate regions (back gates) of MOS transistors N31 and N32. High voltage Vpp is applied to the back gate (substrate region) of MOS transistor P31.

In memory cell array 10, memory cell MC includes memory capacitor MQ, and memory transistor MT which is responsive to the signal potential on word line WL to connect memory capacitor MQ to bit line BL (or /BL). Substrate bias voltage Vsub is applied to the substrate region (back gate) of memory transistor MT.

In the structure shown in FIG. 55, the word driver is formed at the region different from that at which memory cell array 10 is formed. In this case, substrate bias voltage Vsub applied to memory cell array 10 can be set independently from bias voltage Vbb applied to the substrate region of the word line drive circuit (word driver 580). Also in the structure shown in FIG. 55, the nonselected word line WL is supplied with negative potential Vbb which is set independently from substrate bias voltage Vsub applied to the substrate region of memory cell array 10. Therefore, the acceleration test of "disturb refresh" and "pause refresh" can be achieved.

[Sixth Embodiment]

Figure 56:
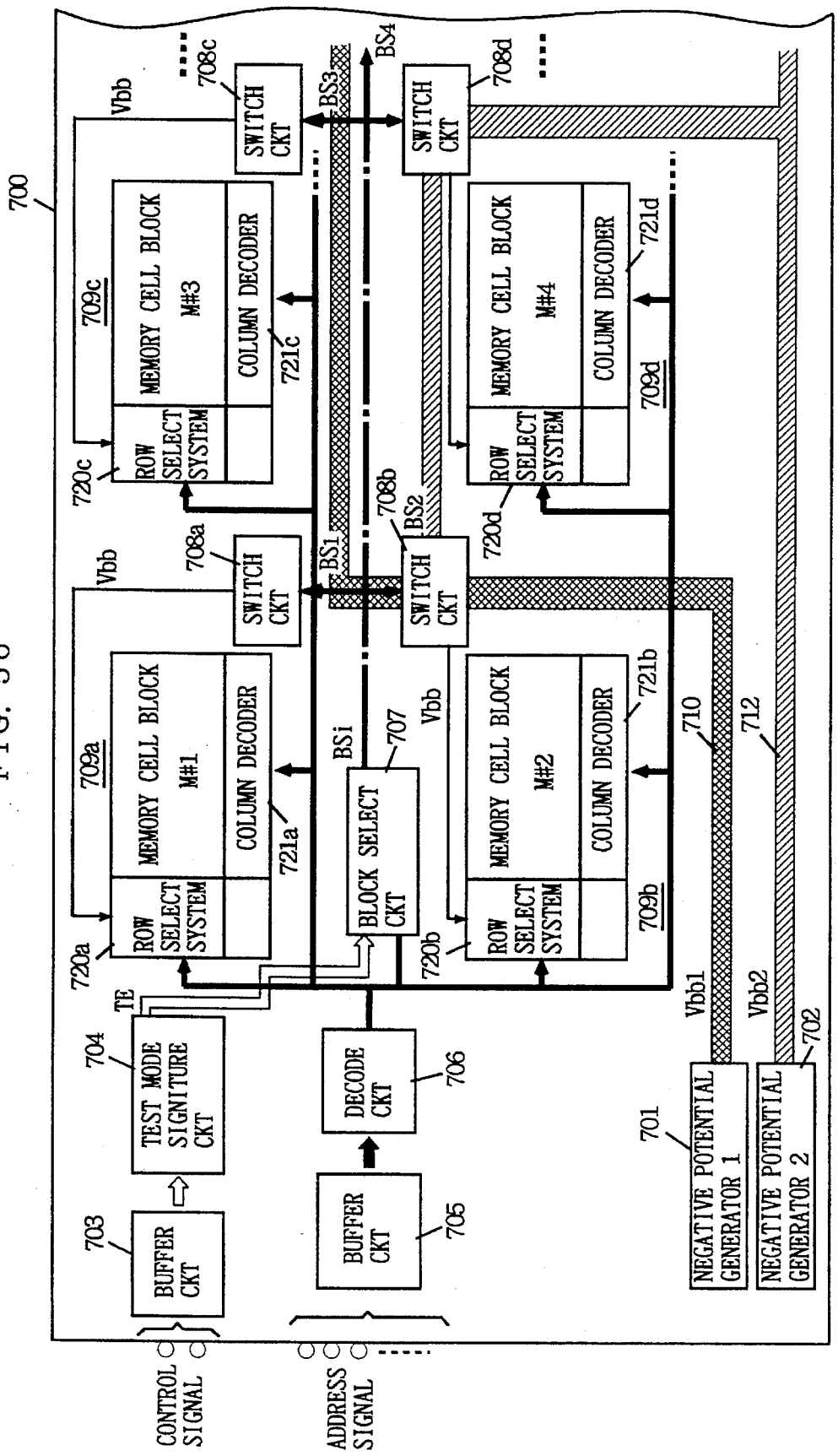
FIG. 56 schematically shows a whole structure of a semiconductor memory device according to a sixth embodiment of the invention.

FIG. 56 schematically shows a structure of a main portion of a DRAM according to a sixth embodiment of the invention. The DRAM includes a plurality of memory blocks. In FIG. 56, there are representatively shown four memory blocks 709a, 709b, 709c and 709d formed on a semiconductor chip 700. Each of memory blocks 709 (709a–709d)

includes memory blocks M# (M#1–M#4) including memory cells arranged in a matrix, row select system circuits 720 (720a–720d) each selecting a corresponding row in an associated memory cell block M#, and column select system circuits 721 (721a–721d) each selecting a corresponding column in an associated memory cell block M#. Each of row select system circuits 720a–720d includes any one of the structures of the level converter circuits and the word drivers already described in connection with the first to fifth embodiments. The DRAM further includes a negative potential generating circuit 701 generating first negative potential Vbb1, and a second negative potential generating circuit 702 generating second negative potential Vbb2. First negative potential Vbb1 generated by the first negative potential generating circuit is smaller than second negative potential Vbb2 generated by second negative potential generating circuit 702 (Vbb1<Vbb2). First negative potential Vbb1 is transmitted over the chip via a negative potential power supply line 710, and second negative potential Vbb2 is transmitted over the chip via a negative potential power supply line 712.

The DRAM further includes a buffer circuit (address buffer) 705 which performs buffer processing of an externally applied address signal to generate an internal address signal, and a decode circuit 706 which decodes the internal address signal sent from buffer circuit 705 to generate signals specifying a memory block M# as well as signals specifying a row and column in the memory block M#. Each of memory blocks 709a–709d is provided with the row select system circuit. Decode circuit 706, of which specific structure depends on the structure of row select system circuit, may have such a structure that decode circuit 706 predecodes the internal row address signal applied from buffer circuit 705 to generate decode signals WD and/or ZWD as word line drive signal RX. Further, such a structure may be employed that row select system circuits 720a–720d perform only the level conversion, and decode circuit 706 completely decodes the applied address signal.

A block select circuit 707 generates a block select signal BS1 which activates only the memory block specified in accordance with the block specifying signal sent from decode circuit 706.

Corresponding to memory blocks 709a–709d, there are provided switch circuits 708a–708d, which select one of first and second negative potentials Vbb1 and Vbb2 to transmit the same to the corresponding row select system circuits 720a–720d, respectively. Each of switch circuits 708a–708d performs the selecting operation in accordance with block select signals BS1–BS4 sent from block select circuit 707. Switch circuits 708a–708d select and transmit first negative potential Vbb1 to corresponding row select system circuits 720 (720a–720d) when the corresponding memory cell block is selected. Switch circuits 708a–708d select and transmit second negative potential Vbb2 of a smaller absolute value to corresponding row select system circuits 720 (720a–720d) when the corresponding memory cell block is nonselected.

The "disturb refresh" characteristic is related to a problem when a word line is selected in the memory cell array, and the potential of nonselected word line is raised by the capacitive coupling or the potential of bit line is discharged down to the ground potential level. Therefore, only in the selected memory cell block, the value of negative potential Vbb transmitted to the nonselected word line is increased in a negative direction (i.e., increased in an absolute value) to suppress generation of channel leak in the memory transistor. In the nonselected memory block, the potentials of word lines and bit lines do not change because they are in the standby state. In this case, therefore, the value of negative potential Vbb transmitted to the nonselected word line may be somewhat high (a problem relating to "disturb refresh" does not arise, but it is a "pause refresh" problem that may arise). Therefore, a problem does not particularly arise even if the level of negative potential Vbb transmitted to the nonselected word line in the nonselected memory cell block is increased.

It is not necessary to apply deep (small) negative potential Vbb1 to all memory blocks, and the first negative potential generating circuit is required only to drive one memory block, so that the load of Vbb1 generator is reduced, and the power consumption of first negative potential generating circuit 701 can be reduced. Although two negative potential generating circuits 701 and 702 are required for generating the negative potential, first negative potential generating circuit 701 drives only one memory block, and second negative potential generating circuit 702 drives the remaining memory blocks. Since second negative potential Vbb2 is higher than first negative potential Vbb1, the power consumption of second negative potential generating circuit 702 is smaller than that of first negative potential generating circuit 701. Therefore, in spite of the fact that two negative potential generating circuits are employed, it is possible to reduce the whole power consumption as compared with the structure in which only first negative potential generating circuit 701 is used to apply first negative potential Vbb1 to all memory blocks.

In FIG. 56, there are shown a buffer circuit 703 receiving externally applied control signals as well as a test mode signature circuit 704 which generates a test mode instructing signal TE in accordance with the output of buffer circuit 703. Test mode signature circuit 704 determines whether the test mode is instructed or not based on a predetermined combination of timings of internal control signals sent from buffer circuit 703. Test mode signature circuit 704 may employ such a structure that, when the outputs of buffer circuit 703 are in specific states, the test mode instructing signal is generated in accordance with the value of a particular internal address bit of the output of address buffer circuit 705 receiving the address signal.

It is shown that test mode instructing signal TE sent from test mode signature circuit 704 is applied to a block select circuit 707. When test mode instructing signal TE is at the H-level indicative of the active state, negative potential Vbb transmitted to the nonselected word line is shallower (smaller in absolute value) than the negative potential applied in the normal operation. In the operation that the test mode (acceleration test) is performed with two negative potential generating circuits 701 and 702 shown in FIG. 56, when test mode instructing signal TE is active, select signals BSi (BS1–BS4) applied from block select circuit 707 to switch circuits 708a–708d are set to the state selecting second negative potential Vbb2. However, access (or row and column selecting operation) is made on the memory block selected by block select circuit 707.

Figure 57:
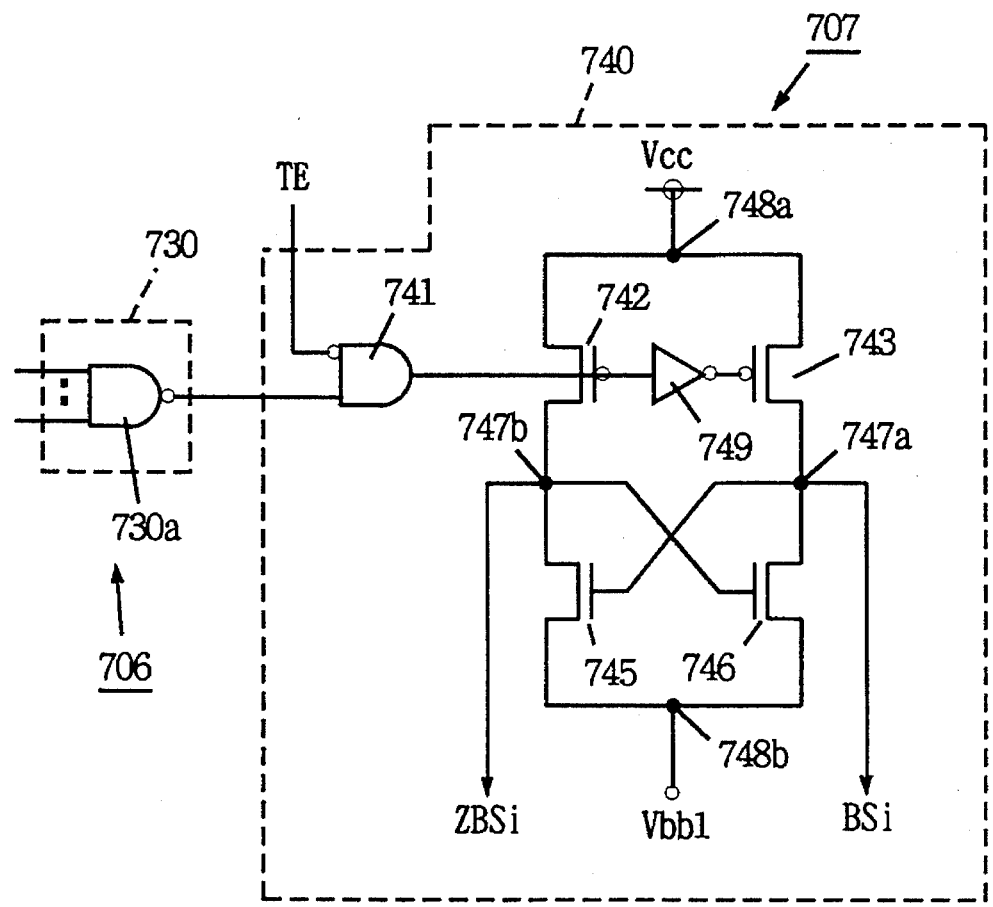
FIG. 57 shows an example of a structure of a block select circuit shown in FIG. 56.

FIG. 57 shows a structure of a portion related to one block select signal in the block select circuit shown in FIG. 56. In FIG. 57, decode circuit 706 includes a block decoder 730 selecting the memory block. Block decoder 730 includes an AND decoder 730a provided corresponding to each memory block. In the selected state, the output of AND decoder 730a attains the H-level of power supply potential Vcc level. In the nonselected state, the output of AND circuit 730a attains the L-level (ground potential level).

The block select circuit 707 includes a gate circuit 741 which has a false input receiving test mode instructing signal TE from test mode signature circuit 704 and a true input receiving the output of AND decoder 730a, and a level converting portion which converts the level of output of gate circuit 741. Gate circuit 741 outputs a signal at the L-level of ground potential level, when test mode instructing signal TE is activated to instruct the test mode. When test mode instructing signal TE is in the inactive state instructing the normal mode, gate circuit 741 functions as a buffer.

The level converting portion includes an inverter 749 which inverts the output of gate circuit 741, a p-channel MOS transistor 743 which is arranged between an output node 747a and a power supply node 748a supplying power supply potential Vcc, and receives on its gate the output of inverter 749, a p-channel MOS transistor 742 which is arranged between an output node 747b and power supply node 748a, and receives on its gate the output of gate circuit 741, an n-channel MOS transistor 746 which is arranged between output node 747a and another power supply node 748b receiving first negative potential Vbb1, and receives on its gate a signal potential of output node 747b, and an n-channel MOS transistor 745 which is arranged between output node 747b and another power supply node 748b, and receives on its gate the signal potential of output node 747a. Output node 747a outputs block select signals BSi (i=1–4), and output node 747b outputs inverted block select signals ZBSi. Operation will be briefly described below.

The structure of this level converter is the same as that of level converter 410 shown in FIG. 32. In the normal operation mode, test mode instructing signal TE is at the L-level of ground potential level. When the output of AND decoder 730a indicates the selected state at power supply potential Vcc level, the output of gate circuit 741 attains the H-level, MOS transistor 742 is turned off, and MOS transistor 743 is turned on. Block select signal BSi sent from output node 747a attains the H-level of power supply potential Vcc level, and signal ZBSi sent from output node 747b attains the L-level of first negative potential Vbb1 level (H-level of output node 747a turns on MOS transistor 745). In the normal operation mode, when the output of AND decoder 730a is at the L-level, block select signal BSi is at first negative potential Vbb1 level, and inverted block select signal ZBSi is at the H-level of power supply potential Vcc level.

When test mode instructing signal TE is at the H-level, the output of gate circuit 741 is at the L-level, signal BSi is at the L-level (Vbb1 level), and inverted signal ZBSi is at the H-level (Vcc level). Thus, when test mode instructing signal TE is active (at the H-level), a block selector 740 ignores the block specifying signal applied from block decoder 730, and applies the block select signal indicative of the nonselected state to switch circuits 708a–708d. Each of switch circuit 708a–708d selects the first negative potential when received block select signal BSi is at the H-level of active state, and selects second negative potential Vbb2 shallower (smaller in absolute value) than first negative potential Vbb1 when block select signal BSi is at first negative potential Vbb1 level indicative of the nonselected state.

Figure 58:
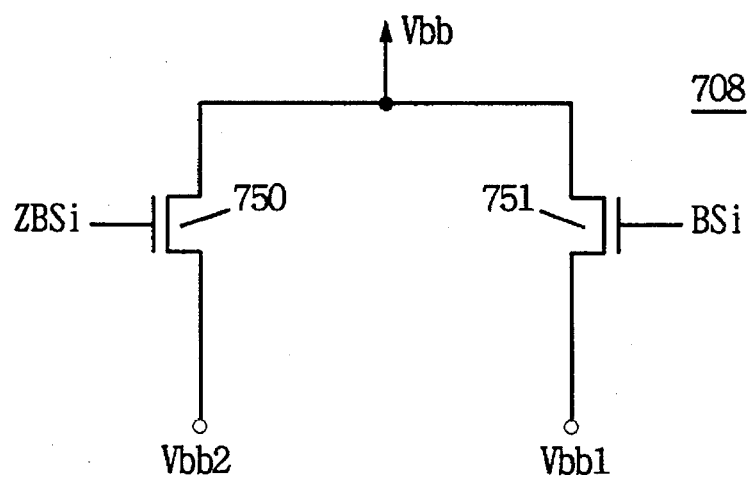
FIG. 58 shows an example of a structure of a switch circuit shown in FIG. 56.

FIG. 58 shows an example of a structure of switch circuit 708. In FIG. 58, there is shown only a structure of the switch circuit related to one memory block. The switch circuit having the structure shown in FIG. 58 is provided for each memory block. In FIG. 58, switch circuit 708 (708a–708d) includes an n-channel MOS transistor 751 receiving block select signal BSi on its gate, and an n-channel MOS transistor 750 receiving inverted block select signal ZBSi on its gate. MOS transistor 751 selects first negative potential Vbb1 and outputs it as negative potential Vbb, when block select signal BSi is at the H-level (Vcc level). MOS transistor 750 selects second negative potential Vbb2 and transmits it as negative potential Vbb to the corresponding memory block, when inverted block select signal BSi is at the H-level. Since first negative potential Vbb1 is deeper (larger in absolute value) than second negative potential Vbb2, MOS transistor 750 is off when signal ZBSi is at first negative potential Vbb1 level. Similarly, when signal BSi is at negative potential Vbb1 level, MOS transistor 751 is off.

Owing to the above structure, it is possible, in the normal operation mode, to supply first negative potential Vbb1 to the selected memory block and to apply second negative potential Vbb2 of a smaller absolute value to the nonselected memory block. In the test operation mode, both the selected and nonselected memory blocks are supplied with second negative potential Vbb2.

Such a structure may be employed that, when test mode instructing signal TE is active, the selected memory block is supplied with a third negative potential Vbb3 different from first and second negative potentials Vbb1 and Vbb2. It should be noted that negative potential Vbb3 satisfies a relationship of Vbb1<Vbb3.

[Form of Application of Negative Potential]

Figure 59:
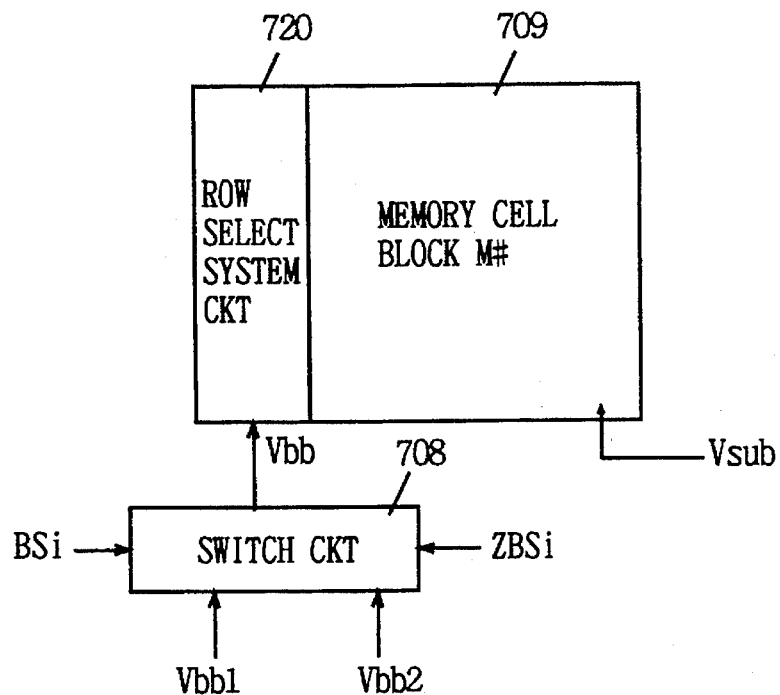
FIG. 59 illustrates an example of a manner of applying a substrate bias voltage and a nonselect voltage in the sixth embodiment of the invention.

FIG. 59 shows a first example of form of applying a negative potential in one memory block. In the structure shown in FIG. 59, negative potential Vbb selected by switch circuit 708 in accordance with block select signals BSi and ZBSi is applied only to row select system circuit 720. Substrate bias voltage Vsub is applied to the substrate region of memory cell block M# (709). Substrate bias voltage Vsub may be equal to first negative potential Vbb1. In addition to the advantage of lower power consumption, such an advantage of the embodiment shown in FIG. 5 can be achieved that the negative potential Vbb transmitted to the nonselected word line and the substrate bias voltage can be set independently of each other.

Figure 60:
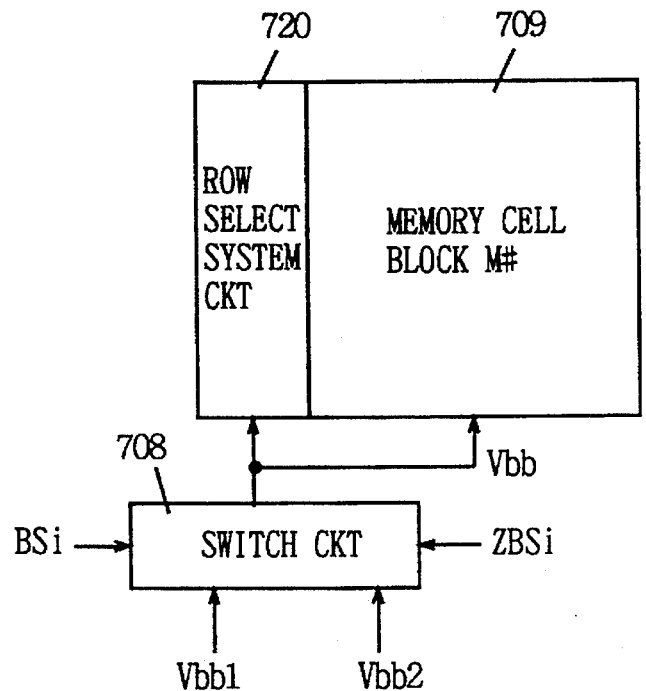
FIG. 60 illustrates a modification of a manner of applying a substrate bias voltage and a nonselect voltage in the sixth embodiment of the invention.

FIG. 60 shows another structure of applying the negative potential. In the structure shown in FIG. 60, negative potential Vbb selected by switch circuit 708 is applied to both of row select system circuit 720 and the substrate region of memory cell block M#709. In the structure shown in FIG. 60, a plurality of memory blocks in the DRAM are formed in different regions, and substrate bias voltages are applied independently to the well regions in the respective memory blocks. In this structure, since the absolute value of substrate bias voltage applied in the nonselected memory block is set to a small value, the power consumption can be significantly reduced.

In the above structure, block select circuit 707 performs the level conversion of block select signal BSi. Alternatively, such a structure may be employed that the level conversion is performed by each of switch circuits 708a–708d.

[Modification]

Figure 61:
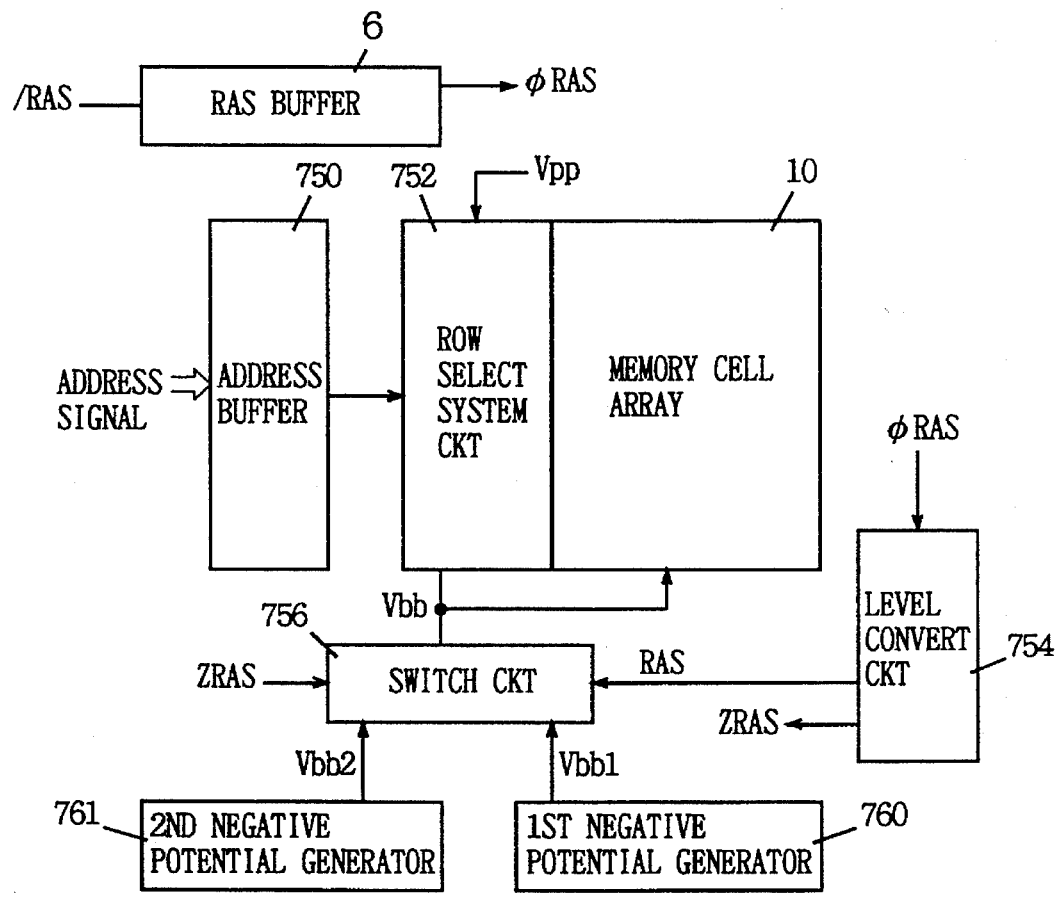
FIG. 61 shows a modification of the semiconductor memory device according to the sixth embodiment of the invention.

FIG. 61 shows a first modification of the structure of DRAM which is the sixth embodiment of the invention. In FIG. 61, DRAM includes memory cell array 10 having memory cells arranged in rows and columns, an address buffer 750 producing an internal address signal from an external address signal, and a row select system circuit 752 which selects and drives the corresponding row in memory cell array 10 in accordance with the internal address signal sent from address buffer 750. The row select system circuit 752 decodes the address signal applied from address buffer 750, performs the level conversion on the decoded signal, transmits high voltage Vpp to the selected word line, and transmits negative potential Vbb to the nonselected word line.

DRAM further includes a level converter 754 which converts the level of internal RAS signal φRAS sent from RAS buffer 6, and a switch circuit 756 which selects one of first negative potential Vbb1 sent from first negative potential generating circuit 760 and second negative potential Vbb2 sent from second negative potential generating circuit 751 in accordance with signals RAS and ZRAS sent from level converter 754. Level converter 754 generates signal RAS at first negative potential Vbb1 level when internal RAS signal φRAS is at the L-level (ground potential level) of inactive state. Signals ZRAS and RAS are complementary in logic to each other, and the signal ZRAS attains power supply potential Vcc level at this time. Level converter 754 sets signals RAS and ZRAS to the H-level (Vcc level) and negative potential Vbb1 level, respectively, when internal RAS signal φRAS is at the H-level.

First negative potential Vbb1 is lower than second negative potential Vbb2 (Vbb1<Vbb2). Switch circuit 756 selects and applies first negative potential Vbb1 to row select system circuit 752 and the substrate region of memory cell array, when signal RAS is at the H-level, i.e., in an active operating state after the start of memory cycle of the DRAM. Switch circuit 756 selects second negative potential Vbb2 sent from second negative potential generating circuit 761 and applies the same to row select system circuit 752 and the substrate region of memory cell array 10, when signal RAS is in the inactive state of negative potential Vbb1 level. Thus, during standby of the DRAM, second negative potential Vbb2 is selected as negative potential Vbb, and, upon start of the memory cycle, first negative potential Vbb1 is selected as negative potential Vbb. Disturb refresh characteristic is related to a problem in the active cycle (memory cycle) period during which the memory cell selecting operation is performed. During this period, negative potential Vbb transmitted to the nonselected word line is set to a low value. According to this structure, it is possible to suppress the substrate leak current during standby (to improve the pause refresh characteristic) and suppress the channel leak during operation (to improve the disturb refresh characteristic).

In the structure shown in FIG. 61, switch circuit 756 selects one of first negative potential Vbb1 and second negative potential Vbb2, and generates negative potential Vbb. Such a structure may be employed that one of first and second negative potential generating circuits 760 and 761 is activated in accordance with internal RAS signal.

[Seventh Embodiment]

Figure 62:
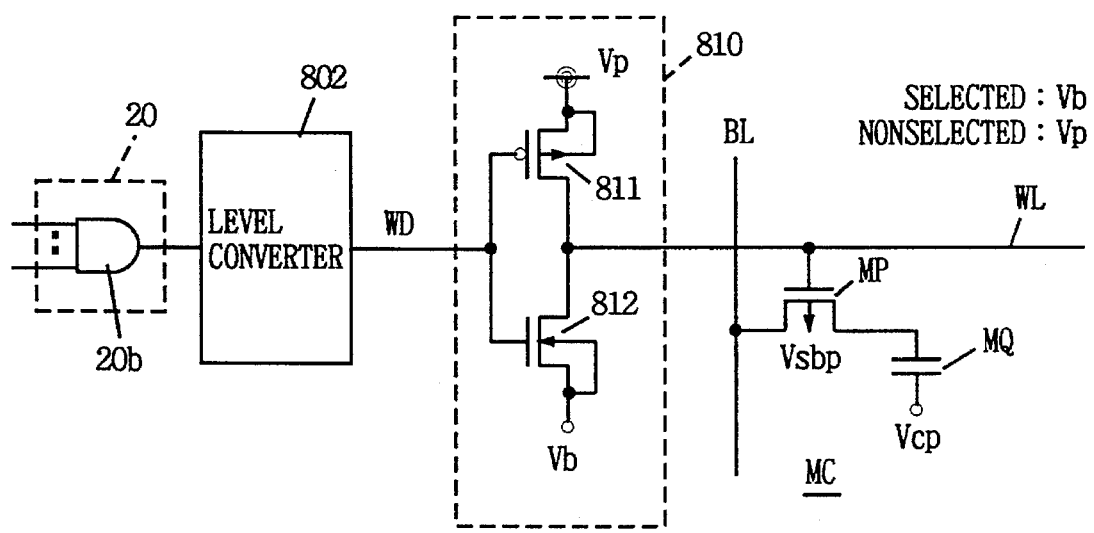
FIG. 62 schematically shows a structure of a main portion of a semiconductor memory device according to a seventh embodiment of the invention.
Figure 63:
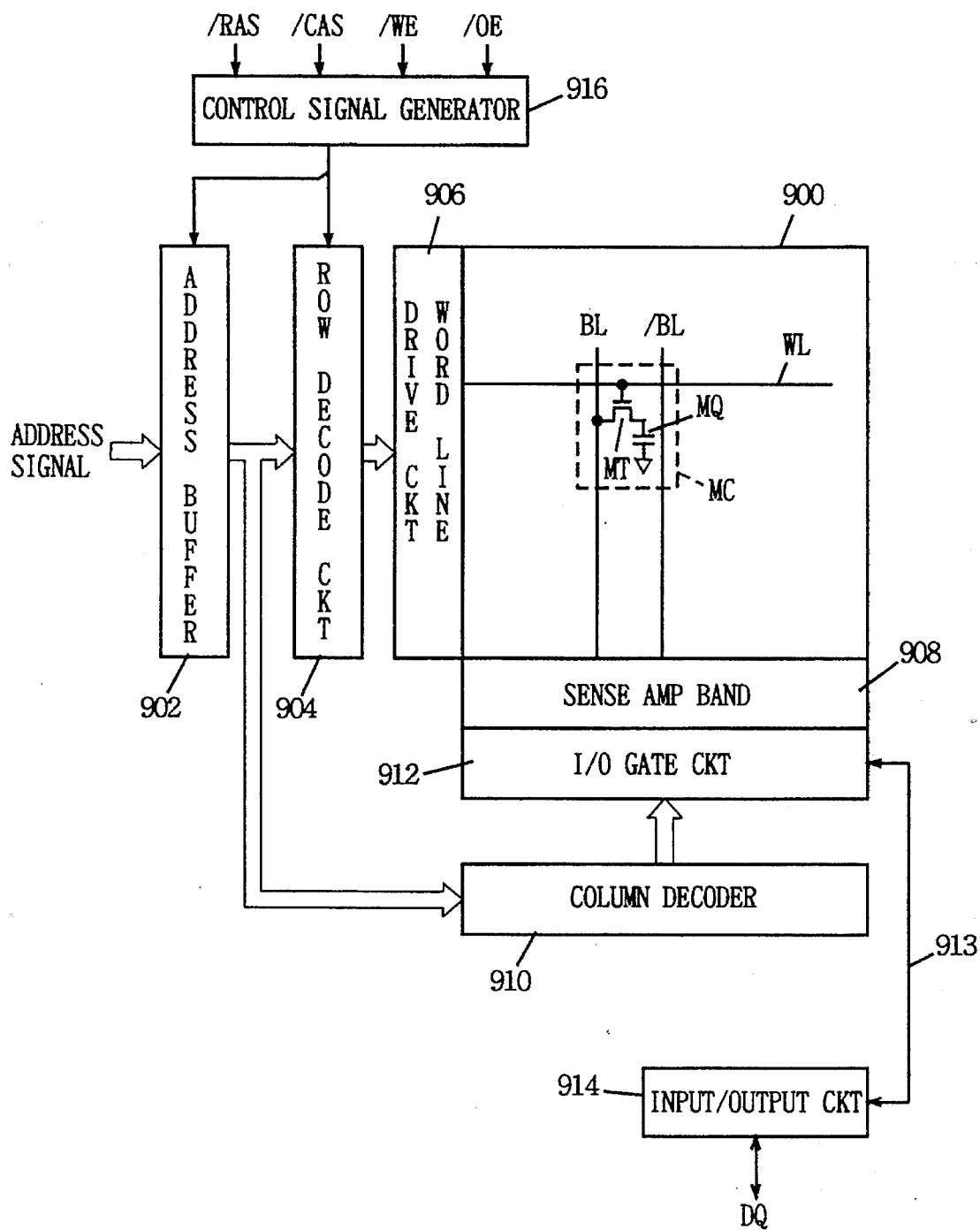
FIG. 63 schematically shows a whole structure of a conventional DRAM.
Figure 64:
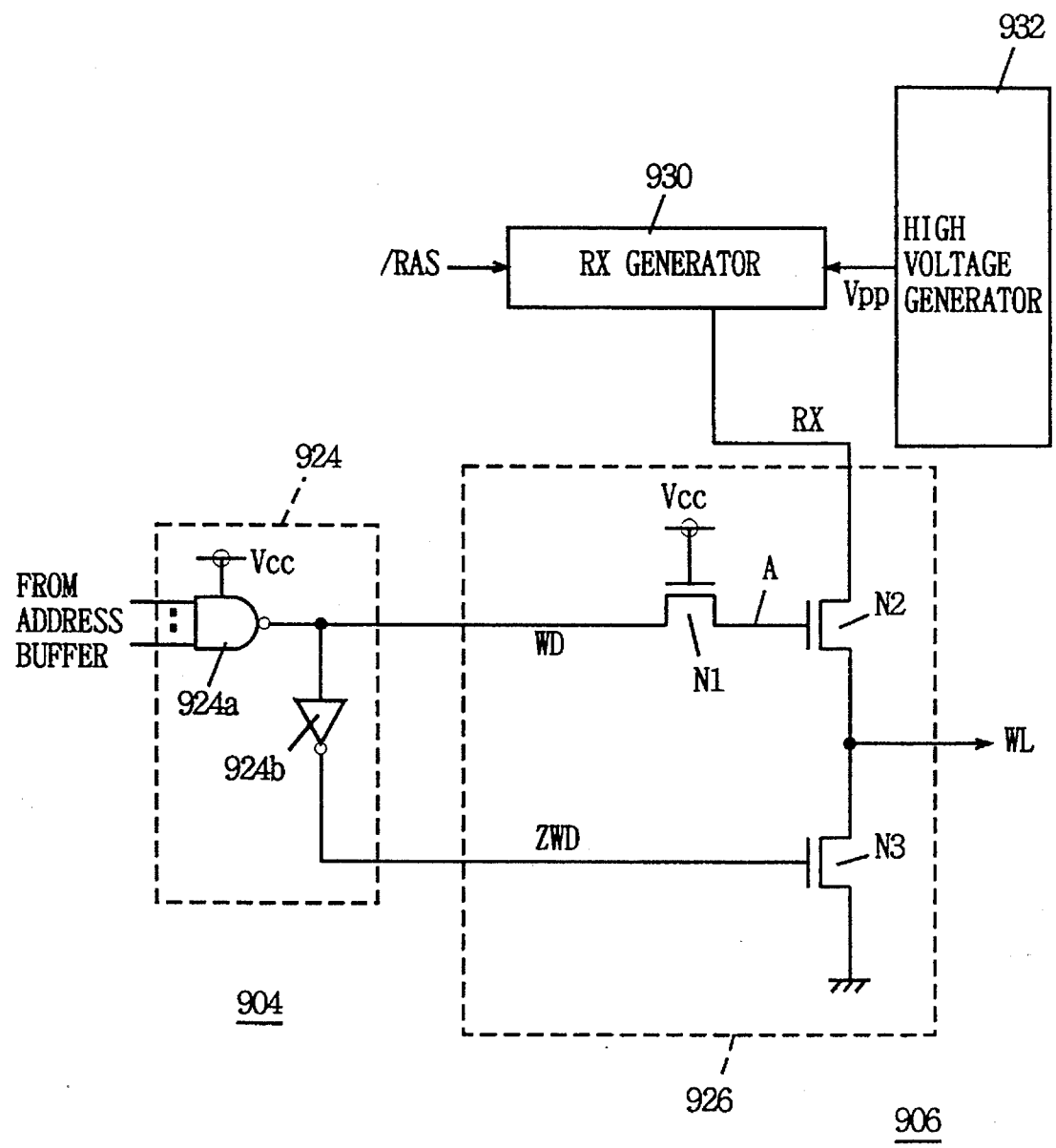
FIG. 64 shows an example of a structure of a word line driver in the conventional DRAM.
Figure 65:
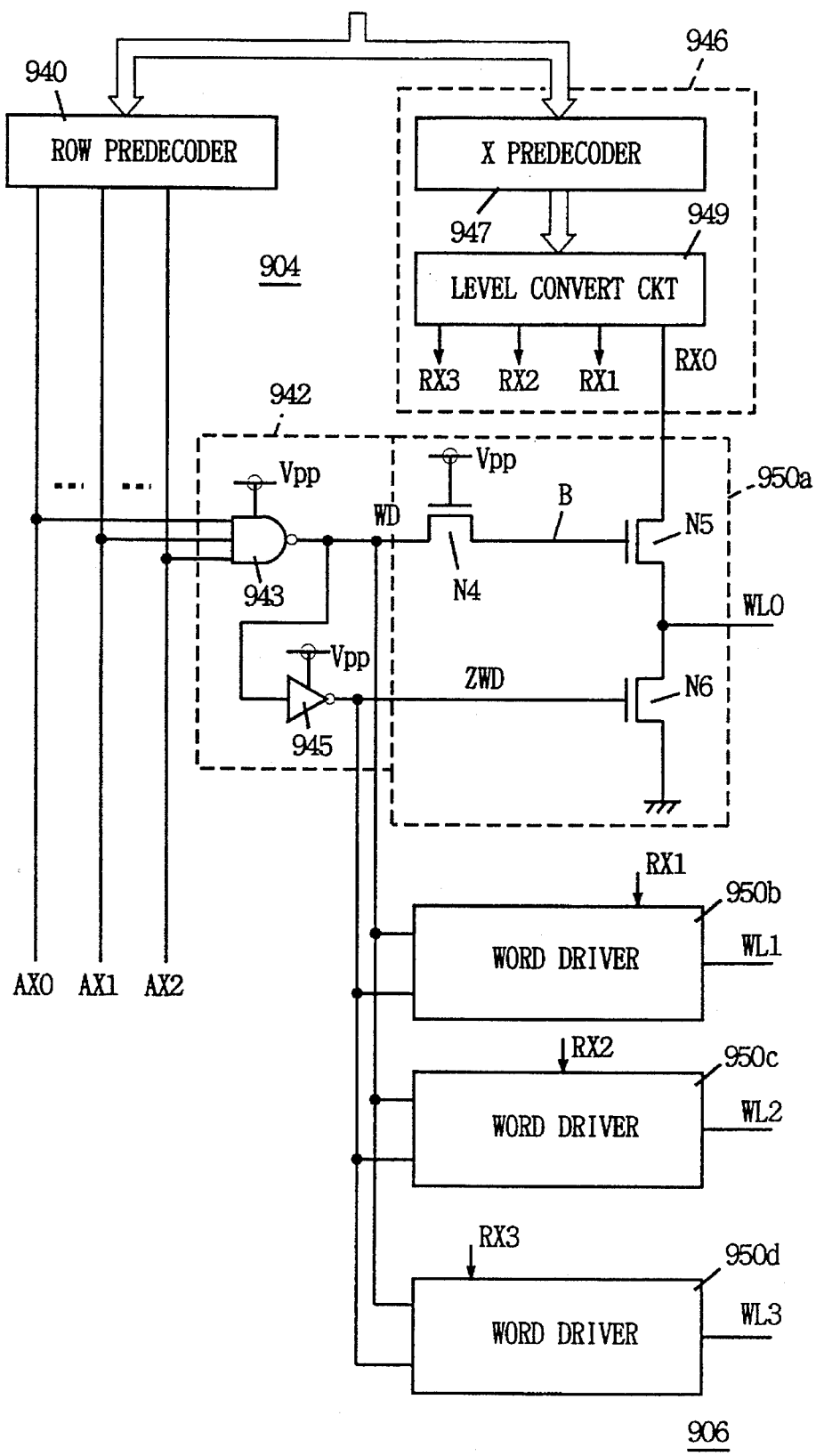
FIG. 65 schematically shows a structure of an alternative example of the word line driver in the conventional DRAM.
Figure 66:
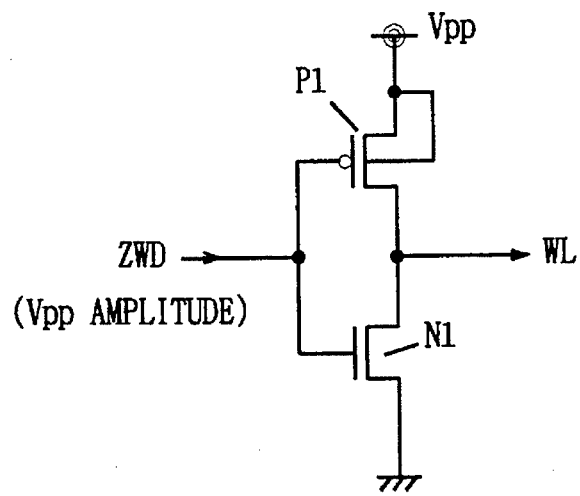
FIG. 66 shows still another modification of the conventional word driver.

FIG. 62 shows a structure of a main portion of a DRAM which is a seventh embodiment of the invention. In the DRAM shown in FIG. 62, memory cell MC includes memory capacitor MQ and a memory transistor MP which is turned on in response to the signal potential on the word line WL. Memory transistor MP is formed of a p-channel MOS transistor. A positive bias voltage Vsbp is applied to the substrate region of memory transistor MP. A negative potential Vb is applied to word line WL, when it is selected. A positive potential Vp is applied to word line WL when not selected. By applying negative potential Vb to the word line when selected, a signal at ground potential GND level can be transmitted to memory capacitor MQ without causing loss of the threshold voltage of p-channel MOS transistor MP. By applying positive voltage Vp (nearly equal to or smaller than substrate bias voltage Vsbp) to word line WL when not selected, it is possible to suppress formation of weakly inverted layer at memory transistor MP, and the subthreshold current can be significantly reduced.

In FIG. 62, there is also shown a circuit structure for selecting one word line WL. Row decoder 20, which includes the structure of AND decoder 20*b*, outputs the signal at the H-level of Vcc level when the word line is to be selected, and outputs the signal at the L-level of ground potential level when it is not to be selected. A level converter 802 converts the output level of AND decoder 20*b* into Vp level or Vb level (while maintaining the logic of signal). When the word line is to be selected, signal WD is at positive voltage Vp level, a p-channel MOS transistor 811 is off, and an n-channel MOS transistor 812 is on, so that the potential of selected word line WL attains negative potential Vb level. Memory transistor MP is turned on, and memory capacitor MQ is connected to bit line BL.

When the word line is not to be selected, signal WD attains negative potential Vb level, MOS transistor 812 is off, and MOS transistor 811 is on, so that positive potential Vp is transmitted onto word line WL. The signal potential on the nonselected word line is positive potential Vp, and the source and gate of this memory transistor are set to the potentials different from each other, whereby the channel leak is suppressed.

If the memory cell has a p-channel MOS transistor as a memory transistor, high voltage Vpp and negative potential Vbb in the structure already described in connection with the first to sixth embodiments may be replaced with negative potential Vb and positive potential Vp, respectively, whereby a similar structure and hence a similar effect can be achieved.

According to the invention, as described above, the potential level of nonselected word line is set to the same polarity as the substrate bias voltage of memory transistor, and thus the channel leak of this memory transistor can be suppressed, so that the semiconductor memory device having an excellent "disturb refresh" characteristic can be achieved. By changing the voltage level transmitted to the nonselected word line, the acceleration tests of both "disturb refresh" and "pause refresh" can be performed, and the test time can be shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device operating with first and second power source voltages different in logic from each other comprising:

a memory cell array having a plurality of memory cells arranged in a matrix of rows and columns, each of the memory cells formed at a substrate region supplied with a bias potential of a first polarity and including an enhancement type field effect transistor;

a plurality of word lines provided corresponding to the respective rows, each of the word lines connected to the field effect transistors of the memory cells on a corresponding row; and a plurality of drive means provided corresponding to said plurality of word lines, respectively, each of the drive means including a first drive element transmitting a voltage signal of a second polarity different from said first polarity onto the corresponding word line when the corresponding word line is specified by an address signal, and a second drive element transmitting a voltage signal of said first polarity onto the corresponding word line when said address signal specifies a word line other than said corresponding word line, the difference between the voltage signals of the first and second polarities being greater than that between the first and second power source voltages.

2. The semiconductor memory device according to claim 1, wherein
a voltage level of said voltage signal transmitted by said second drive element is different from a voltage level of said bias voltage.

3. The semiconductor memory device according to claim 1, further comprising means for changing a voltage level of said voltage signal transmitted by said second drive element without changing a polarity of the voltage signal in response to a specific operation mode instructing signal.

4. The semiconductor memory device according to claim 1, wherein
said memory cell array is divided into a plurality of memory blocks, and said address signal includes a block specifying signal specifying a specific memory block among said plurality of memory blocks; and
said semiconductor memory device further comprises means for changing a voltage level of the voltage signal transmitted by said second drive element provided for a memory block specified by said block specifying signal without changing the polarity of said voltage signal in accordance with said block specifying signal.

5. The semiconductor memory device according to claim 1, wherein the voltage signal of the first polarity is a negative voltage signal, and the voltage signal of the second polarity is a positive potential higher than the first and second power source voltages.

6. The semiconductor memory device according to claim 1, wherein a voltage level of said voltage signal transmitted by said second drive element is a same common voltage level of said bias voltage.

7. The semiconductor memory device according to claim 1, wherein the voltage signal of the second polarity is a negative voltage signal, and the voltage signal of the first polarity is a positive voltage signal.

8. The semiconductor memory device according to claim 1, wherein a voltage value of said voltage signal transmitted by said second drive element is lower in absolute value than that of the bias voltage.

9. The semiconductor memory device according to claim 1, further comprising a predecoder for predecoding a predetermined number of bits of the address signal to generate a predecoder signal, and wherein each of said drive means includes a decoder for decoding a remaining bit of the address signal to transfer the predecode signal to associated first and second drive elements in accordance with the result of decoding.

10. A semiconductor memory device according to claim 1, further comprising word line specifying signal generating means for generating a word line specifying signal specifying at least one word line among said plurality of word lines in accordance with an address signal for transmission to said plurality of drive means.

11. The semiconductor memory device according to claim 10, wherein said word line specifying signal generating means includes gate circuitry for matching an amplitude of a received signal to the voltage signals of the first and second polarity to generate said word line specifying signal.

12. The semiconductor memory device according to claim 1, wherein each said second drive element comprises as insulated gate type field effect transistor having one conduction node coupled to the corresponding word line, another conduction node coupled to receive said voltage signal of said first polarity, a backgate coupled to receive the bias potential, and a control gate coupled to receive a word line specifying signal.

13. The semiconductor memory device according to claim 1, wherein each of the memory cells includes a capacitor storing data in a form of electric charges, and a memory transistor of the enhancement type field effect transistor responsive to a potential on an associated word line for turn on for accessing to said capacitor.

14. The semiconductor memory device according to claim 1, further comprising a booster coupled to receive a normal operation source potential for boosting the normal operation source potential to generate the voltage signal of the second polarity greater in absolute value than said normal operation source potential for transmission onto a selected word line through a corresponding first drive element.

15. The semiconductor memory device according to claim 1, wherein each of the memory cells includes an insulated gate type field effect transistor having a control gate connected to a corresponding word line, and wherein said voltage signal of the first polarity is set to a level suppressing a subthreshold leakage current through said insulated gate type field effect transistor.

16. The semiconductor memory device according to claim 3, wherein said means for changing includes:
a first voltage generator for generating a first predetermined voltage of the first polarity,
a second voltage generator for generating a second predetermined voltage smaller in absolute value than said first predetermined voltage, and
switching means responsive to said specific operation mode specifying signal for selecting one of said first and second predetermined voltages for transmission as said voltage signal of the first polarity.

17. The semiconductor memory device according to claim 3, wherein said means for changing includes a voltage generator for generating a voltage of the first polarity,
detecting means coupled to said voltage generator for detecting a level of the voltage generated by said voltage generator to control activation and inactivation of said voltage generator to maintain the voltage generator to maintain the voltage generated by said voltage generator at a reference level, and
setting means responsive to said specific operation mode instructing signal for selectively establishing a voltage level as said reference level.

18. The semiconductor memory device according to claim 3, wherein said means for changing includes
a voltage generator for generating a voltage of the first polarity,
clamp means coupled to said voltage generator for clamping a voltage level of the voltage generated by said voltage generator at a reference level, and
switching means coupled to said clamping means and responsive to said specific operation mode instructing signal for switching the reference level.

19. The semiconductor memory device according to claim 3, wherein said means for changing includes
a first voltage generator responsive to said specific operation mode instructing signal, to be activated for generating a first predetermined voltage of the first polarity, and
a second voltage generator responsive to said specific mode instructing signal, to be activated complementarily to said first voltage generator, for generating a second predetermined voltage of the first polarity.

20. The semiconductor memory device according to claim 3, wherein said specific operation mode instructing signal indicates a test mode of operation when activated.

21. The semiconductor memory device according to claim 3, wherein said means for changing includes circuitry for lowering in absolute value a level of the voltage signal of the first polarity when said specific operation mode instructing signal is active.

22. The semiconductor memory device according to claim 1, wherein each of said first and second drive elements comprises a field effect transistor having a threshold voltage, and wherein said enhancement type field effect transistor of each of the memory cells has a threshold voltage no less in absolute value than the threshold voltage of the field effect transistor of each of the first and second drive elements.

23. The semiconductor memory device according to claim 1, wherein the enhancement type field effect transistor is a full enhancement type transistor significantly away from a depletion type field effect transistor.

* * * * *